(12) United States Patent
Thompson et al.

(10) Patent No.: US 8,604,530 B2
(45) Date of Patent: Dec. 10, 2013

(54) ELECTRONIC DEVICES AND SYSTEMS, AND METHODS FOR MAKING AND USING THE SAME

(75) Inventors: Scott E. Thompson, Gainesville, FL (US); Damodar R. Thummalapally, Milpitas, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 13/616,859

(22) Filed: Sep. 14, 2012

(65) Prior Publication Data

US 2013/0020639 A1 Jan. 24, 2013

Related U.S. Application Data

(63) Continuation of application No. 12/708,497, filed on Feb. 18, 2010, now Pat. No. 8,273,617.

(60) Provisional application No. 61/247,300, filed on Sep. 30, 2009, provisional application No. 61/262,122, filed on Nov. 17, 2009.

(51) Int. Cl.
*H01L 27/108* (2006.01)
*H01L 29/76* (2006.01)
*H01L 29/94* (2006.01)
*H01L 31/119* (2006.01)

(52) U.S. Cl.
USPC ............. 257/297; 257/68; 257/288; 257/296; 257/E21.006; 257/E21.042; 257/E21.051; 257/E21.267; 257/E21.32; 257/E21.4; 257/E21.435; 257/E21.545

(58) Field of Classification Search
USPC ............. 257/297, 288, 68, 296, 69, 322, 350, 257/607, E21.006, E21.042, E21.051, 257/E21.267, E21.32, E21.4, E21.435, 257/E21.545
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |

(Continued)

FOREIGN PATENT DOCUMENTS

| | | |
|---|---|---|
| EP | 0 274 278 | 7/1988 |
| EP | 0 951 071 A1 | 10/1999 |

(Continued)

OTHER PUBLICATIONS

PCT *Notification of Transmittal of the International Search Report and the Written Opinion of the International Searching Authority* for International Application No. PCT/US2011/041156; dated Sep. 21, 2011; 12 pages (Continued)

*Primary Examiner* — David Nhu
(74) *Attorney, Agent, or Firm* — Baker Botts L.L.P.

(57) ABSTRACT

Some structures and methods to reduce power consumption in devices can be implemented largely by reusing existing bulk CMOS process flows and manufacturing technology, allowing the semiconductor industry as well as the broader electronics industry to avoid a costly and risky switch to alternative technologies. Some of the structures and methods relate to a Deeply Depleted Channel (DDC) design, allowing CMOS based devices to have a reduced $V_T$ compared to conventional bulk CMOS and can allow the threshold voltage $V_T$ of FETs having dopants in the channel region to be set much more precisely. The DDC design also can have a strong body effect compared to conventional bulk CMOS transistors, which can allow for significant dynamic control of power consumption in DDC transistors. Additional structures, configurations, and methods presented herein can be used alone or in conjunction with the DDC to yield additional and different benefits.

29 Claims, 76 Drawing Sheets

| | Legacy LP | Low Power/Low Leakage | Turbo | Deep Sleep |
|---|---|---|---|---|
| Features | Same characteristics CMOS e.g. Layout, circuits reuse | Low dynamic power, Low leakage | Fast, low dynamic power | Low static power |
| $V_{DD}$ (V) | 1.1 | 0.4 - 0.7 | 0.5 - 0.7 | 0.3 - 0.5 |
| $V_{BS}$ (V) | 0 | 0 | 0.1 - 0.55 | 0.1V - -1.0 |

(56) References Cited

U.S. PATENT DOCUMENTS

| | | |
|---|---|---|
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,578,128 A | 3/1986 | Mundt et al. |
| 4,617,066 A | 10/1986 | Vasudev |
| 4,761,384 A | 8/1988 | Neppl et al. |
| 4,819,043 A | 4/1989 | Yazawa et al. |
| 5,144,378 A | 9/1992 | Hikosaka |
| 5,156,989 A | 10/1992 | Williams et al. |
| 5,166,765 A | 11/1992 | Lee et al. |
| 5,208,473 A | 5/1993 | Komori et al. |
| 5,298,763 A | 3/1994 | Shen et al. |
| 5,369,288 A | 11/1994 | Usuki |
| 5,384,476 A | 1/1995 | Nishizawa et al. |
| 5,559,368 A | 9/1996 | Hu et al. |
| 5,608,253 A | 3/1997 | Liu et al. |
| 5,663,583 A | 9/1997 | Matloubian et al. |
| 5,712,501 A | 1/1998 | Davies et al. |
| 5,726,488 A | 3/1998 | Watanabe et al. |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,895,954 A | 4/1999 | Yasumura et al. |
| 5,923,987 A | 7/1999 | Burr |
| 5,989,963 A | 11/1999 | Luning et al. |
| 6,020,227 A | 2/2000 | Bulucea |
| 6,087,210 A | 7/2000 | Sohn |
| 6,087,691 A | 7/2000 | Hamamoto |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,184,112 B1 | 2/2001 | Maszara et al. |
| 6,194,259 B1 | 2/2001 | Nayak et al. |
| 6,218,895 B1 | 4/2001 | De et al. |
| 6,229,188 B1 | 5/2001 | Aoki et al. |
| 6,245,618 B1 | 6/2001 | An et al. |
| 6,300,177 B1 | 10/2001 | Sundaresan et al. |
| 6,313,489 B1 | 11/2001 | Letavic et al. |
| 6,320,222 B1 | 11/2001 | Forbes et al. |
| 6,326,666 B1 | 12/2001 | Bernstein et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,279 B1 | 7/2002 | Huster et al. |
| 6,444,550 B1 | 9/2002 | Hao et al. |
| 6,461,920 B1 | 10/2002 | Shirahata |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,506,640 B1 | 1/2003 | Ishida et al. |
| 6,518,623 B1 | 2/2003 | Oda et al. |
| 6,534,373 B1 | 3/2003 | Yu |
| 6,541,829 B2 | 4/2003 | Nishinohara et al. |
| 6,548,842 B1 | 4/2003 | Bulucea et al. |
| 6,551,885 B1 | 4/2003 | Yu |
| 6,573,129 B2 | 6/2003 | Hoke et al. |
| 6,600,200 B1 | 7/2003 | Lustig et al. |
| 6,620,671 B1 | 9/2003 | Wang et al. |
| 6,624,488 B1 | 9/2003 | Kim |
| 6,630,710 B1 | 10/2003 | Augusto |
| 6,660,605 B1 | 12/2003 | Liu |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,753,230 B2 | 6/2004 | Sohn et al. |
| 6,787,424 B1 | 9/2004 | Yu |
| 6,797,994 B1 | 9/2004 | Hoke et al. |
| 6,808,994 B1 | 10/2004 | Wang |
| 6,831,292 B2 | 12/2004 | Currie et al. |
| 6,881,641 B2 | 4/2005 | Wieczorek et al. |
| 6,881,987 B2 | 4/2005 | Sohn |
| 6,893,947 B2 | 5/2005 | Martinez et al. |
| 6,916,698 B2 | 7/2005 | Mocuta et al. |
| 6,930,007 B2 | 8/2005 | Bu et al. |
| 6,930,360 B2 | 8/2005 | Yamauchi et al. |
| 6,963,090 B2 | 11/2005 | Passlack et al. |
| 7,002,214 B1 | 2/2006 | Boyd et al. |
| 7,008,836 B2 | 3/2006 | Algotsson et al. |
| 7,015,546 B2 | 3/2006 | Herr et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,515 B2 | 8/2006 | Hanafi et al. |
| 7,119,381 B2 | 10/2006 | Passlack |
| 7,170,120 B2 | 1/2007 | Datta et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,235,822 B2 | 6/2007 | Li |
| 7,297,994 B2 | 11/2007 | Wieczorek et al. |
| 7,301,208 B2 | 11/2007 | Handa et al. |
| 7,304,350 B2 | 12/2007 | Misaki |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,442,971 B2 | 10/2008 | Wirbeleit et al. |
| 7,485,536 B2 | 2/2009 | Jin et al. |
| 7,491,988 B2 | 2/2009 | Tolchinsky et al. |
| 7,494,861 B2 | 2/2009 | Chu et al. |
| 7,501,324 B2 | 3/2009 | Babcock et al. |
| 7,538,412 B2 | 5/2009 | Schulze et al. |
| 7,564,105 B2 | 7/2009 | Chi et al. |
| 7,598,142 B2 | 10/2009 | Ranade et al. |
| 7,605,041 B2 | 10/2009 | Ema et al. |
| 7,608,496 B2 | 10/2009 | Chu |
| 7,615,802 B2 | 11/2009 | Elpelt et al. |
| 7,642,140 B2 | 1/2010 | Bae et al. |
| 7,645,665 B2 | 1/2010 | Kubo et al. |
| 7,655,523 B2 | 2/2010 | Babcock et al. |
| 7,675,126 B2 | 3/2010 | Cho |
| 7,678,638 B2 | 3/2010 | Chu et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,750,405 B2 | 7/2010 | Nowak |
| 7,750,682 B2 | 7/2010 | Bernstein et al. |
| 7,755,146 B2 | 7/2010 | Helm et al. |
| 7,829,402 B2 | 11/2010 | Matocha et al. |
| 7,883,977 B2 | 2/2011 | Babcock et al. |
| 7,888,747 B2 | 2/2011 | Hokazono |
| 7,906,413 B2 | 3/2011 | Cardone et al. |
| 7,960,238 B2 | 6/2011 | Kohli et al. |
| 7,968,400 B2 | 6/2011 | Cai |
| 7,968,411 B2 | 6/2011 | Williford |
| 8,012,827 B2 | 9/2011 | Yu et al. |
| 8,039,332 B2 | 10/2011 | Bernard et al. |
| 8,048,791 B2 | 11/2011 | Hargrove et al. |
| 8,048,810 B2 | 11/2011 | Tsai et al. |
| 8,105,891 B2 | 1/2012 | Yeh et al. |

(56) References Cited

U.S. PATENT DOCUMENTS

| | | | |
|---|---|---|---|
| 8,106,424 B2 | 1/2012 | Schruefer | |
| 8,106,481 B2 | 1/2012 | Rao | |
| 8,119,482 B2 | 2/2012 | Bhalla et al. | |
| 8,129,246 B2 | 3/2012 | Babcock et al. | |
| 8,129,797 B2 | 3/2012 | Chen et al. | |
| 8,134,159 B2 | 3/2012 | Hokazono | |
| 8,143,678 B2 | 3/2012 | Kim et al. | |
| 8,173,502 B2 | 5/2012 | Yan et al. | |
| 8,183,096 B2 | 5/2012 | Wirbeleit | |
| 8,183,107 B2 | 5/2012 | Mathur et al. | |
| 8,273,617 B2 * | 9/2012 | Thompson et al. | 438/197 |
| 2001/0014495 A1 | 8/2001 | Yu | |
| 2003/0122203 A1 | 7/2003 | Nishinohara | |
| 2003/0215991 A1 | 11/2003 | Sohn et al. | |
| 2004/0084731 A1 | 5/2004 | Matsuda et al. | |
| 2005/0056877 A1 | 3/2005 | Rueckes et al. | |
| 2005/0093021 A1 | 5/2005 | Ouyang et al. | |
| 2005/0250289 A1 | 11/2005 | Babcock et al. | |
| 2005/0276094 A1 | 12/2005 | Yamaoka et al. | |
| 2006/0017100 A1 | 1/2006 | Bol et al. | |
| 2006/0049464 A1 | 3/2006 | Rao | |
| 2006/0071278 A1 | 4/2006 | Takao | |
| 2006/0091481 A1 | 5/2006 | Li et al. | |
| 2006/0154428 A1 | 7/2006 | Dokumaci | |
| 2006/0157794 A1 | 7/2006 | Doyle et al. | |
| 2006/0163674 A1 | 7/2006 | Cho | |
| 2007/0040222 A1 | 2/2007 | Van Camp et al. | |
| 2007/0158790 A1 | 7/2007 | Rao | |
| 2007/0194383 A1 | 8/2007 | Kato | |
| 2007/0242497 A1 | 10/2007 | Joshi et al. | |
| 2008/0067589 A1 | 3/2008 | Ito et al. | |
| 2008/0138953 A1 | 6/2008 | Challa et al. | |
| 2008/0169493 A1 | 7/2008 | Lee et al. | |
| 2008/0197439 A1 | 8/2008 | Goerlach et al. | |
| 2008/0203522 A1 | 8/2008 | Mandelman et al. | |
| 2008/0258198 A1 | 10/2008 | Bojarczuk et al. | |
| 2008/0272409 A1 | 11/2008 | Sonkusale et al. | |
| 2009/0003105 A1 | 1/2009 | Itoh et al. | |
| 2009/0004806 A1 | 1/2009 | Siprak | |
| 2009/0057746 A1 | 3/2009 | Sugll et al. | |
| 2009/0057762 A1 | 3/2009 | Bangsaruntip et al. | |
| 2009/0108350 A1 | 4/2009 | Cai et al. | |
| 2009/0121298 A1 | 5/2009 | Furukawa et al. | |
| 2009/0134468 A1 | 5/2009 | Tsuchiya et al. | |
| 2009/0302388 A1 | 12/2009 | Cai et al. | |
| 2010/0012988 A1 | 1/2010 | Yang et al. | |
| 2010/0187641 A1 | 7/2010 | Zhu et al. | |
| 2011/0073961 A1 | 3/2011 | Dennard et al. | |
| 2011/0079860 A1 | 4/2011 | Verhulst | |
| 2011/0079861 A1 | 4/2011 | Shifren et al. | |
| 2011/0169082 A1 | 7/2011 | Zhu et al. | |
| 2011/0175170 A1 | 7/2011 | Wang et al. | |
| 2011/0180880 A1 | 7/2011 | Chudzik et al. | |
| 2011/0193164 A1 | 8/2011 | Zhu | |
| 2012/0021594 A1 | 1/2012 | Gurtej et al. | |
| 2012/0056275 A1 | 3/2012 | Cai et al. | |
| 2012/0108050 A1 | 5/2012 | Chen et al. | |

FOREIGN PATENT DOCUMENTS

| | | |
|---|---|---|
| EP | 1 265 277 A2 | 12/2002 |
| EP | 1 450 394 A1 | 8/2004 |
| JP | 59 193066 | 11/1984 |
| JP | 4 186774 | 7/1992 |
| JP | 8 153873 | 6/1996 |
| JP | 8 288508 | 11/1996 |
| JP | 2004 087671 | 3/2004 |
| WO | WO 03/083950 | 10/2003 |
| WO | WO 2006/113077 A2 | 10/2006 |
| WO | WO 2009/053327 | 4/2009 |
| WO | WO 2009/055173 A2 | 4/2009 |

OTHER PUBLICATIONS

Yan, et al., "Scaling the Si MOSFET: From Bulk to SOI to Bulk", IEEE Transactions on Electron Devices, IEEE Service Center, Pisacataway, NJ, US, vol. 39, No. 7, Jul. 1, 1992 pp. 1704-1710.

PCT Notice of Transmittal of the International Search Report and the Written Opinion of the International Search Authority, or the Declaration, PCT/US2011/025278, 14 pp. dated Jun. 17, 2011.

Wann, C., et al. "Channel profile optimization and device design for low-power high-performance dynamic-threshold MSFET", XP002636420, Database accession No. 5558897, Dec. 11, 1996.

Wann, C., et al. "Channel profile optimization and device design for dynamic-threshold MOSFET" International Electron Devices Meeting, Dec. 8, 1996, pp. 113-116.

Kotaki, H., et al. "Novel bulk dynamic threshold voltage MOSFET (B-DTMOS) with advanced isolation (SITOS) and gate to shallow-well contact (SSS-C) processes for ultra low power dual gate CMOS", International Electron Devices Meeting, San Francisco, CA, Dec. 8, 1996, pp. 459-462.

PCT Notice of Transmittal of the International Search Report and the Written Opinion of the International Search Authority, or the Declaration, PCT/US2011/025284, 13 pp. dated Apr. 19, 2011.

Noda, K et al., "A 0.1μm Delta-Doped MOSFET Fabricated with Post-Low-Energy Implanting Selective Epitaxy", IEEE Transactions on Electron Devices, vol. 45, No. 4, pp. 809-814, Apr. 1998.

Abiko, H., et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24.

Hokazono, A., et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113.

Hokazono, A., et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Thompson, S., et al. "MOS Scaling: Transistor Challenges for the 21st Century", Intel Technology Journal Q3' 1998, pp. 1-19.

Chau, R., et al., "A 50nm Depleted-Substrate CMOS Transistor (DST)" Electron Device Meeting 2001, IEDM Technical Digest, IEEE International, pp. 29.1.1-29.1.4.

Ohguro, T., et al. "An 0.18-μm CMOS for Mixed Digital and Analog Applications with Zero-Volt-Vth Epitaxial-Channel MOSFET's ", IEEE Transactions on Electron Device, vol. 46, No. 7, pp. 1378-1383, Jul. 1999.

PCT Notice of Transmittal of the International Search Report and the Written Opinion of the International Search Authority, or the Declaration, PCT/US20101055760, 9 pp. dated Feb. 15, 2011.

*PCT Notification of Transmittal of the International Search Report and the Written Opinion of the International Searching Authority* for International Application No. PCT/US10/48998; 10 pages.

*PCT Notification of Transmittal of the International Search Report and the Written Opinion of the International Searching Authority* for International Application No. PCT/US2010/049000; 9 pages.

*PCT Notification of Transmittal of the International Search Report and the Written Opinion of the International Searching Authority* for International Application No. PCT/US2010/055762; 8 pages.

US 7,011,991, 03/2006, Li (withdrawn)

* cited by examiner

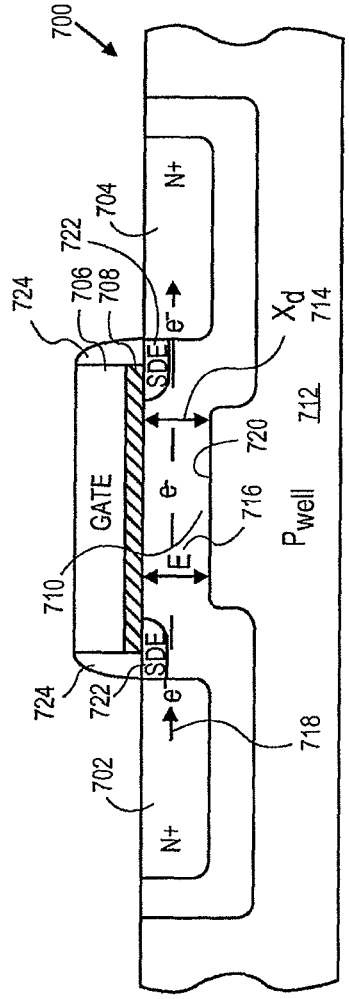
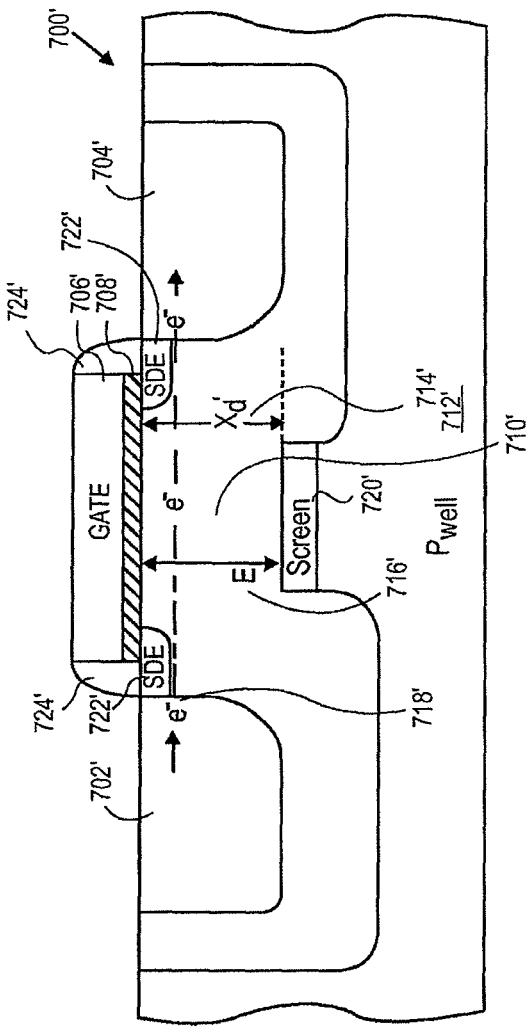
FIG. 7A (CONVENTIONAL ART)
FIG. 7B

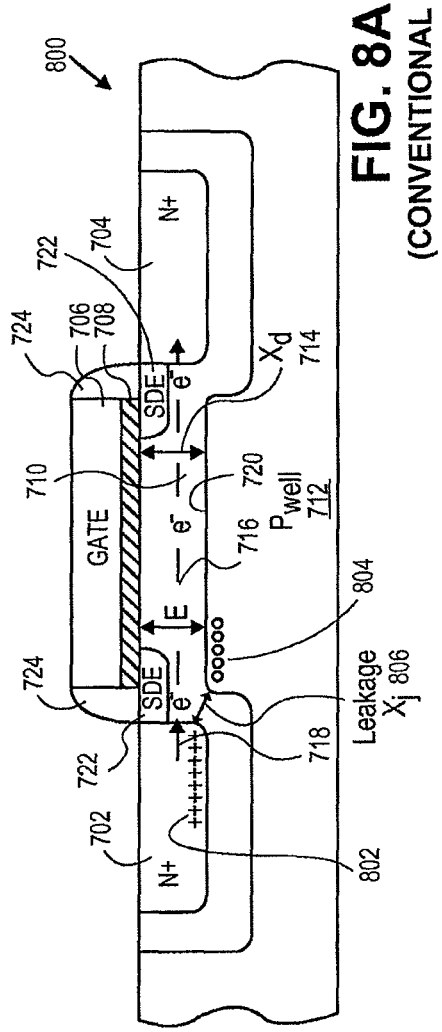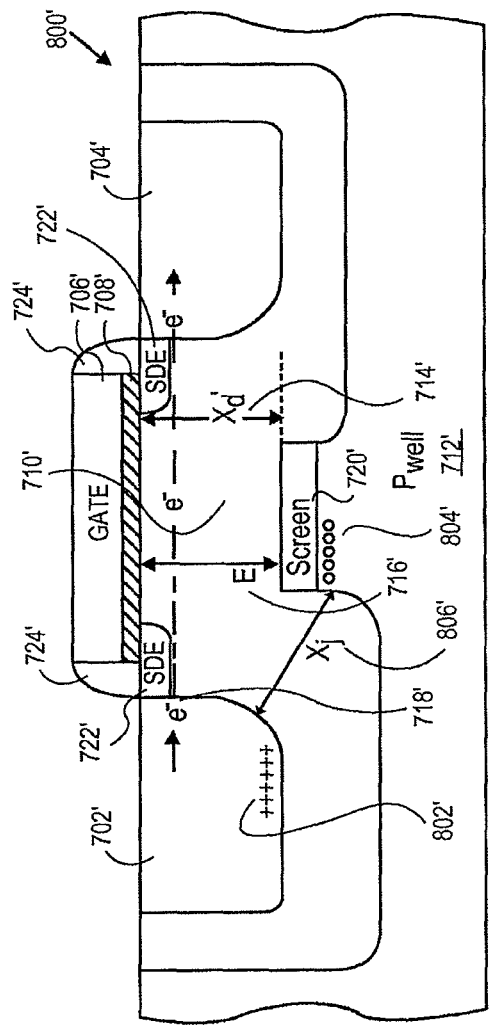

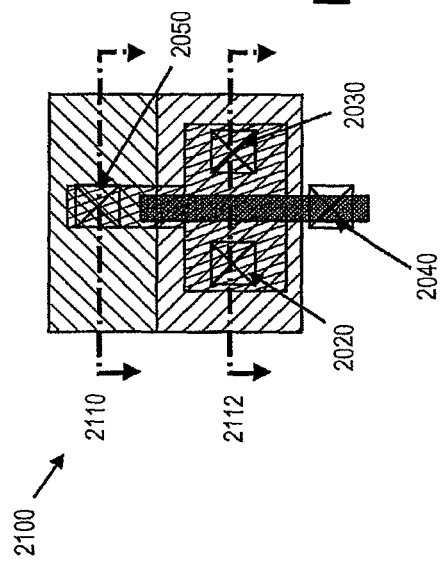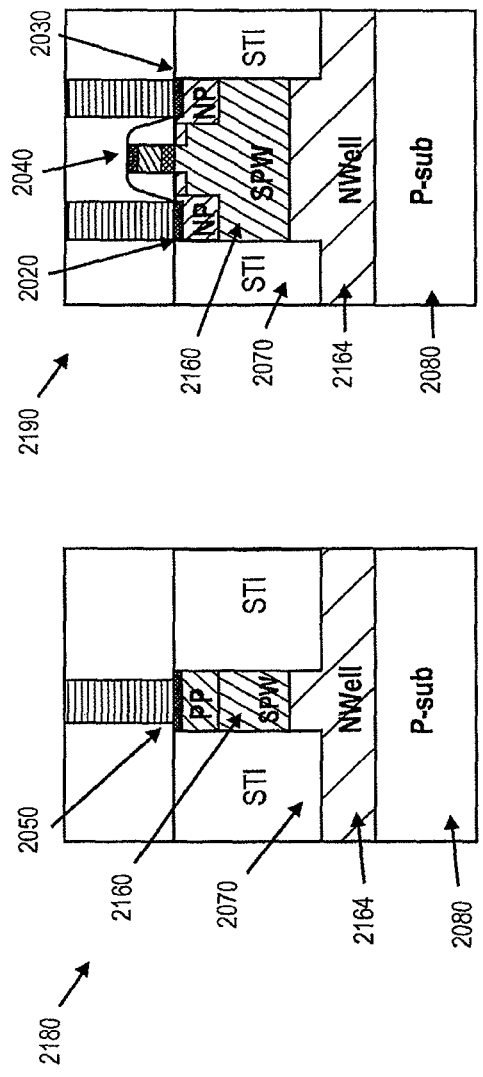

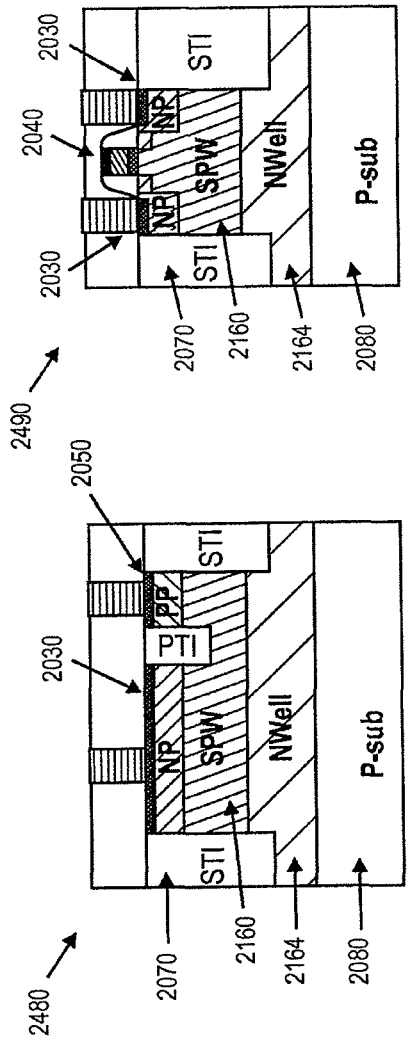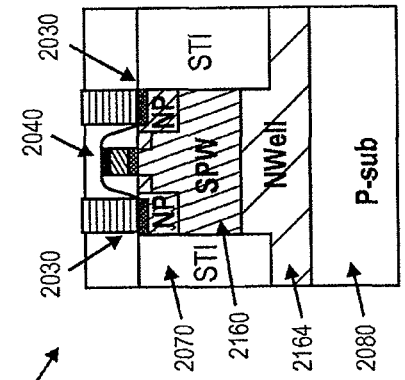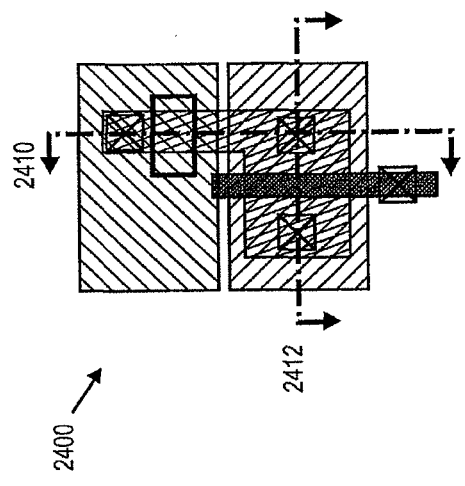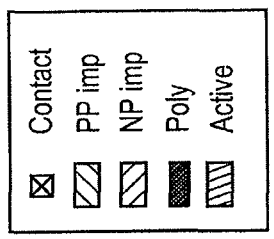

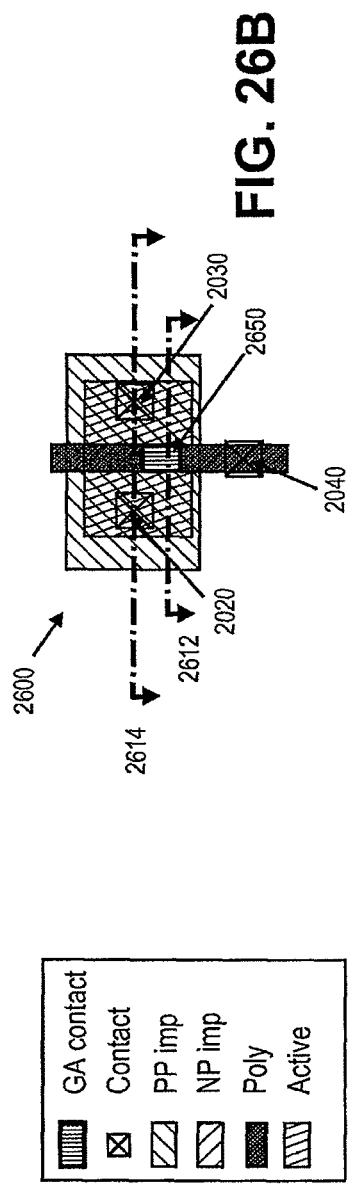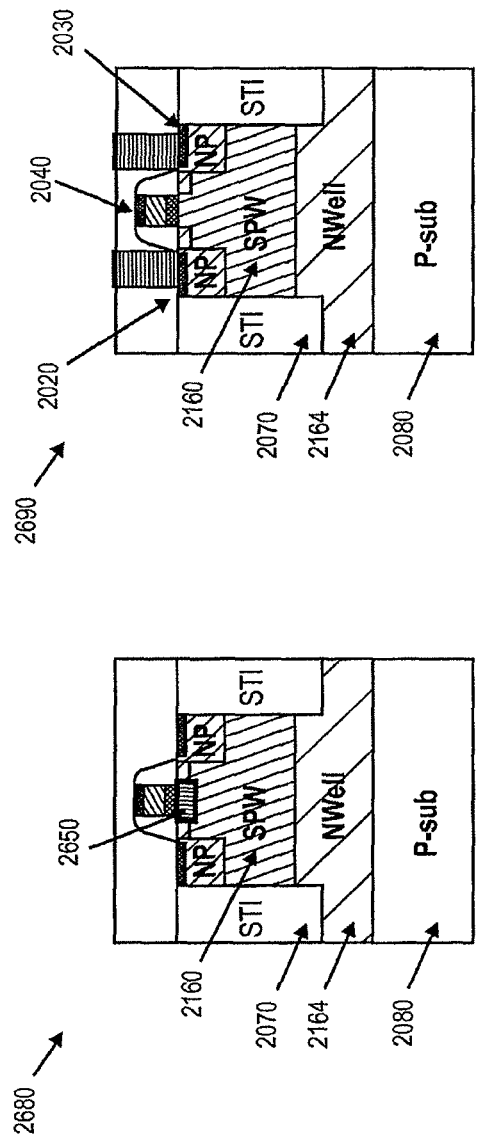
FIG. 26B
FIG. 26C
FIG. 26A

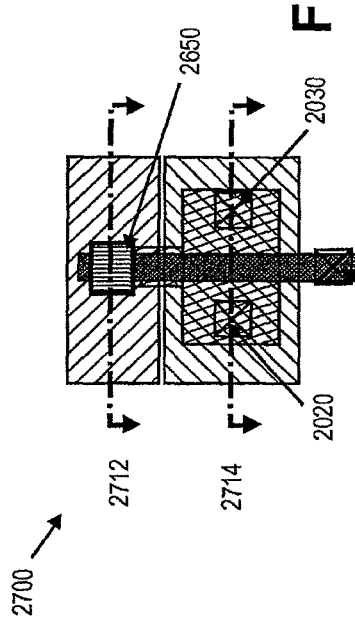
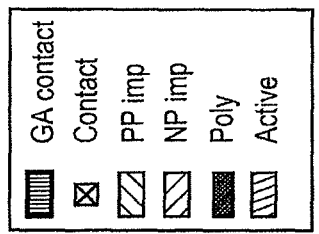
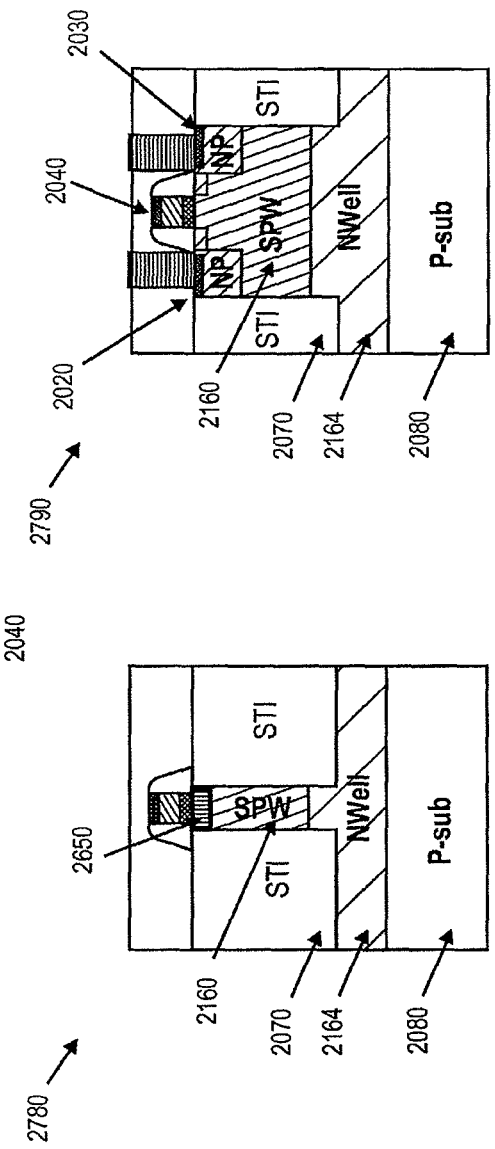
FIG. 27B
FIG. 27C
FIG. 27A

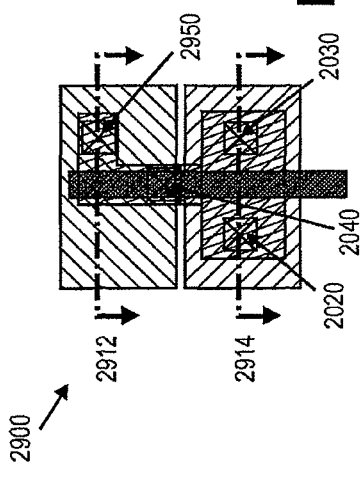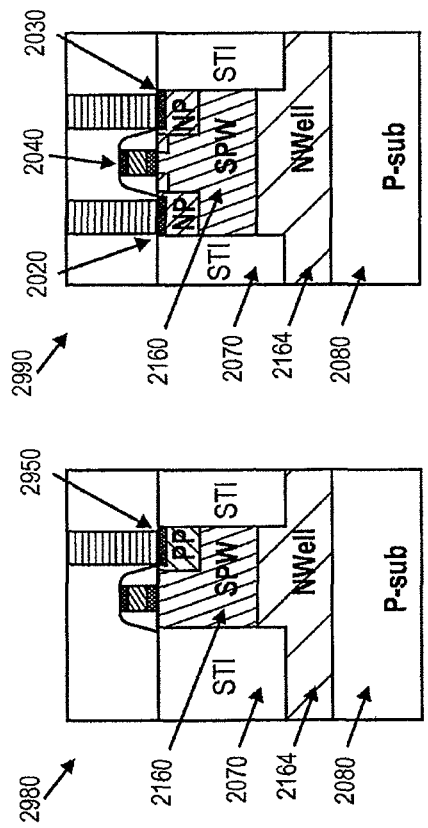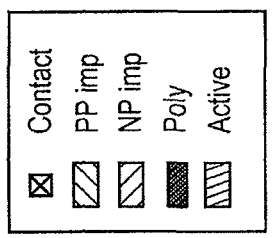

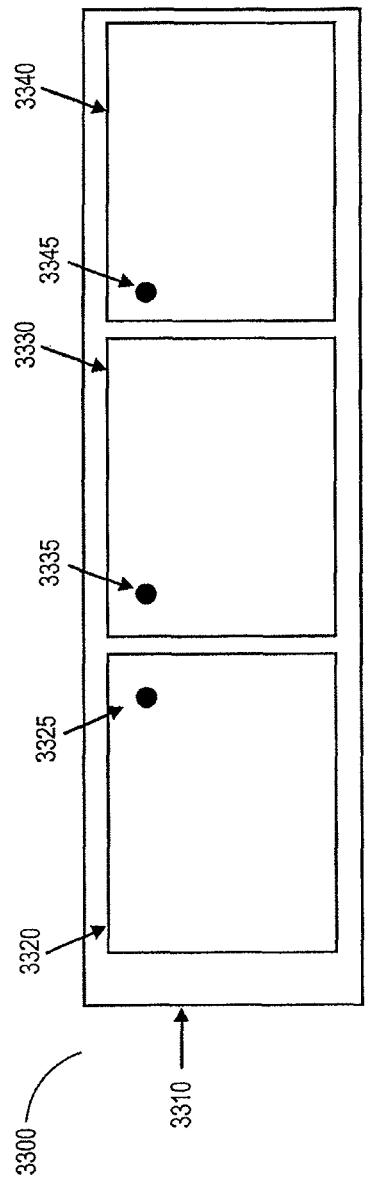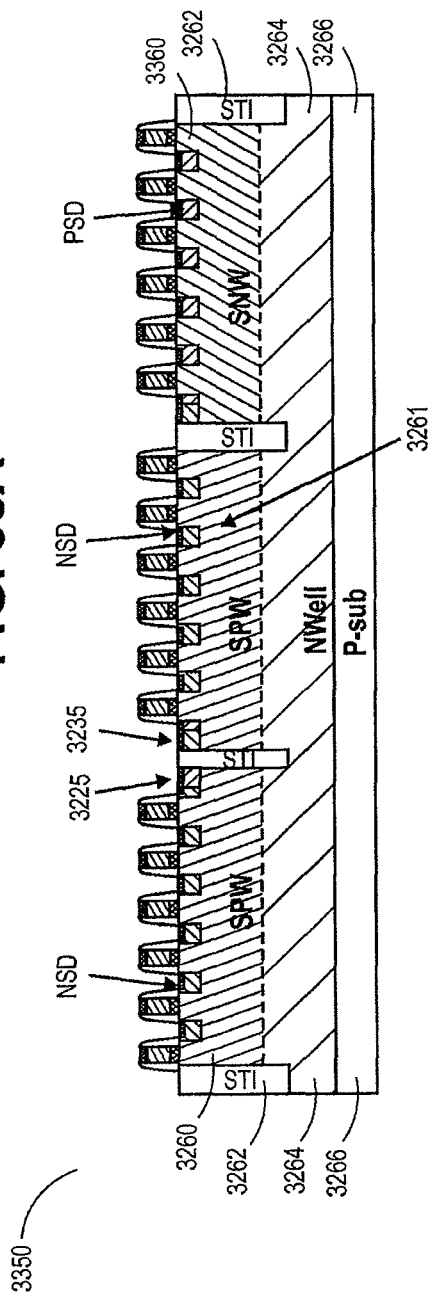
FIG. 33A
FIG. 33B

FIG. 34Aii

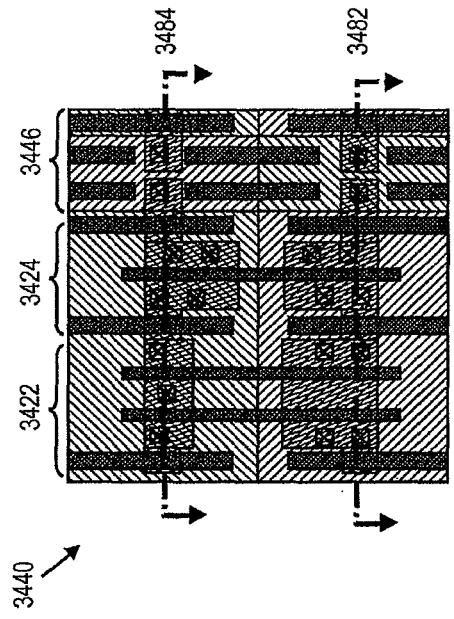
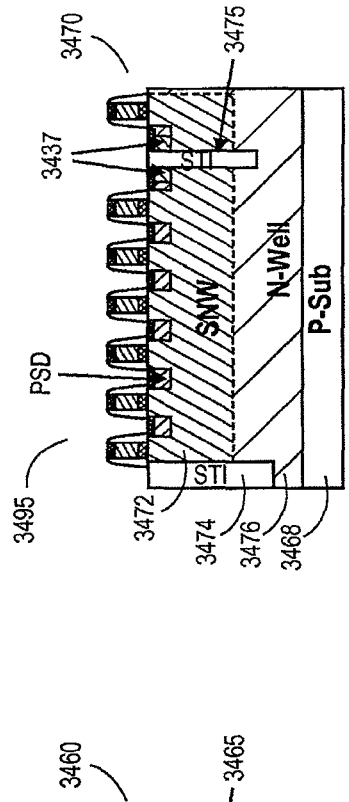
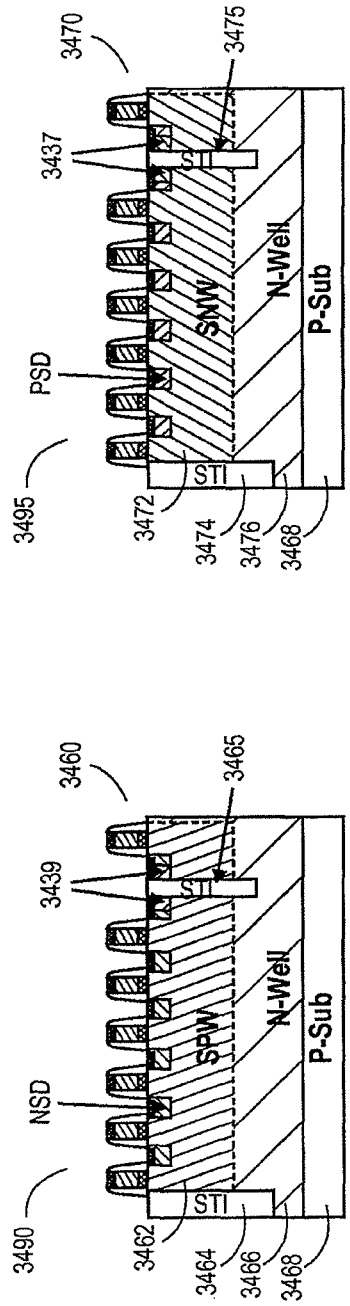
FIG. 34Ei
FIG. 34Eii
FIG. 34Eiii

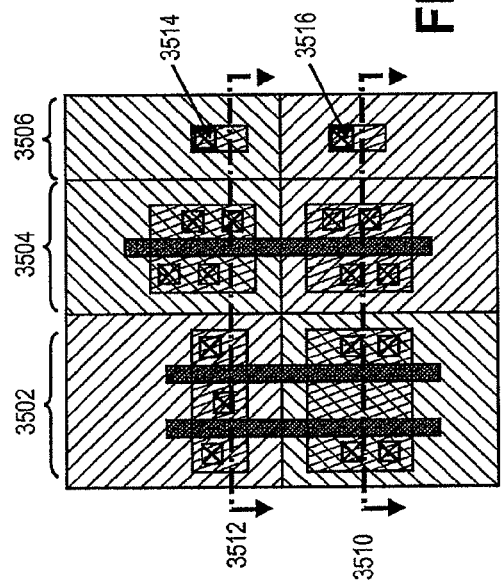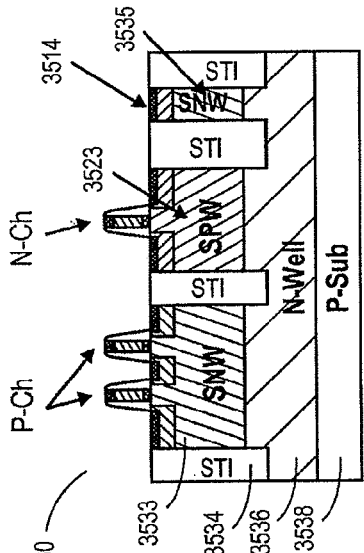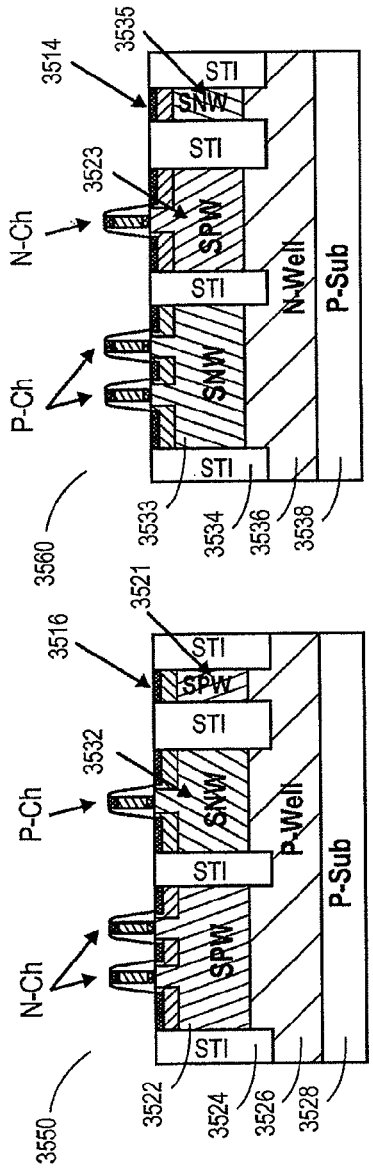

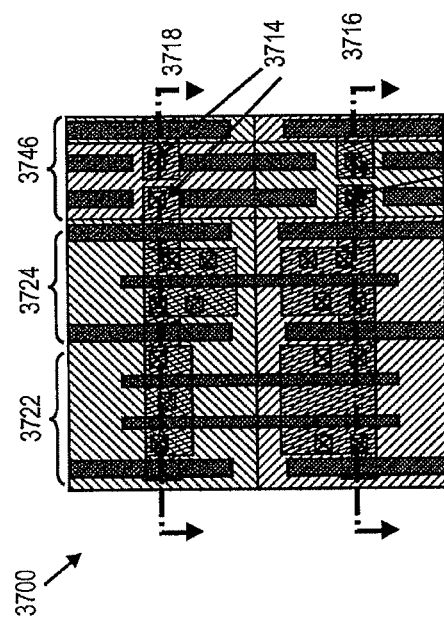
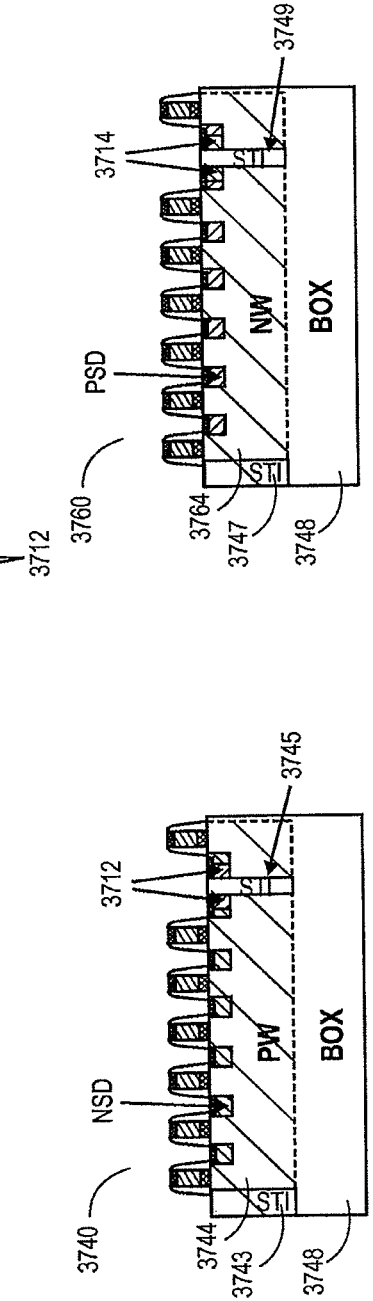
FIG. 37A
FIG. 37B
FIG. 37C

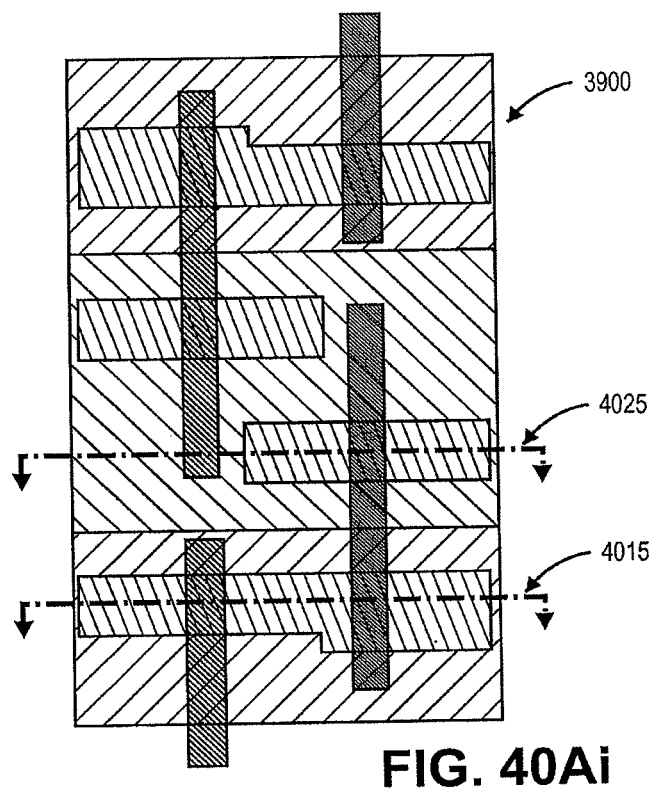
FIG. 40Ai
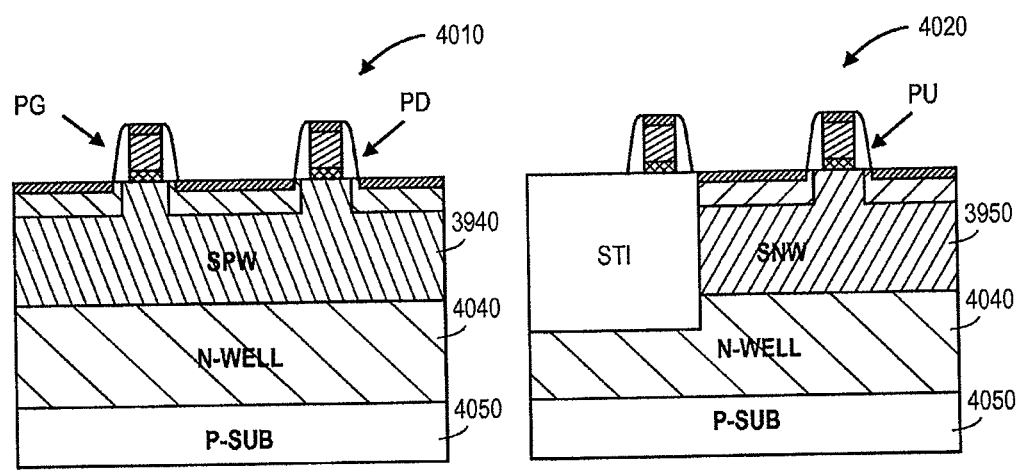
FIG. 40Aii  FIG. 40Aiii

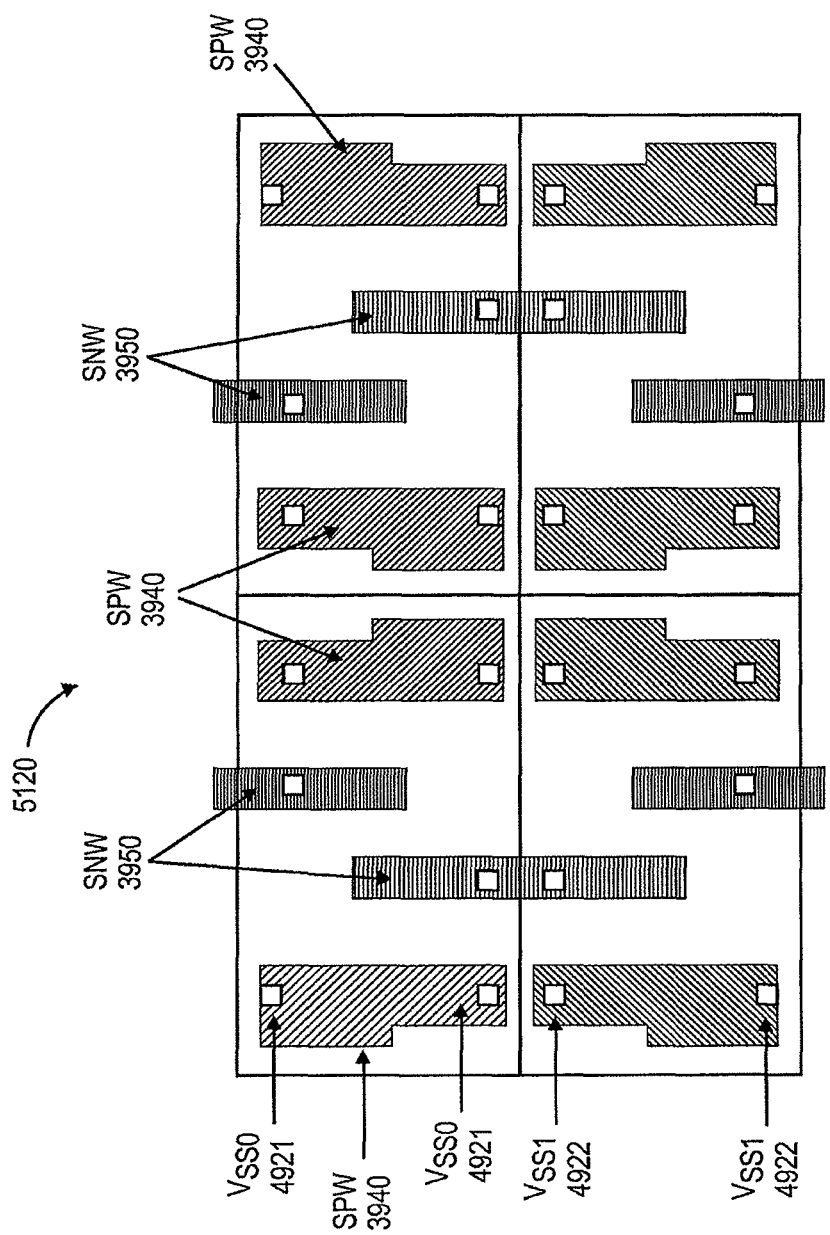

ELECTRONIC DEVICES AND SYSTEMS, AND METHODS FOR MAKING AND USING THE SAME

RELATED APPLICATION

This application is a continuation of U.S. application Ser. No. 12/708,497 filed Feb. 18, 2010, now U.S. Pat. No. 8,273, 617, which claims the benefit of U.S. Provisional Application No. 61/247,300, filed Sep. 30, 2009, the disclosure of which is incorporated by reference herein. This application also claims the benefit of U.S. Provisional Application No. 61/262,122, filed Nov. 17, 2009, the disclosure of which is incorporated by reference herein.

BACKGROUND

Electronic devices have become an integral part of daily life as never before. Systems such as personal computers and mobile phones have fundamentally reshaped how we work, how we play, and how we communicate. Each passing year brings the introduction of new devices such as digital music players, e-book readers and tablets, as well as improvements to preexisting families of products. These new devices show ever increasing innovation that continues to transform how we conduct our lives.

The rising importance of electronic systems to the world economy and modem culture has, to date, been enabled in significant part by the semiconductor industry's adherence to Moore's Law. Named after Gordon Moore, a founder of Intel who first observed the phenomenon, Moore's Law provides that the number of transistors that can be made inexpensively within the same area on an integrated circuit (or chip) steadily increases over time. Some industry experts quantify the law, stating, for example, that the number of transistors within the same area roughly doubles approximately every two years. Without the increase in functionality and related decreases in cost and size provided by Moore's Law, many electronics systems that are widely available today would not have been practicable or affordable.

For some time the semiconductor industry has succeeded in holding to Moore's Law by using bulk CMOS technology to make circuits in chips. Bulk CMOS technology has proven to be particularly "scalable," meaning that bulk CMOS transistors can be made smaller and smaller while optimizing and reusing existing manufacturing processes and equipment in order to maintain acceptable production costs. Historically, as the size of a bulk CMOS transistor decreased, so did its power consumption, helping the industry provide increased transistor density at a reduced cost in keeping with Moore's Law. Thus, the semiconductor industry has been able to scale the power consumption of bulk CMOS transistors with their size, reducing the cost of operating transistors and the systems in which they reside.

In recent years, however, decreasing the power consumption of bulk CMOS transistors while reducing their size has become increasingly more difficult. Transistor power consumption directly affects chip power consumption, which, in turn, affects the cost of operating a system and, in some cases, the utility of the system. For example, if the number of transistors in the same chip area doubles while the power consumption per transistor remains the same or increases, the power consumption of the chip will more than double. This is due in part by the need to cool the resulting chip, which also requires more energy. As a result, this would more than double the energy costs charged to the end user for operating the chip. Such increased power consumption could also significantly reduce the usefulness of consumer electronics, for example, by reducing the battery life of mobile devices. It could also have other effects such as increasing heat generation and the need for heat dissipation, potentially decreasing reliability of the system, and negatively impacting the environment.

There has arisen among semiconductor engineers a widespread perception that continued reduction of power consumption of bulk CMOS is infeasible, in part because it is believed that the operating voltage $V_{DD}$ of the transistor can no longer be reduced as transistor size decreases. A CMOS transistor is either on or off. The CMOS transistor's state is determined by the value of a voltage applied to the gate of the transistor relative to a threshold voltage $V_T$ of the transistor. While a transistor is switched on, it consumes dynamic power, which can be expressed by the equation:

$$P_{dynamic} = CV_{DD}^2 f$$

Where $V_{DD}$ is the operating voltage supplied to the transistor, C is the load capacitance of the transistor when it is switched on, and f is the frequency at which the transistor is operated. While a transistor is switched off, it consumes static power, which can be expressed by the equation: $P_{static} = I_{OFF} V_{DD}$, where $I_{OFF}$ is the leakage current when the transistor is switched off. Historically, the industry has reduced transistor power consumption primarily by reducing the operating voltage $V_{DD}$, which reduces both dynamic and static power.

The ability to reduce the operating voltage $V_{DD}$, depends in part on being able to accurately set the threshold voltage $V_T$, but that has become increasingly difficult as transistor dimensions decrease because of a variety of factors, including, for example, Random Dopant Fluctuation (RDF). For transistors made using bulk CMOS processes, the primary parameter that sets the threshold voltage $V_T$ is the amount of dopants in the channel. Other factors that affect $V_T$ are halo implantation, source and drain extension, and other factors. In theory, this can be done precisely, such that the same transistors on the same chip will have the same $V_T$, but in reality the threshold voltages can vary significantly. This means that these transistors will not all switch on at the same time in response to the same gate voltage, and some may never switch on. For transistors having a channel length of 100 nm or less, RDF is a major determinant of variations in $V_T$, typically referred to as sigma $V_T$ or $\sigma V_T$, and the amount of $\sigma V_T$ caused by RDF only increases as channel length decreases. As shown in FIG. 1, which is based on information provided by Intel Corporation, estimated experimental data, together with a keynote presentation by Kiyoo Itoh, Hitachi Ltd., IEEE International Solid-State Circuits Conference, 2009, the conventional wisdom among semiconductor engineers has been that increasing $\sigma V_T$ in nanoscale bulk CMOS sets 1.0 V as a practical lower limit for the operating voltage $V_{DD}$ going forward. $V_{DD}$ is illustrated as a downward sloping function, with an industry goal to reduce to a TARGET area. The curve for $\sigma V_T$, however, increases with decreasing device feature size, where the RDF actually causes $V_{min}$ to increase. The power function of dynamic and static power is Power=$CV_{DD}^2 f + IV_{DD}$. Thus, overall power increases.

For these and other reasons, engineers in the semiconductor industry widely believe that bulk CMOS must be abandoned in future process nodes despite the fact that there are many known techniques for reducing $\sigma V_T$ in short channel devices. For example, one conventional approach to reducing $\sigma V_T$ in bulk CMOS involves acting to provide a non-uniform doping profile that increases dopant concentration in a channel as it extends vertically downward (away from the gate toward the substrate). Although this type of retrograde doping profile does reduce the sensitivity to the doping variations, it increases the sensitivity to short channel effects that adversely affect device operation. Because of short channel effects, these doping parameters are generally not scalable for nanoscale devices, making this approach not generally suitable for use with nanoscale, short channel transistors. With technology moving toward short channel devices formed at the 45 nm or even 22 nm process nodes, benefits of the retrograde approach in such devices are perceived to be limited.

Semiconductor engineers working to overcome these technological obstacles have also attempted to use super steep retrograde wells (SSRW) to address performance issues associated with scaling down to the nanoscale region. Like retrograde doping for nanometer scale devices, the SSRW technique uses a special doping profile, forming a heavily doped layer beneath a lightly doped channel. The SSRW profile differs from retrograde doping in having a very steep increase in dopant levels to reduce the channel doping to as low a level as possible. Such steep dopant profiles can result in reduction of short channel effects, increased mobility in the channel region, and less parasitic capacitance. However, it is very difficult to achieve these structures when manufacturing these devices for high volume, nanoscale integrated circuit applications. This difficulty is due in part to out-diffusion of the retrograde well and SSRW dopant species into the channel region, especially for a p-well device such as the NMOS transistor. Also, use of SSRW does not eliminate issues with random dopant density fluctuations that can increase $\sigma V_T$ to unacceptable levels.

In addition to these and other attempts to work through shortcomings of existing bulk CMOS implementations, the industry has become heavily focused on CMOS transistor structures that have no dopants in the channel. Such transistor structures include, for example, fully depleted Silicon On Insulator (SOI) and various FINFET, or omega gate devices. SOI devices typically have transistors defined on a thin top silicon layer that is separated from a silicon substrate by a thin insulating layer of glass or silicon dioxide, known as a Buried Oxide (BOX) layer. FINFET devices use multiple gates to control the electrical field in a silicon channel. Such can have reduced $\sigma V_T$ by having low dopants in the silicon channel. This makes atomic level variations in number or position of dopant atoms implanted in the channel inconsequential. However, both types of devices require wafers and related processing that are more complex and expensive than those used in bulk CMOS.

Given the substantial costs and risks associated with transitioning to a new technology, manufacturers of semiconductors and electronic systems have long sought a way to extend the use of bulk CMOS. Those efforts have so far proven unsuccessful. The continued reduction of power consumption in bulk CMOS has increasingly become viewed in the semiconductor industry as an insurmountable problem.

BRIEF DESCRIPTION OF THE FIGURES

FIG. 7A shows an example of a bulk CMOS transistor made according to conventional processes and structures.

FIG. 7B shows a DDC transistor according to an embodiment, having a significantly deeper depletion region as compared to the conventional bulk CMOS device of FIG. 7A.

FIG. 8A shows an example of a FET corresponding to the conventional bulk CMOS structure illustrated in FIG. 7A.

FIG. 8B shows an example of a FET that corresponding to the novel deep well structure illustrated in FIG. 7B.

FIGS. 21A, 21B and 21C show an example of a channel 4-terminal transistor having a shallow P-well (SPW) according to one embodiment.

FIGS. 24A, 24B and 24C show an example of a 4-terminal transistor having PTI according to one embodiment.

FIGS. 26A, 26B and 26C show another example of a 3-terminal transistor with PGC to connect the body to the gate according to one embodiment.

FIGS. 27A, 27B and 27C show another example of a 3-terminal transistor with the body contact made in an active area extended under a gate extension according to one embodiment.

FIGS. 29A, 29B and 29C show an example of a programmable 4/3-terminal transistor according to one embodiment.

FIG. 33A shows an example of a circuit capable of dynamic mode switching according to one embodiment.

FIG. 33B shows an example of a cross section for the circuit blocks in FIG. 33A.

FIGS. 34Ei, 34Eii and 34Eiii show an example of a cross section view corresponding to FIG. 34D.

FIGS. 35A, 35B and 35C show an example of a multimode switch circuit using mixed legacy devices and new devices according to one embodiment.

FIGS. 37A, 37B and 37C show an example of a multimode switch circuit based on the partially depleted (PD) SOI technology according to one embodiment.

FIGS. 40Ai, 40Aii and 40Aiii show examples of cross sections of the layout of FIG. 39.

FIG. 51B shows an example of a 2×2 SRAM array having $V_{ss}$ per row according to one embodiment.

DETAILED DESCRIPTION

Figure 1:
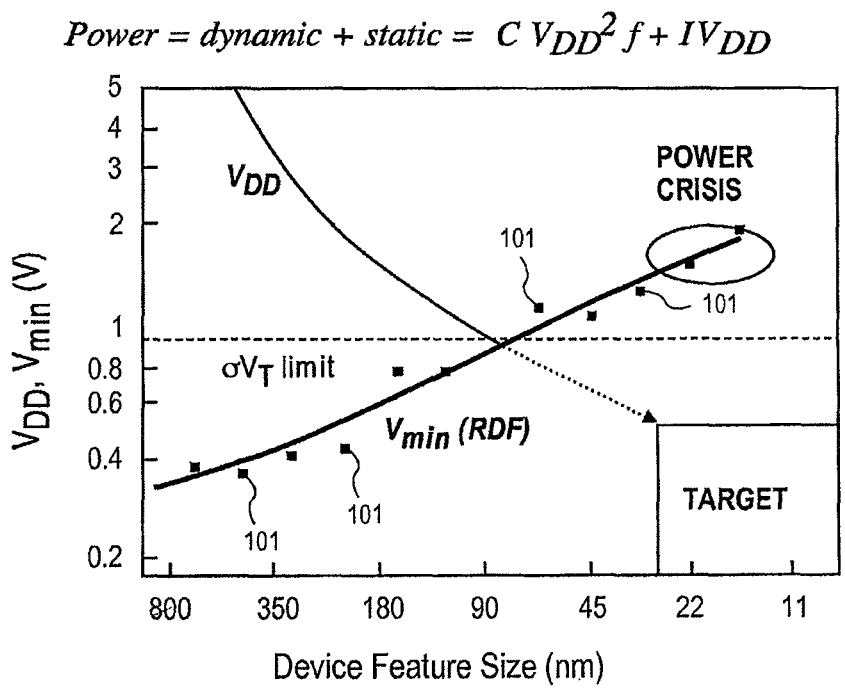
FIG. 1 shows an example of the trend of the power limit and $\sigma V_T$ limit for device scaling.

A suite of novel structures and methods is provided to reduce power consumption in a wide array of electronic devices and systems. Some of these structures and methods can be implemented largely by reusing existing bulk CMOS process flows and manufacturing technology, allowing the semiconductor industry as well as the broader electronics industry to avoid a costly and risky switch to alternative technologies.

As will be discussed, some of the structures and methods relate to a Deeply Depleted Channel (DDC) design. The DDC can permit CMOS devices having reduced $\sigma V_T$ compared to conventional bulk CMOS and can allow the threshold voltage VT of FETs having dopants in the channel region to be set much more precisely. The DDC design also can have a strong body effect compared to conventional bulk CMOS transistors, which can allow for significant dynamic control of power consumption in DDC transistors. There are many ways to configure the DDC to achieve different benefits, and additional structures and methods presented herein can be used alone or in conjunction with the DDC to yield additional benefits.

Also provided are advantageous methods and structures for integrating transistors on a chip including, for example, implementations that can take advantage of the DDC to provide improved chip power consumption. In addition, the transistors and integrated circuits in some embodiments can enable a variety of other benefits including lower heat dissipation, improved reliability, miniaturization, and/or more favorable manufacturing economics. There are a variety of approaches to accentuate some or all of the advantages of the new transistor structure, both statically and dynamically. Many of the developments at the integrated circuit level provide advantages even in the absence of the novel transistors discussed herein. Many of the methods and structures may be useful in types of devices other than bulk CMOS transistors including, for example, other types of transistors that have dopants in the channel and/or a body.

Also provided are methods and structures for incorporating and using the innovations described herein in systems, such as in electronic products, to provide benefits including, in some implementations, improved power consumption at the system level, improved system performance, improved system cost, improved system manufacturability and/or improved system reliability. As will be demonstrated, the innovations can advantageously be employed in a wide range of electronic systems including, in some embodiments, in consumer devices such as personal computers, mobile phones, televisions, digital music players, set top boxes, laptop and palmtop computing devices, e-book readers, digital cameras, GPS systems, flat panel displays, portable data storage devices and tablets, as well as in a variety of other electronic devices. In some of these implementations, the transistors and integrated circuits can materially enhance the operation and, accordingly, the commercial suitability, of the electronic system as a whole. In some embodiments, innovative transistors, integrated circuits and systems that contain them as described herein may also enable more environmentally friendly implementations than alternative approaches.

In one embodiment, a novel Field Effect Transistor (FET) structure is provided that has precisely controlled threshold voltage in comparison to conventional short channel devices. It can also have improved mobility and other important transistor characteristics. This structure and methods of making it can allow FET transistors that have a low operating voltage as compared to conventional devices. In addition, or alternatively, they can allow for the threshold voltage of such a device to be dynamically controlled during operation. The FET in some implementations can provide designers with the ability to design an integrated circuit having FET devices that can be dynamically adjusted while the circuit is in operation. The FET structure in an integrated circuit, in some embodiments, can be designed with nominally identical structure, and in addition or alternatively can be controlled, modulated or programmed to operate at different operating voltages in response to different bias voltages. These structures can enable a circuit to statically specify and/or dynamically change modes of operation in an efficient and reliable manner. In addition, in some implementations these structures can be configured post-fabrication for different applications within a circuit.

These and other benefits provide an advancement in digital circuits that fulfills many needs of designers, producers, and consumers. These benefits can provide systems composed of novel structures that enable continued and further advancement of integrated circuits, resulting in devices and systems with improved performance. In some implementations, bulk CMOS may continue for an additional period to keep pace with Moore's Law and further innovations in bulk CMOS based circuits and systems can continue to improve at advanced performance rates. The embodiments and examples will be described herein with reference to transistors, integrated circuits, electronic systems, and related methods, and will highlight the features and benefits that the novel structures and methods provide at various levels of the manufacturing process and the chain of commerce, including to end users of electronic products. The application of concepts inherent in these examples to structures and methods of producing integrated circuits and electronic systems will prove expansive. Accordingly, it will be understood that the spirit and scope of the inventions is not limited to these embodiments and examples, but is only limited by the claims appended herein and also in related and co-assigned applications.

A nanoscale Field Effect Transistor (FET) structure with a gate length less than 90 nanometers is provided with a more precisely controllable threshold voltage than conventional nanoscale FET devices. Additional benefits include improved carrier mobility and reduced variance in threshold voltage due to RDFs. One embodiment includes a nanoscale FET structure operable to have a depletion zone or region that extends to a depth below the gate set to be greater than one-half the gate length. The FET structure has at least two regions with different doping concentrations to help define a DDC in this depletion zone or region below the gate. In one example, a first region near the gate has a lower dopant concentration than a second region separated from the first region, and located at a distance below the gate. This provides a first low doped channel region (typically a substantially undoped epitaxially grown channel layer) paired with a second doped screening region that can act to define a DDC by terminating electric fields emanating from the gate when a threshold voltage or greater is applied to the gate. The deeply depleted region can alternatively be referred to as a DDC or deeply depleted zone, and will vary in spatial extent and characteristics depending on transistor structure and electrical operating conditions. There are many variations on the exact geometry and location of these structures and regions, and some are described in more detail below.

These structures and the methods of making the structures allow for FET transistors having both a low operating voltage and a low threshold voltage as compared to conventional nanoscale devices. Furthermore, they allow for the threshold voltage of such a device to be dynamically controlled during operation. Ultimately, these structures and the methods of making structures provide for designing integrated circuits having FET devices that can be dynamically adjusted while the circuit is in operation. Thus, transistors in an integrated circuit can be designed with nominally identical structure, and can be controlled, modulated or programmed to operate at different operating voltages in response to different bias voltages, or to operate in different operating modes in response to different bias voltages and operating voltages. In addition, these can be configured post-fabrication for different applications within a circuit.

Certain embodiments and examples are described herein with reference to transistors and highlight the features and benefits that the novel structures and methods provide transistors. However, the applicability of concepts inherent in these examples to structures and methods of producing integrated circuits is expansive and not limited to transistors or bulk CMOS. Accordingly, it will be understood in the art that the spirit and scope of the inventions is not limited to these embodiments and examples or to the claims appended herein and also in related and co-assigned applications, but may be advantageously applied in other digital circuitry contexts.

In the following description, numerous specific details are given of some of the preferred ways in which the inventions may be implemented. It is readily apparent that the inventions can be practiced without these specific details. In other instances, well known circuits, components, algorithms, and processes have not been shown in detail or have been illustrated in schematic or block diagram form in order not to obscure the inventions in unnecessary detail. Additionally, for the most part, details concerning materials, tooling, process timing, circuit layout, and die design have been omitted inasmuch as such details are not necessary to obtain a complete understanding of the inventions as they are considered to be within the understanding of persons of ordinary skill in the relevant art. Certain terms are used throughout the following description and claims to refer to particular system components. Similarly, it will be appreciated that components may be referred to by different names and the descriptions herein are not intended to distinguish between components that differ in name but not function. In the following discussion and in the claims, the terms "including" and "comprising" are used in an open-ended fashion, and thus should be interpreted to mean "including, but not limited to," for example.

Various embodiments and examples of the methods and structures mentioned above are described herein. It will be realized that this detailed description is illustrative only and is not intended to be in any way limiting. Other embodiments will readily suggest themselves to persons of ordinary skill in the art having the benefit of this disclosure. Reference will be made in detail to embodiments illustrated in the accompanying drawings. The same reference indicators will be used throughout the drawings and the following detailed description to refer to the same or like parts.

In the interest of clarity, not all of the routine features of the implementations and embodiments described herein are shown and described. It will, of course, be appreciated that in the development of any such actual implementation of the inventions herein, numerous implementation-specific decisions will typically be made in order to achieve the developer's specific goals. Moreover, it will be appreciated that such a development effort might be complex and time-consuming, but would nevertheless be a routine undertaking of engineering for those of ordinary skill in the art having the benefit of this disclosure.

Also, concentrations of atoms implanted or otherwise present in a substrate or crystalline layers of a semiconductor to modify physical and electrical characteristics of a semiconductor will be described in terms of physical and functional regions or layers. These may be understood by those skilled in the art as three-dimensional masses of material that have particular averages of concentrations. Or, they may be understood as sub-regions or sub-layers with different or spatially varying concentrations. They may also exist as small groups of dopant atoms, regions of substantially similar dopant atoms or the like, or other physical embodiments. Descriptions of the regions based on these properties are not intended to limit the shape, exact location or orientation. They are also not intended to limit these regions or layers to any particular type or number of process steps, type or numbers of layers (e.g., composite or unitary), semiconductor deposition, etch techniques, or growth techniques utilized. These processes may include epitaxially formed regions or atomic layer deposition, dopant implant methodologies or particular vertical or lateral dopant profiles, including linear, monotonically increasing, retrograde, or other suitable spatially varying dopant concentration. The embodiments and examples included herein may show specific processing techniques or materials used, such as epitaxial and other processes described below and illustrated in FIGS. 14A-I. These examples are only intended as illustrative examples, and are not nor should they be construed as limiting. The dopant profile may have one or more regions or layers with different dopant concentrations, and the variations in concentrations and how the regions or layers are defined, regardless of process, may or may not be detectable via techniques including infrared spectroscopy, Rutherford Back Scattering (RBS), Secondary Ion Mass Spectroscopy (SIMS), or other dopant analysis tools using different qualitative or quantitative dopant concentration determination methodologies.

Figure 2A:
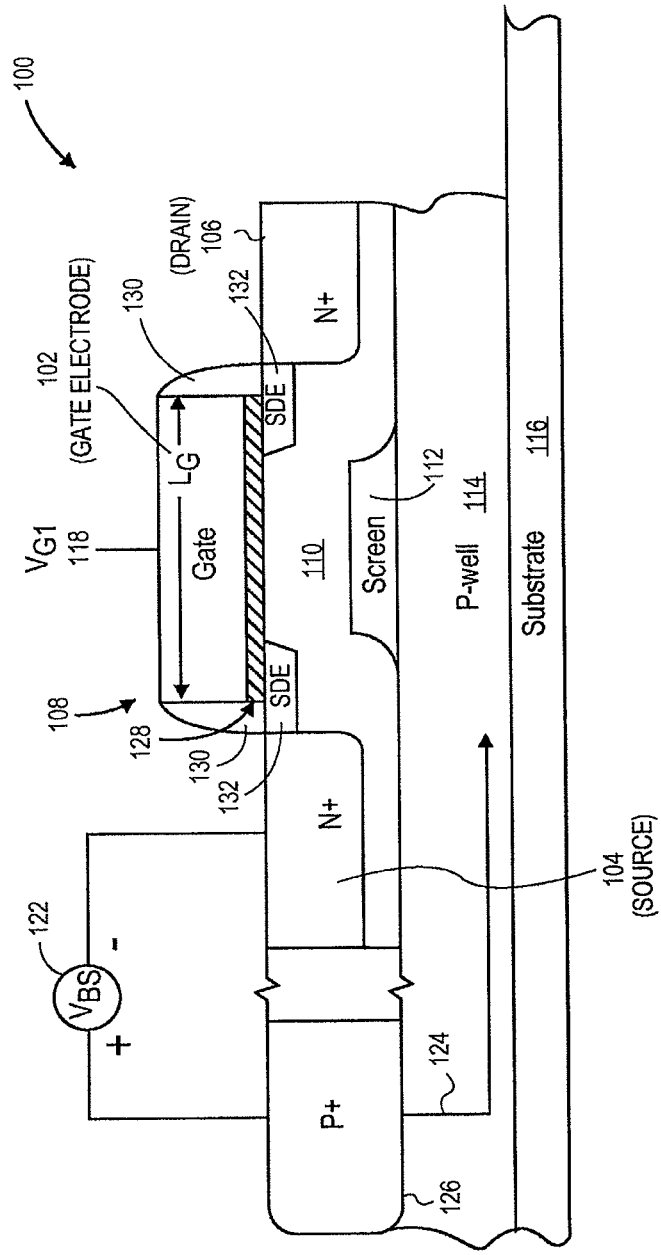
FIG. 2A shows a view of a Field Effect Transistor having a deeply depleted channel (DDC) according to one embodiment.

FIG. 2A shows a Field Effect Transistor (FET) 100 configured according to one embodiment. The FET 100 includes a gate electrode 102, source 104, drain 106, and a gate stack 108 positioned over a channel 110. The channel 110 may be deeply depleted, meaning that the depth of the channel measured generally from the gate stack to the screening region 112 is notably deeper than conventional channel depths, as described in more detail below. The channel 110 is illustrated above a screening region 112, but may be layered with different dopant concentrations as discussed below, were the change in dopants are relative from region to region (or layer to layer) including the screening region. In operation, a bias voltage 122 V BS may be applied to source 104, and P+ terminal 126 is connected to P-well 114 at connection 124 to close the circuit. The gate stack 108 includes a gate electrode 102, gate contact 118 and a gate dielectric 128. Gate spacers 130 are included to separate the gate from the source and drain. Source/Drain Extensions (SDE) 132 extend the source and drain under the dielectric 128.

The FET 100 is shown as an N-channel transistor having a source and drain made of N-type dopant material, formed upon a substrate as P-type doped silicon substrate providing a P-well 114 formed on a substrate 116. However, it will be understood that, with appropriate change to substrate or dopant material, a non-silicon P-type semiconductor transistor formed from other suitable substrates such as Gallium Arsenide based materials may be substituted.

The source 104 and drain 106 can be formed using conventional dopant implant processes and materials, and may include, for example, modifications such as stress inducing source/drain structures, raised and/or recessed source/drains, asymmetrically doped, counter-doped or crystal structure modified source/drains, or implant doping of source/drain extension regions according to HDD (highly doped drain) techniques. The extension regions 132 are generally formed within the substrate and facilitate absorption of some of the potential associated with the drain. Various other techniques to modify source/drain operational characteristics can also be used, including source drain channel extensions (tips), or halo implants that facilitate scaling the device channel length by creating localized dopant distributions near the source/drain (S/D) regions, where the distributions may extend under the channel. In certain embodiments, heterogeneous dopant materials can be used as compensation dopants to modify electrical characteristics.

The gate electrode 102 can be formed from conventional materials, including, but not limited to certain metals, metal alloys, metal nitrides and metal silicides, as well as laminates thereof and composites thereof. The gate electrode 102 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 102 can include silicide methods, chemical vapor deposition methods and physical vapor deposition methods, such as, but not limited to, evaporative methods and sputtering methods. Typically, the gate electrode 102 has an overall thickness from about 1 to about 500 nanometers.

The gate dielectric 128 may include conventional dielectric materials such as oxides, nitrides and oxynitrides. Alternatively, the gate dielectric 128 may include generally higher dielectric constant dielectric materials including, but not limited to hafnium oxides, hafnium silicates, zirconium oxides, lanthanum oxides, titanium oxides, barium-strontium-titanates and lead-zirconate-titanates, metal based dielectric materials, and other materials having dielectric properties. Preferred hafnium-containing oxides include $HfO_2$, $HfZrO_x$, $HfSiO_x$, $HfTiO_x$, $HfAlO_x$, and the like. Depending on composition and available deposition processing equipment, the gate dielectric 128 may be formed by such methods as thermal or plasma oxidation, nitridation methods, chemical vapor deposition methods (including atomic layer deposition methods) and physical vapor deposition methods. In some embodiments, multiple or composite layers, laminates, and compositional mixtures of dielectric materials can be used. For example, a gate dielectric can be formed from a $SiO_2$- based insulator having a thickness between about 0.3 and 1 nm and the hafnium oxide based insulator having a thickness between 0.5 and 4 nm. Typically, the gate dielectric has an overall thickness from about 0.5 to about 5 nanometers.

Below the gate dielectric 128, the channel region 110 is formed above screening layer 112. The channel region 110 contacts and extends between, the source 104 and the drain 106. Preferably, the channel region includes substantially undoped silicon, or advanced materials such as those from the SiGe family, or silicon doped to very low levels. Channel thickness can typically range from 5 to 50 nanometers.

The discussion immediately below will focus on bulk CMOS devices. In many nanoscale bulk CMOS FET devices, carrier mobility is adversely affected by high concentrations of the channel dopant required to set the threshold voltage, $V_T$. While high dopant concentration levels may prevent significant power leakage, when dopants are present in high concentrations they may act as scattering centers that greatly reduce channel mobility of mobile carriers such as electrons. In such a case, the electrons in the channel region are scattered, and do not efficiently move through the channel between a source and drain. Effectively, this limits the maximum amount of current ($I_{dsat}$) the channel can carry. In addition, the very thin gate and resultant high electric fields at the gate dielectric/channel interface may lead to severe quantum mechanical effects that reduce inversion layer charge density at a given gate voltage, which is associated with a decrease in the mobility and an increase in the magnitude of the threshold voltage $V_T$, again degrading device performance. Due to these characteristics, conventional scaling of bulk CMOS devices to the desired smaller size is perceived as increasingly difficult.

As an additional benefit, the use of a substantially undoped channel region can enhance the effectiveness of certain conventional techniques often used to improve transistor performance. For example, the source 104 and drain 106 positioned on opposing sides of the channel region 110 can be structured to modify stress applied in the channel region. Alternatively, the channel region can be modified by lattice matched and strained silicon germanium (SiGe) crystalline thin film lattice placed to cause a compressive strain in an in-plane direction of the channel. This can cause changes in band structure such that hole mobility increases as compared with intrinsic Si. Stress conditions can be modified by changing germanium (Ge) composition (higher Ge increases strain and the hole mobility becomes higher). For tensile strain, channel region Si can be formed on lattice-relaxed SiGe having a greater lattice constant. This results in both the electron mobility and the hole mobility increasing as compared with unstrained Si channel regions. Again, as germanium composition of the base SiGe is increased, the amount of the strain in the strained Si channel region and the carrier mobilities tend to increase. As will be understood, continuous stress layers are not required for application of stress to the channel regions, with non-contiguous or multiple separated stress layers being usable to apply a compressive or tensile force to various locations along the channel regions, including stress layers above, below, laterally arranged, or abutting, effectively allowing greater control over the applied stress.

In certain embodiments, stress layers may represent a layer of any material suitable to apply a stress to the channel region when applied adjacent to or abutting the channel. As one example, in particular embodiments, a stress layer may include a material that has a different thermal expansion rate than some or all of the remainder of semiconductor substrate. During fabrication of such embodiments, as the temperature of semiconductor substrate is reduced, certain portions differentially shrink, causing stretching or compressing of the channel region. As a result, at least a portion of the channel region may become strained, improving carrier mobility. In particular embodiments, a stress layer may include a material such as silicon nitride that has a greater thermal expansion coefficient than some or all of the semiconductor substrate. Additionally, or alternatively, different stress layers may be applied to various portions of the FET 100 to selectively improve the mobility of either holes or electrons in the channel region. For example, in particular embodiments, where complementary n-type and p-type transistor pairs are isolated from one another via appropriate p-type and n-type well structures a stress layer may be applied to the n-type transistor to apply a tensile stress to the channel region of the n-type transistor. This tensile stress may induce a strain in the channel region that improves the mobility of electrons through the channel region. Another stress layer may be applied to the p-type transistor to apply a compressive stress to the channel region of the p-type transistor. This compressive stress may induce a strain in the p-type channel region that improves the mobility of holes.

Provision of a transistor having a substantially undoped channel brings other advantages when stress is applied. For example, stress may be applied by compressive or tensile stress applied via the source/drain or channel stress techniques. As compared to conventional nanoscale transistors with uniformly or highly doped channels, a strained channel region FET transistor will provide a larger strain enhanced mobility due to the low concentrations of dopants near the gate dielectric (reduced ionized impurity scattering) and the lower electric field (reduced surface roughness scattering). Due to the reduced scattering, stress enhanced mobility will be significantly larger than in a conventional device. This mobility advantage attributable to strain will actually increase with downward size scaling of the transistor.

Figure 2B:
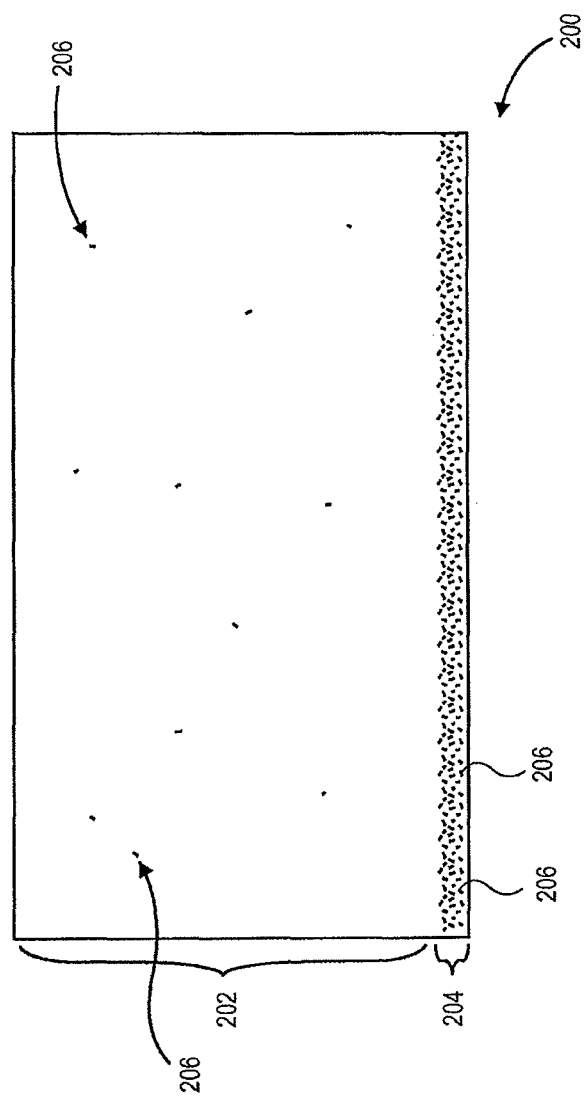
FIG. 2B shows a view of a channel having a deeply depleted region according to one embodiment.
Figure 2C:
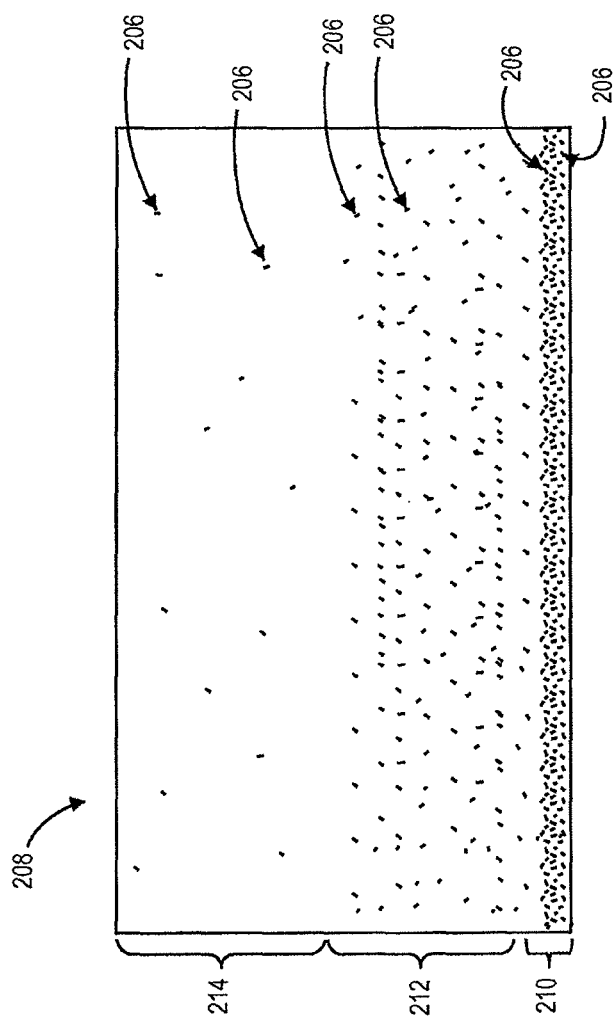
FIG. 2C shows another example of a channel having three regions of different doping concentrations according to one embodiment.
Figure 2D:
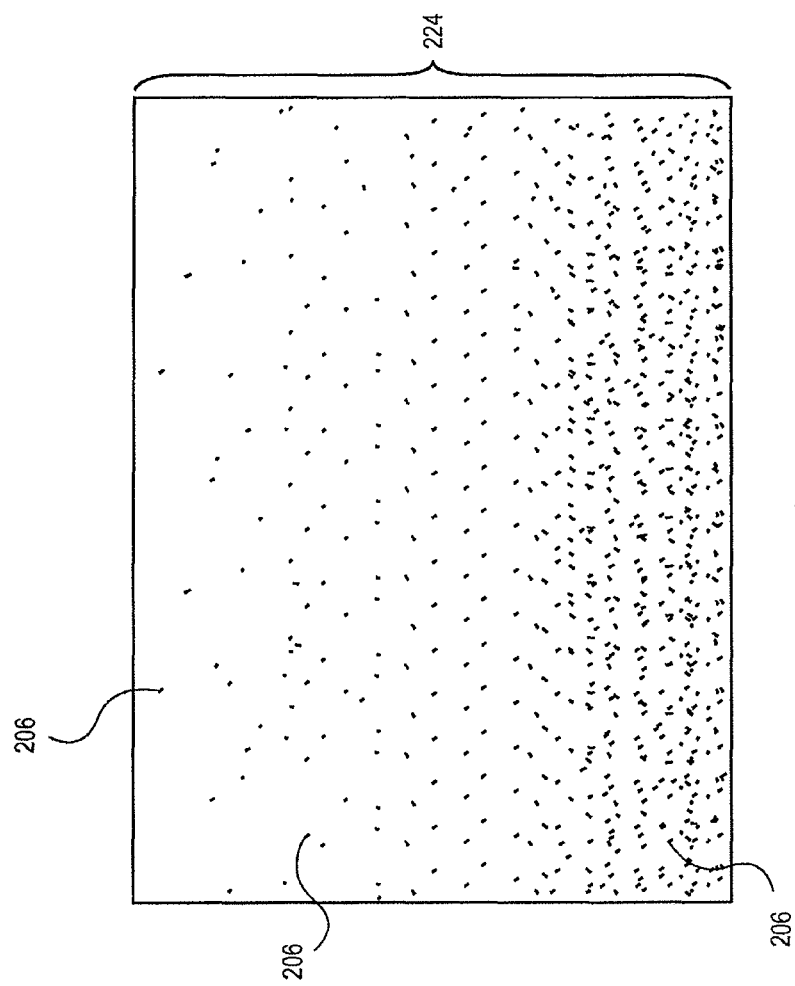
FIG. 2D shows another example of a channel having a deeply depleted region according to one embodiment.

FIG. 2A is a diagrammatic view of transistor configured according to one embodiment showing a screening region 112 and channel 110. FIG. 2B generally illustrates relative dopant concentrations between a depleted channel and a screening region. FIGS. 2C and 2D show diagrammatic views further illustrating two different examples of a DDC transistor channel that may be interchanged with the channel 110 and screening region 112 of FIG. 2A. Other regions and layers may be possible, and those skilled in the art will understand that other variations on regions, layers, different dopant concentrations and other concentrations and geometries are possible given the general structures illustrated and described herein. The different regions may include a deeply depleted region n the channel that would be located near the gate dielectric (such as the dielectric 128 shown in FIG. 2A), a threshold voltage tuning region, and a highly doped screening region. FIG. 2B illustrates one example of a cross section of a DDC transistor channel located next to a gate dielectric and having two regions with different dopant concentrations, a channel region 110 and screening region 112. The profile of this channel cross-section includes a depleted region 202 located between a gate dielectric (not shown) and screening region 204. Dopant atoms 206 are illustrated, with dopant density in the screening region 204 corresponding to relative dopant atom density in the depleted channel region 202 compared to the screening region 204.

FIG. 2C shows another example of a channel region 208, this one having three regions of different doping concentrations. In this example, the depleted dopant channel region 214 has the least amount of dopants 206, the threshold tuning region 212 generally having a higher concentration of dopant atoms than the depleted dopant channel region 214, and the screening region 210 having the highest concentration of dopant atoms.

FIG. 2D shows still yet another variation, where the channel cross-section has an increasing dopant atom concentration 224 from the top channel region to the bottom. In different applications and embodiments, the dopant range in the top of the channel can vary, but will typically be as low toward the top of the channel as process and anneal conditions permit. The dopant range toward the center of the channel can increase up and through the bottom of the channel to progress into a screening region with a higher concentration of dopants.

In either of these configurations, the threshold voltage tuning region can be formed as a separate epitaxially grown silicon layer, or formed as part of a single silicon epitaxial layer that also includes a depleted channel region. The threshold tuning region thickness can typically range from 5 to 50 nanometers in thickness. When substantially undoped, appropriate selection of the thickness of the region itself slightly adjusts threshold voltage, while for more typical applications the threshold voltage tuning region is doped to have average concentrations ranging from between $5 \times 10^{17}$ and $2 \times 10^{19}$ atoms/cm$^3$. In certain embodiments, dopant migration resistant layers of carbon, germanium, or the like can be applied above and/or below the threshold voltage tuning region to prevent dopant migration into the channel region, or alternatively, from the screening region into the threshold voltage tuning region.

The screening region is a highly doped region buried under the channel region and threshold voltage tuning region, if provided. The screening layer is generally positioned at a distance to avoid direct contact with the source and the drain. In certain other embodiments, it may be formed as a sheet extending under multiple source/drain/channel regions, while in other embodiments it may be a self aligned implant or layer coextensive with the channel region. The screening region thickness can typically range from 5 to 50 nanometers. The screening region is highly doped relative to the channel, the threshold voltage tuning region (if provided), and the P-well. In practice, the screening region is doped to have a concentration between $1 \times 10^{18}$ and $1 \times 10^{20}$ atoms/cm$^3$. In certain embodiments, dopant migration resistant layers of carbon, germanium, or the like can be applied above screening region to prevent dopant migration into the threshold voltage tuning region.

In operation, when a predetermined voltage greater than the threshold voltage is applied to the conductive gate, a deeply depleted region is formed between the gate stack and the screening region. Below the conductive gate the deeply depleted region typically extends downward into the screening region, although in certain highly doped embodiments the deeply depleted region may terminate in the threshold voltage tuning region, if provided. As will be appreciated, the exact depth below the conductive gate of the depletion region is determined by a number of factors that can be adjusted by design of the FET. For example, the depletion region depth may be determined by spatial positioning and absolute or relative dopant concentration of other elements of the FET. For instance, the FET may have a channel defined between a source region and a drain region and below a gate having a gate length $L_G$. DDC depth ($X_d$) may be set to be larger than half of the gate length, possibly by a factor of half of the gate length, or fractions thereabout. In one example, this DDC depth may be set at around or about equal to one-half the channel length, which in operation allows for precise setting of the threshold voltage even at low operating voltages below one volt. Depending on the requirements of a particular application, different depths may provide different beneficial results. Given this disclosure, it will be understood that different DDC depths are possible in different applications, different device geometries, and various parameters of particular designs. Depending on the parameters of a particular application, different region thicknesses, dopant concentrations, and operating conditions used in forming the DDC transistor may provide different beneficial results.

For example, according to another embodiment, the depletion depth can be maintained from ⅓ the gate length to a depth about equal to the gate length. However, as those skilled in the art will appreciate, if structure and operation of the transistor are such that the depletion depth becomes smaller than one-half the gate length, the performance of the device in terms of power consumption will degrade gradually, and the benefits of the DDC will diminish. The device can still achieve modest improvement over the conventional device when the depletion depth, $X_d$ is between ⅓ and ½ the gate length, such as, for example, a DDC transistor having a depletion depth below the gate set to be approximately $0.4 \times L_G$. In this example, a suitable thickness range for the screening region is between 5 to 50 nm with a dopant concentration ranging from $1 \times 10^{18}$ to $1 \times 10^{20}$ atoms/cm$^3$. A suitable thickness range for the threshold voltage tuning region is between 5 to 50 nm with a dopant concentration ranging from $5 \times 10^{17}$ to $2 \times 10^{19}$ atoms/cm$^3$. The undoped channel region is chosen to be deep enough to meet the constraint of $X_d > \frac{1}{2} \times L_G$ and has a concentration less than $5 \times 10^{17}$ atoms/cm$^3$.

In effect, providing a deeply depleted region for a DDC transistor can allow for significantly tightening the tolerances for setting the threshold voltages in a circuit with multiple transistors and related devices, and can further reduce the variation due to RDF. The result is a more predictable and reliable threshold voltage that can be set across multiple devices in an integrated circuit. This benefit can be used to reduce power in a device or system, and can lead to better overall performance.

One other benefit potentially enabled by this embodiment is an adjustable threshold voltage, which can be statically set or varied dynamically during the operation of a device or system configured with one or more of the described transistor structures. Also illustrated in FIG. 2A, a bias voltage can be applied across the transistor source 104 and to an oppositely charged dopant material 126 connected to P-well 114. Conventional circuits are typically biased to a supply voltage, so that current can flow from the source to the drain when an operating voltage is applied to the gate. While the use of adjustable body biasing to dynamically set threshold voltage has been proposed previously, it has generally not proven practical because it tends to induce significant chip area penalties, thus inhibiting the level of on-chip integration. According to this embodiment, a circuit may be configured to vary the threshold voltage of a transistor (or group of transistors if they share a common well) by changing the bias voltage applied to the well, whether they are configured within one integrated circuit or system or in separate circuits. As described in further detail below, the ability to reliably control the threshold voltage within a close range, together with the ability to reliably and dynamically vary the threshold voltage during operation with reduced chip area penalty, leads to a device or system that can dynamically change the operating modes of a transistor or group of transistors within a device or system.

Figure 3:
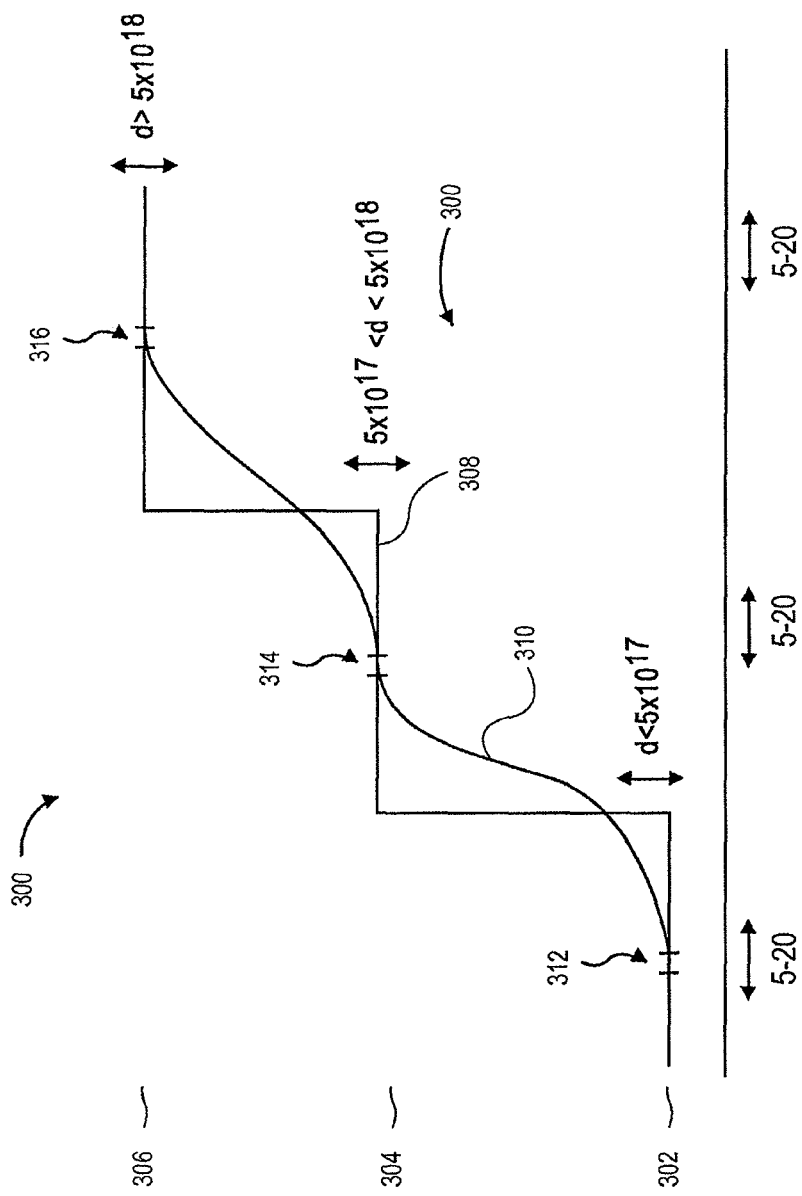
FIG. 3 shows a graph of dopant concentration versus channel depth according to one embodiment.

FIG. 3 shows a graph 300 of dopant atom concentration versus channel depth below a gate dielectric to illustrate a range of dopant concentrations for various ranges of depths in a channel according one embodiment. There are two curves shown, a more practical curve 308, and also an ideal curve 310. As can be seen, there are three levels represented: the channel region in the first 5-20 nm, the threshold voltage tuning region in the next 5-20 nanometers from the channel region, and the screening region in the next 5-20 nanometers from the threshold voltage tuning region. The concentrations at the different levels each reach a certain level 312, 314, 316, possibly but not necessarily an inflection point in the graph at their respective concentration level, and these correspond to certain dopant concentration levels 302 with the channel dopant concentration "d" at less than $5 \times 10^{17}$, 304 with the threshold voltage tuning region concentration "d" between $5 \times 10^{17}$ and $5 \times 10^{18}$, and 306 with the screening region dopant concentration greater than $5 \times 10^{18}$ atoms/cm$^3$. According to some embodiments, within these dopant concentration ranges, certain optimal benefits in a nanoscale FET supporting operation of a deeply depleted region can be realized.

A dopant profile according to various embodiments is defined such that three regions occur. The three regions are defined in Table 1, with Region 1 corresponding to the channel region located near a gate dielectric, Region 2 corresponding to the threshold voltage tuning region, and Region 3 corresponding to the screening layer, and where $L_G$ is the gate length. As will be understood, gate length is substantially equal to the channel length, and $t_1$, $t_2$ and $T_3$ are the respective thicknesses of the three regions. Each of these regions can be expressed via a representative thickness and a dopant dose measured as numbers of atoms per cubic centimeter. The values of these thickness and doses are given in Table 1.

TABLE 1

|  | Region 1 | Region 2 | Region 3 |
|---|---|---|---|
| Dose Range | Dose < $5 \times 10^{17}$ | $5 \times 10 <$ Dose $< 2 \times 10^{19}$ | Dose > $2 \times 10^{18}$ |
| Layer Thickness | $\frac{t_1}{L_G} \leq \frac{1}{2}$ | $\frac{t_2}{L_G} \leq 1$ | $\frac{t_3}{L_G} \geq \frac{1}{10}$ |

TABLE 2

| Node (nm) | 90 | 65 | 45 | 32 | 22 | 15 |
|---|---|---|---|---|---|---|
| $L_G$ (nm) | 60 | 50 | 40 | 35 | 30 | 25 |
| Channel Region Max Thickness - $t_1$ (nm) | 30 | 25 | 20 | 18 | 15 | 13 |
| $V_T$ Tuning Region Max Thickness - $t_2$ (nm) | 60 | 50 | 40 | 35 | 30 | 25 |
| Screening Region Min Thickness - $t_3$ (nm) | 60 | 50 | 40 | 35 | 30 | 25 |

The layer thicknesses are process node dependent, with their respective thicknesses $t_1$, $t_2$ and $t_3$ being related to the gate length ($L_G$) of the device and process node of interest. Table 2 contains representative numbers for 90 nm to 15 nm process nodes illustrating the effect of scaling $L_G$ on the thickness requirements of the regions.

Figure 4:
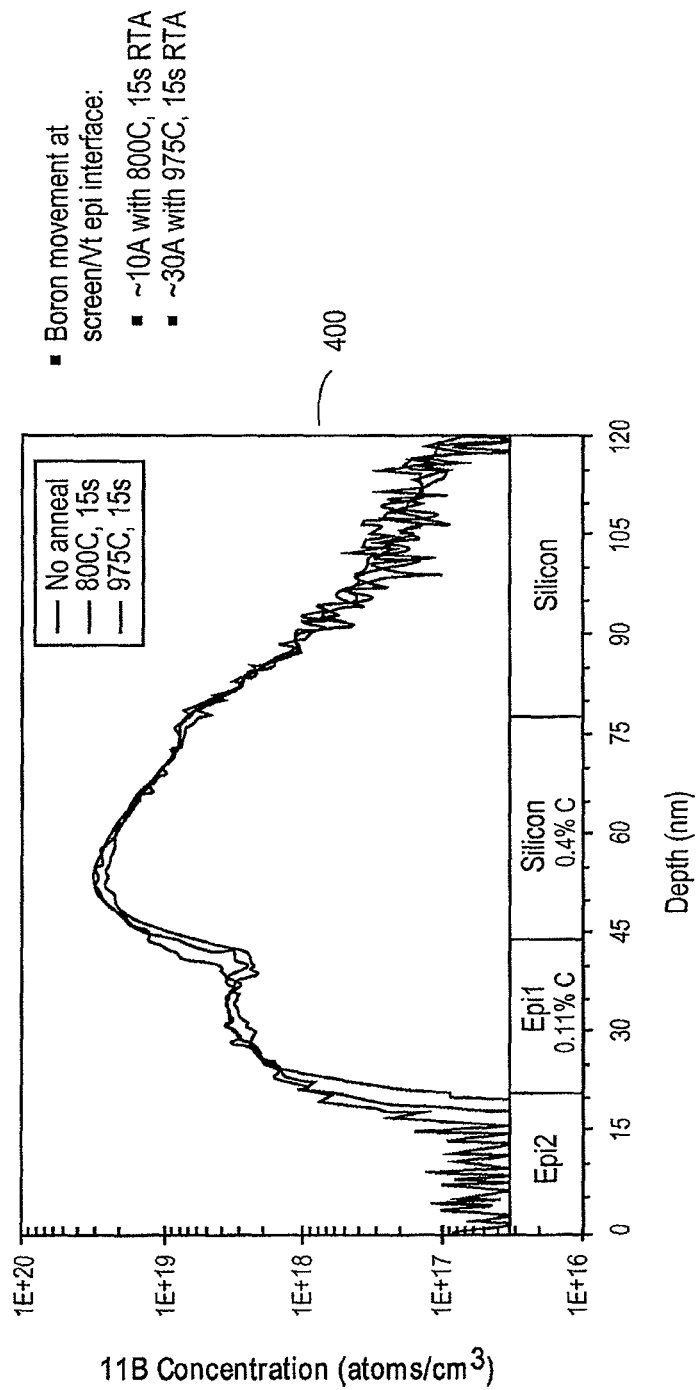
FIG. 4 shows a graph of variations of dopant concentration versus device depth according to one embodiment.

FIG. 4 is a graph 400 of variations in different boron dopant atoms/cm$^3$ according to device depth in an example implementation. In this example, the dopant concentration is lowest (less than $1 \times 10^{17}$) at the low dopant region near the transistor gate at depths from zero to approximately 20 nanometers (nm), and is a bit higher at the threshold voltage tuning region (approximately $5 \times 10^{18}$) from approximately 20 nm to 45 nm. This example peaks out even higher (approximately $5 \times 10^{19}$) at the screening region from approximately 45 nm to 75 nm. This particular example shows three different simulated devices that are shown as superimposed graphs done with different processes. One uses a 15 second anneal at 975° C., one uses a 15 second anneal at 800° C., and the third uses no anneal at all. The graph results are substantially similar, illustrating the reliability of the dopant concentrations in the different process environments. Those skilled in the art will understand that different design parameters and applications may call for different variations or numbers of regions having different doping concentrations.

Figure 5:
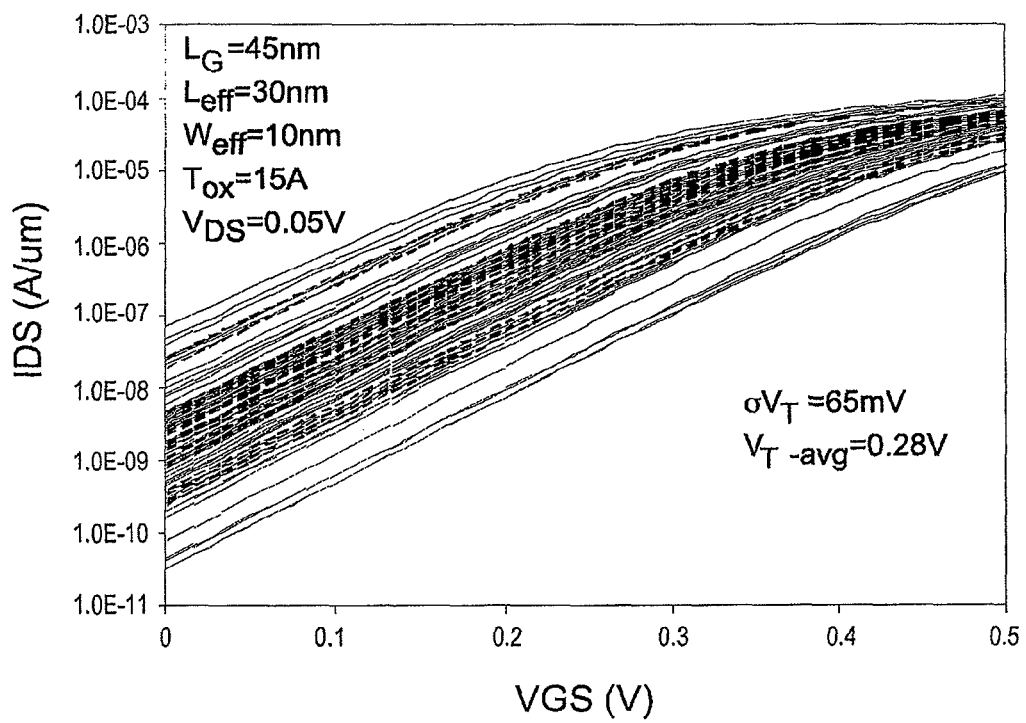
FIG. 5 shows an example of a statistical rendering of different threshold voltages from various devices plotted against supply voltages according to an embodiment.

In practice, designers and manufacturers gather statistical data from mathematical models and sample measurements from actual circuits to determine the variance of threshold voltages of a circuit design. The voltage differential mismatch between transistors, whether derived from manufacturing variations or RDFs, is determined as $\sigma V_T$. One such example of a statistical rendering of different threshold voltages from various devices plotted against supply voltages is illustrated in FIG. 5. In order for the circuit as a whole to operate, the operating voltage $V_{DD}$ must be chosen in view of $\sigma V_T$. Generally the larger the variance, the higher the $\sigma V_T$, such that the operating voltage $V_{DD}$ must be set higher for the transistor to operate properly. With multiple device implemented across a circuit, $V_{DD}$ may need to be set at the highest overall value in order for the circuit to operate properly.

Figure 6:
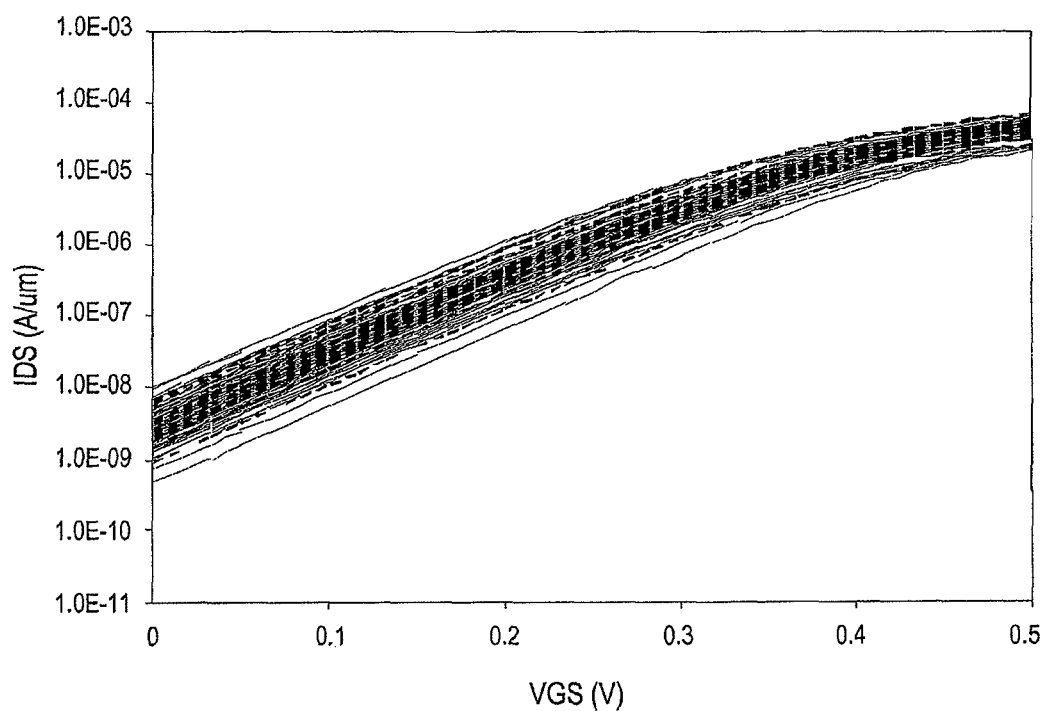
FIG. 6 illustrate an example of improved $\sigma V_T$ according to one embodiment.

A structure and method of its production are provided that reduces $\sigma V_T$, reducing the range of variance of the threshold voltage of the transistors across the integrated circuit. With reduced $\sigma V_T$, the static value of $V_T$ can be set more precisely and can even be varied in response to a changing bias voltage. One example of improved $\sigma V_T$ according to one embodiment is reflected in FIG. 6, showing an improved range of threshold voltage renderings evidenced by a lower variance in the threshold voltages taken from different devices. The threshold voltage for nominally identical devices across a circuit may be more accurately set with decreased $\sigma V_T$, thus allowing the device to operate using a lower operating voltage $V_{DD}$ and, therefore, consume less power. Moreover, with more headroom to vary $V_T$ for a given transistor or group of transistors, devices can be operated at different modes corresponding to different bias voltages for particular modes. This may add functionality to many devices and systems and may particularly benefit devices where fine control of device power modes is useful.

FIG. 7A shows an example of a transistor 700 made according to conventional processes and structures. This example is illustrated as an N-type FET, having a source 702, a drain 704 and a gate stack including conductive gate 706 and insulating layer 708. Typically, the gate 706 is formed from highly doped polysilicon and the insulating layer is formed of a gate dielectric such as silicon oxide. The gate stack 706 electrically controls current flow between the source 702 and the drain 704. Channel 710 typically contains dopants and extends down to the P-well 712, and may wrap around both the source and the drain. The channel depth $X_d$ 714 is the distance from the gate dielectric 708 down to the bottom of the channel 720. In operation, there are multiple electric field lines such as E 716 that extend down this channel depth 714 and bend toward the source 702 and drain 704. These field lines are typically not straight as shown in the Figure, but can bend as a result of the device construction and operation. Mobile carriers such as electrons e⁻ 718 travel between the source 702 and drain 704 through electric fields E 716. Gate spacers 724 and SDEs 722 are also illustrated.

In contrast, FIG. 7B shows an embodiment of a DDC transistor 700' that operates with a significantly deeper depletion region as compared to the conventional device 700 of FIG. 7A. This provides the features and benefits of improved mobility without the use of stress inducing layers, and improved threshold voltage setting. This example is illustrated as an N-type FET, having a source 702', a drain 704' and a gate 706'. The transistor includes a gate 706' formed on gate dielectric 708' that, when gate to source voltage is biased to greater than a threshold voltage, creates a depletion region 710', and controls current flow between the source 702' and drain 704'. Depletion region 710' extends down to the screening layer 720' implanted as a layer in P-well 712', and may wrap around both the source 702' and the drain 704' as seen in the Figure. Gate spacers 724' 720' and SDEs 722' are also illustrated. The depletion depth $X_d$' 714' is the distance from the gate dielectric down to screening region 720', and is significantly deeper than the depletion region of the conventional device of FIG. 7A. Unlike the conventional device of FIG. 7A, the screening region 720' in device 700' provides a heavily doped termination for the electric fields such as E 716' that extend down to the screening layer. Given the deeper depletion $X_d$' 714', these field lines are generally longer and straighter than those electric fields E 716 in the conventional structure 700. Similar to the conventional device, when biased, current flows from the drain 704' to source 702', and electrons e⁻ 718' travel between the source 702' to drain 704' through electric fields E 716'. In contrast to conventional devices, however, the electrons flow more freely in across these electric fields E 716', providing improved current flow and better performance. Also, this construction improves $\sigma V_T$ by reducing the short channel effects, reducing the variations caused by random dopant fluctuation.

Referring to FIG. 8A, a FET 800 is shown that corresponds to the conventional structure illustrated in FIG. 7A. Leakage occurs at various locations throughout the transistor structure, resulting in power loss even when the FET is not actively switching. FIG. 8A particularly illustrates the concept of leakage that occurs between the source 702 and the well 712. As positive ions 802 reside in the well 712, they tend to migrate to holes 804 via leakage path $X_j$ 806. With a relatively short path 806, leakage is prevalent in conventional nanoscale devices.

FIG. 8B shows a FET 800' that operates with a deep depletion region similar to that illustrated in FIG. 7B, and further illustrates the concept of leakage that occurs between the source 702' and the well 712'. Positive ions 802' reside in the well 712'. However, with the novel construction having a deeper well, the path $X_j$ 806' is significantly longer, and they tend to migrate less to holes 804' via leakage path $X_j$ "806'. With a relatively longer path 806', leakage is less prevalent here compared to conventional devices. Also, given the low electric field E 716' in the novel structure, and also leakage at the gate 706' and insulator 708', the ability to excite electrons is greatly reduced. The result is substantial reduction in leakage at the gate. Thus, the novel structure with a DDC provides significant reductions in leakage that occur in many locations of conventional devices.

Figure 9:
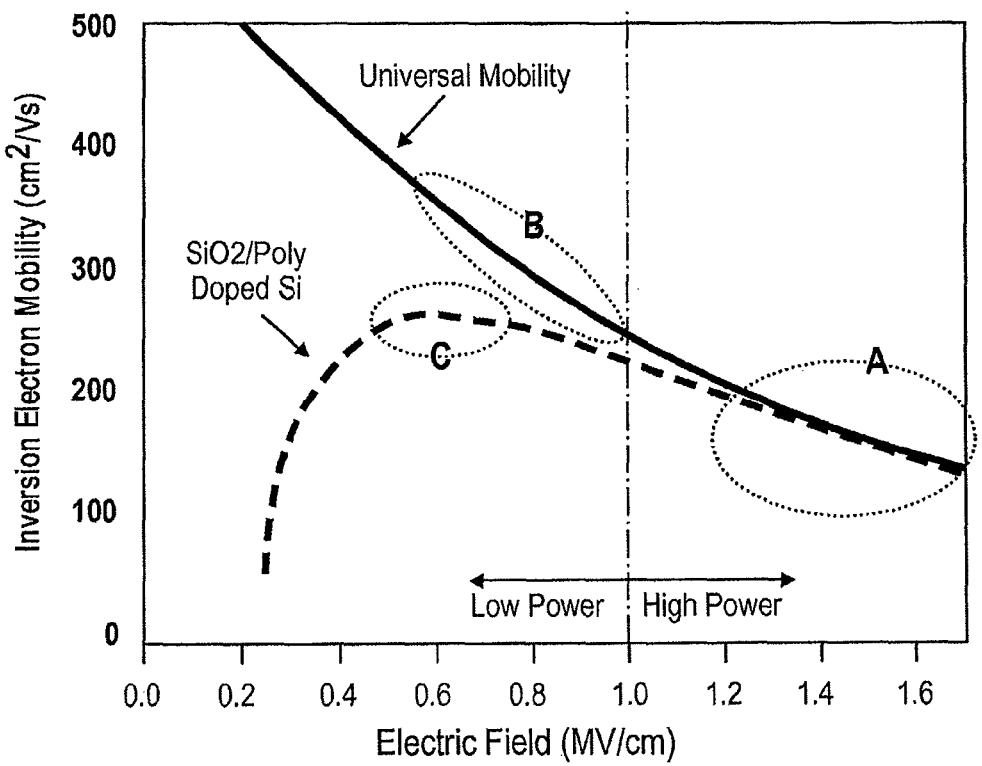
FIG. 9 shows an example of a universal mobility curve for NMOS devices.

DDC transistors also preferably offer improved carrier mobility, a feature of great interest in the industry. Mobility is a quantitative measure of the ability of mobile carriers to move from a source to a drain across a transistor's channel when a voltage greater than the threshold voltage $V_T$ is applied to the gate. One goal of an optimized device is to have electrons or mobile carriers move with minimal hindrance from source to drain, typically in accordance with a relationship between the gate applied electric field and the measured mobility known as a universal mobility curve. This universal mobility curve is a well established relationship seen in MOSFET devices between carrier mobility in an inversion region of a channel and an electric field that induces that inversion region (or inversion charge). FIG. 9 shows this universal curve for NMOS transistors (solid line), although a similar curve exists for PMOS. In this figure, the universal mobility curve for an undoped channel is plotted. Region A corresponds to the mobility/electric field operational regime of typical current state of the art MOSFET transistors and illustrates that these devices operate in the high-power region at a degraded mobility with respect to mobility in low electric field/low power regions.

A second mobility curve (dashed line) is appropriate for nanoscale gate length transistors having highly doped channels (often necessary to compensate for scaling effects) and a proportionally scaled downward gate voltage and consequent lower electric fields. These curves can match at operating conditions supporting high electric fields in the channel, because mobility is dominated by surface roughness associated with an interface between a gate dielectric and channel silicon. When operating a transistor at lower gate voltages (and consequent lower electric fields) these two curves diverge due to the presence of dopant atoms and the dominance of channel dopant scattering (commonly called ionized impurity scattering) that act to decrease electron mobility. This can be seen as region C. While low power devices operating with electric fields falling within region C can be constructed, the required high channel doping results in a degradation of mobility due to dopant scattering in the area marked as region A in FIG. 9.

The operation point of a DDC transistor lies along the universal mobility curve as seen as region B in FIG. 9. DDC transistors not only operate in the low power regime with low electric fields, but can also benefit from being a deeply depleted device with substantially low dopant scattering to lower its mobility. A DDC transistor is therefore, in some preferred embodiments, able to achieve up to a 120% mobility enhancement over conventional high power devices.

With these novel structures and methods for creating them, circuits can now be produced and configured with the ability to change $V_T$ dynamically. The structures are preferably configured with a small $\sigma V_T$ compared to conventional devices, giving the devices the ability to have not only a lower nominal threshold voltage $V_T$, and lower operating voltage $V_{DD}$, but also a precisely adjustable $V_T$ that can be varied in response to the bias voltage. In operation, a bias voltage can be placed across a transistor that operates to raise and lower the device's $V_T$. This enables a circuit to statically specify and/or dynamically change modes of operation in an efficient and reliable manner, particularly if the operating voltage $V_{DD}$ is also dynamically controlled. Still further, the adjustment of $V_T$ can be done on one or more transistors, groups of transistors, and different sections or regions of a circuit. This breakthrough enables designers to use generic transistors that can be adjusted to serve different functions in a circuit. Additionally, there are many circuit- and system-level innovations that result from the features and benefits of these integrated circuit structures.

In one embodiment, a semiconductor structure is provided with a DDC having a DDC depth, where a channel is formed between a source region and a drain region. In one example, the DDC depth is at least half as large as the channel length of the device. These structures can operate at lower voltages than conventional devices and are not as limited by effects of RDFs in a device channel. The novel structure can also be fabricated using conventional bulk CMOS processing tools and process steps.

According to one embodiment a channel region of a transistor can be configured with a plurality of regions having different dopant concentrations. In one example, a DDC transistor is constructed such that three distinct regions exist below the gate. From the gate dielectric proceeding deeper into the substrate, these regions include a channel, a threshold voltage adjust region and a screening regions. It will be appreciated by those skilled in the art that different combinations or permutations of these regions may exist.

The channel region is the region where the minority carriers travel from the source to the drain during the operation of the integrated circuit. This constitutes the current flowing through the device. The amount of dopant in this region affects the mobility of the device via impurity scattering. Lower dopant concentration results in higher mobility. Additionally, RDFs also decrease as the dopant concentration decreases. This undoped (low-doped) channel region can allow the DDC transistor to achieve both high-mobility and low RDFs.

The threshold voltage adjust or tuning region allows for complementary dopants, such as an N-type dopant in PMOS and a P-type dopant in NMOS, to be introduced below the channel regions. The introduction of this $V_T$-adjust region, coupled to its proximity to the channel region and the level of dopants, preferably allows the threshold voltage tuning region to alter the depletion region within the channel without directly doping the channel. This depletion control allows the $V_T$ of the device to be altered to achieve the desired result. Additionally, the $V_T$-adjust region can aid in preventing sub-channel punch-through and leakage. In some embodiments this provides improved short channel effects, DIBL and sub-threshold slopes.

In conventional processes, others have addressed different performance metrics of a transistor by changing particular structures and concentrations. For example, gate metal alloys or polysilicons may be used to adjust the doping concentration to improve short channel effects or other parameters. The gate dielectric located under the gate and above the channel may also be adjusted. Other processes also exist that can set the dopant concentrations in or around the channel of a transistor. Unlike these prior attempts to improve short channel effects and other parameters of a device, some of the embodiments described herein not only improve more parameters of a device, they can also improve the accuracy and reliability in setting the threshold voltage for a device. Still further, in some implementations the improved devices can also enable the dynamic control of the threshold voltage of a device for enhanced performance, and also for providing new features and operations of a device or system when employed.

In one embodiment, a transistor device is provided with a monotonically increasing dopant concentration from the top of the channel near the gate and down into the channel. In one example, there is a linear increase in dopants proceeding from the gate dielectric. This may be accomplished by forming a screening region at a distance from the gate, and having a depleted region between the screening region and the gate. This depleted region may take on different forms, including one or more regions of different dopant concentrations. These regions address different improvements in transistor devices, including improving the reliability of setting a particular threshold voltage, improving mobility in the transistor channel, and enabling the dynamic adjustment of the threshold voltage to improve and expand different operating modes of a device. These dopant concentrations may be expressed in a graph of concentrations, such as that illustrated in FIG. 4 and described above with respect to the depth of the channel of a device, beginning with the top of the structure near the gate and through the different layers down through the screening layer.

The depleted channel region provides an area for electrons to freely move form a source to a drain of a transistor, thus improving mobility and overall performance. The threshold voltage tuning region is used in conjunction with the screening region to set the nominal intrinsic threshold voltage of the device. The screening region is a highly doped region which increases the body coefficient of the FET device. The higher body coefficient allows the body bias to have a larger effect in dynamically changing the threshold voltage of the FET. These three regions can be used in unison to achieve multiple specialized devices. Multiple combinations of two or three of the regions can be used to achieve various design benefits. For example, all the regions can be used with poly, band edge metal, and off-band edge metal gates to achieve a low power device with various intrinsic $V_T$ values (achieved by threshold voltage adjust doping) and dynamic modes of operations (via body effect).

The channel and screening regions can be used in conjunction with off band edge metal gate stacks to achieve ultra-low power devices (where the off band edge metal serves to increase the threshold voltage without the aid of the threshold voltage adjust region). The channel and screening regions can alternatively be used in conjunction with dual work function metal gate stacks to achieve ultra-low power devices. In addition, the formation of these regions can be achieved in multiple ways. In some implementations, a single epitaxial flow can be used, whereby in-situ doping controlled and modulated during growth achieves the desired profile without additional implants, and where multiple implants followed by an undoped epitaxial region can be used to achieve the profile. Alternatively, a dual epitaxial flow with implants similar to the desired concentrations can be used. Or, a multiple epitaxial-flow consisting of any number of combinations of epitaxial and implants can be used to achieve the desired profile. Such variations would not, however, depart from the spirit and scope of the claims appended hereto.

In another example of a device, in addition to the DDC region formed on a substrate, an oxide region or other gate insulator may be formed on the top of the substrate over the channel region. The device may include a metal gate region formed on the oxide region. The resulting device in this example is a transistor that has dynamically controllable threshold voltage, while still being insensitive to RDF in the channel region. In this example, in operation the DDC region has a very low $\sigma V_T$, while the low $V_{DD}$ keeps leakage in deep depletion regions low. In addition, an implant may be provided to enable legacy devices requiring transistor operation at one volt or above.

In the examples below, various device configurations, systems incorporating such devices, and methods of making such devices and systems are discussed and further illustrated in the figures. These examples are illustrated in a diagrammatic manner that is well understood by those skilled in the art of such devices, systems, and the methods of making them. These examples describe and illustrate details of the devices along with discussion of the feasibility and possible operation characteristics and performance of the underlying systems.

Figure 10:
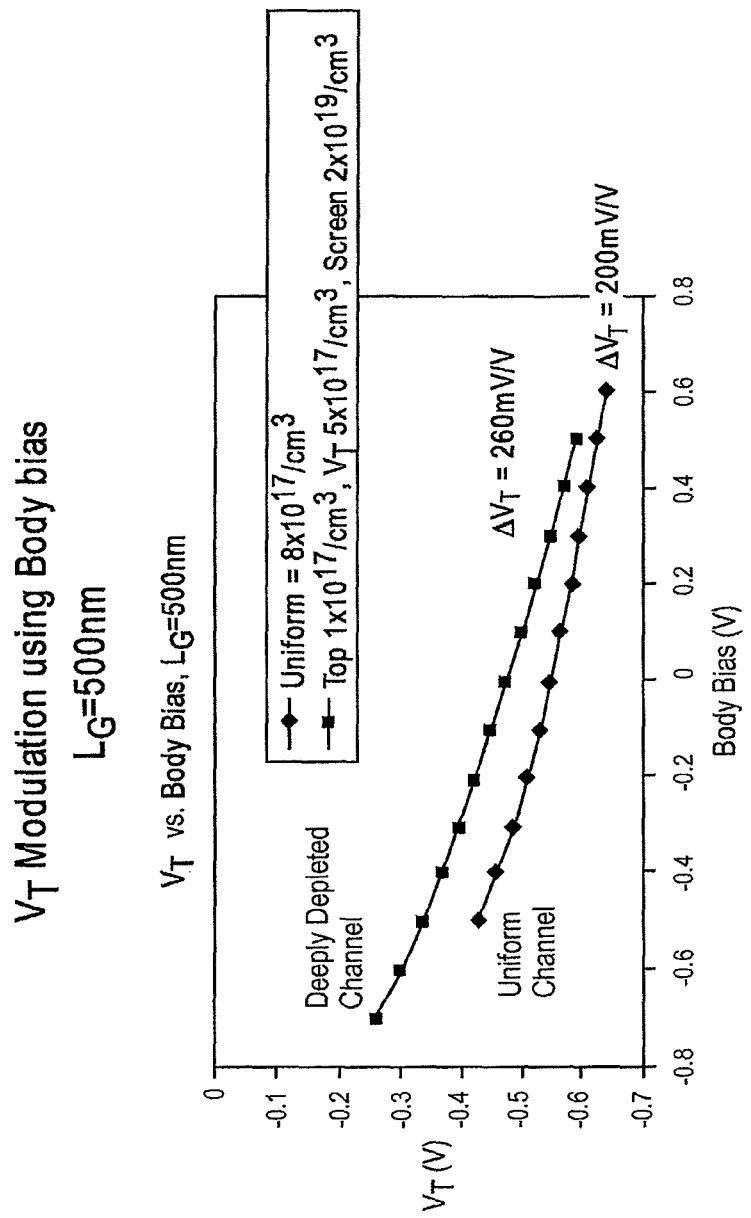
FIG. 10 shows an example of a comparison between the threshold voltage and body bias of a DDC structure versus a uniform channel.
Figure 11:
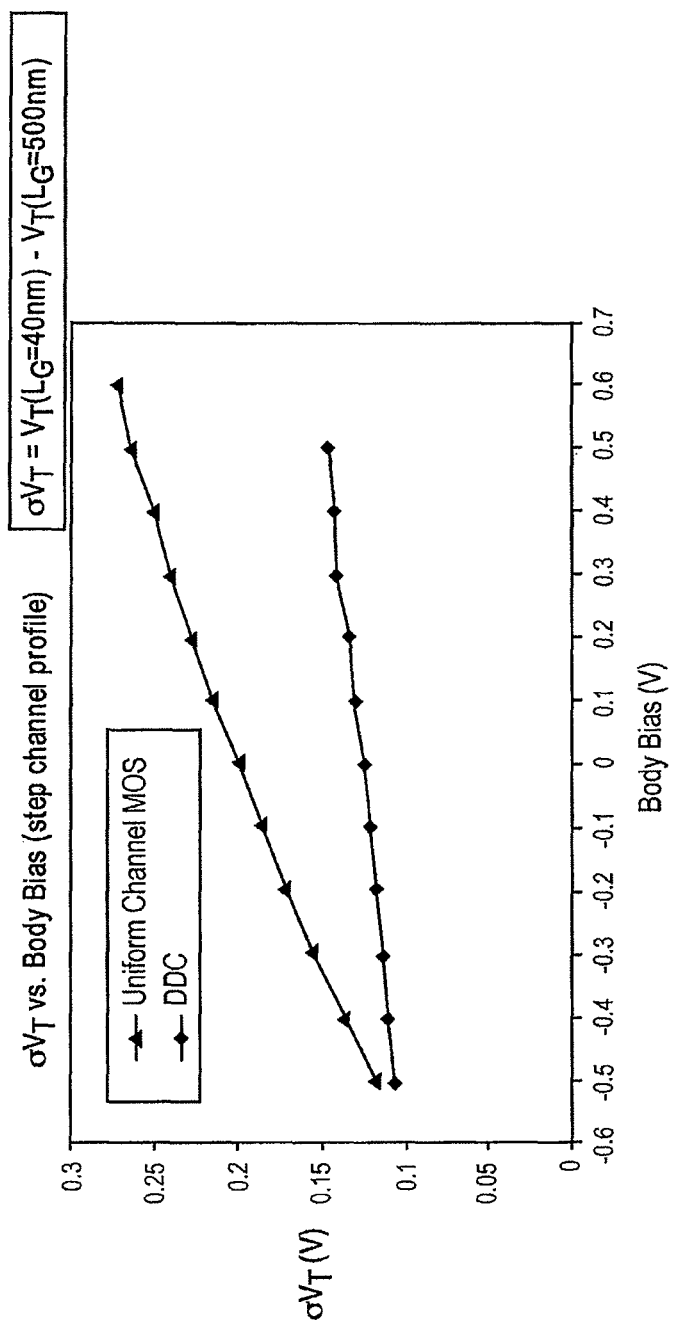
FIG. 11 shows a comparison of $\sigma V_T$ versus body bias voltage of a DDC structure versus a uniform channel.

Further comparisons to conventional structures are illustrated in FIGS. 10 and 11. FIG. 10 illustrates an example comparison between the threshold voltage and body bias of a DDC transistor having low doped channel (about $1 \times 10^{17}$ atoms/cm$^3$) versus a similar sized conventional transistor having uniformly doped channel that does not have a screening region. As can be seen, even though a DDC transistor does not have significant channel dopants that are ordinarily required for a strong body coefficient, the threshold voltage modulation by body bias in a DDC is still comparable to a uniformly doped channel MOS.

Thus, in particular embodiments DDC structures can provide comparable benefits in a short channel device that is currently only realized in long channel devices, which are not practical replacements for short channel devices. Referring to FIG. 11, a comparison of $\sigma V_T$ versus body bias voltage is shown for a uniform channel MOS device compared to an example of a DDC device. Significant degradation is evident for the threshold voltage of the short channel devices versus long channel devices. In this DDC device, there is significantly less degradation of threshold voltage with increased body bias voltage. This reduction is facilitated by the highly doped screening region that greatly reduces short channel effects.

Figure 12:
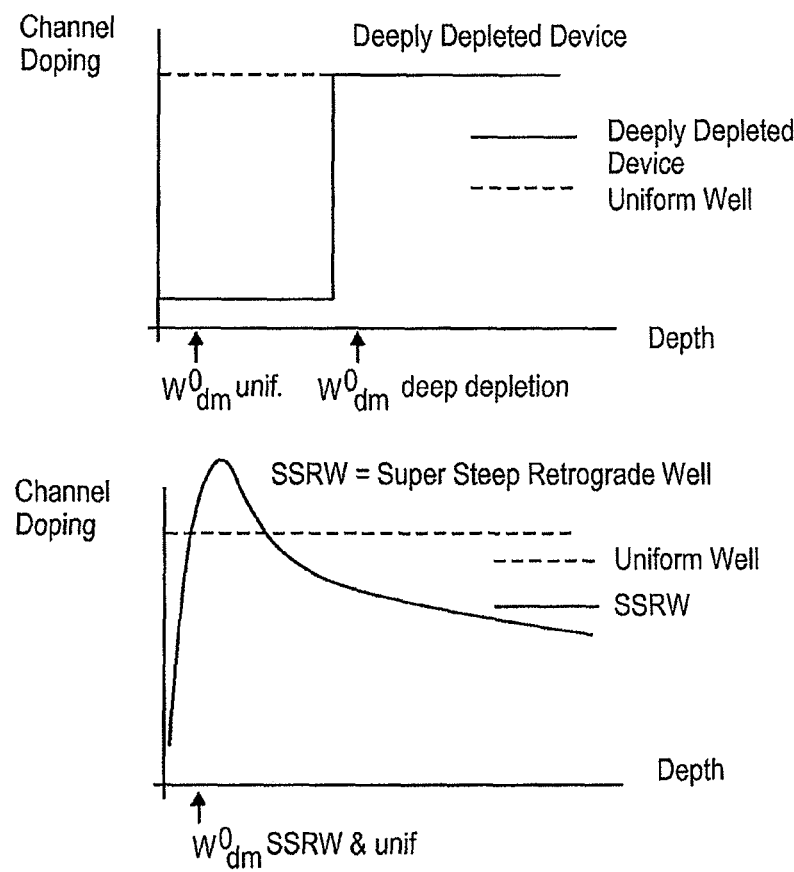
FIG. 12 shows an example of a comparison between the profile of a novel DDC structure and that of conventional bulk CMOS with SSRW.

As discussed in the background, certain transistors can be formed to have a channel layer doped according to a Super Steep Retrogradient Well (SSRW) profile. This technique uses a special doping profile to form a heavily doped region beneath a lightly doped channel. Referring to FIG. 12, a comparison between the profile of an example of a DDC structure and a conventional SSRW is shown. As can be seen, the SSRW has a very high dopant concentration adjacent to the channel, near the transistor gate dielectric that defines the top of the channel (not shown). Such high doping concentrations located near the channel and gate dielectric typically results in poor leakage performance in conventional devices, and there are severe difficulties in scaling this approach to nanoscale gate length transistors. Thus, it generally does not provide an adequate commercial solution to the overall need to reduce power and improve performance in electronic devices. Embodiments of DDC transistors can include a channel that is deeply depleted, and also a screening layer that is heavily doped and separated from the channel. Such structures can provide notable improvements to circuit performance, and can be simpler to produce than circuits implementing SSRW.

Figure 13:
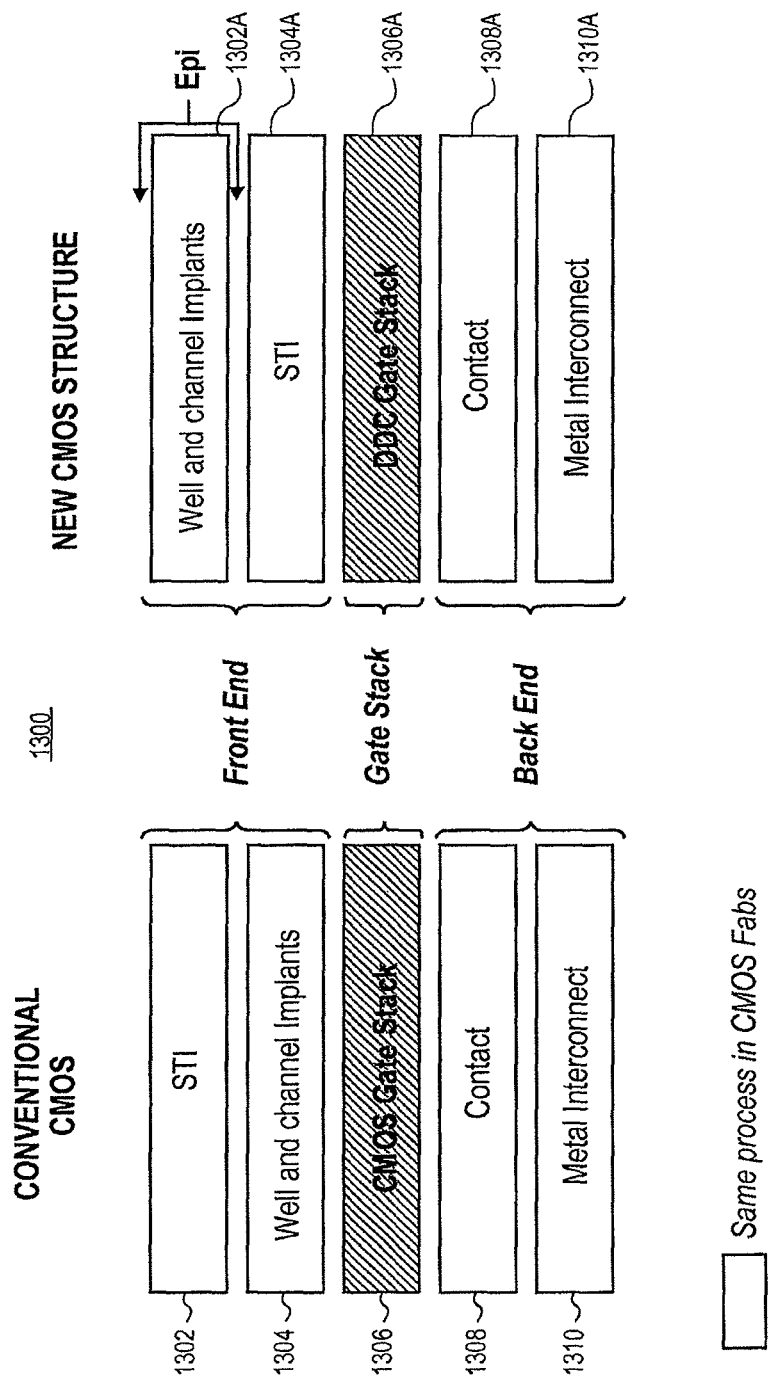
FIG. 13 shows an example of a comparison of conventional CMOS devices with that of structures configured according to embodiments disclosed herein.

Many conventional CMOS fabrication processes can be used to fabricate DDC transistors. FIG. 13 is a diagrammatic view of a comparison 1300 of conventional CMOS processes (CMOS) for fabricating conventional devices with that of structures configured according to the embodiments disclosed herein. In one embodiment of a novel CMOS device, processing steps related to shallow trench isolation (ST!) 1302, 1302A, well and channel implants 1304, 1304A, contact 1308, 1308A, and metal interconnect 1310, 1310A can be standard. Only the conventional CMOS Gate Stack process 1306 differs from the gate stack of the improved structure 1306A. This offers significant advantages for introducing the novel CMOS structures, such as the DDC devices for example. Primarily, this avoids the requirement of developing risky or costly new processing steps for fabricating a new device. Therefore, the existing manufacturing processes and associated IP libraries can be reused, saving cost and allowing a manufacturer to bring such a novel and advanced device to market faster.

DDC transistor process according to the example in FIG. 13 will create an undoped epitaxial silicon region on top of highly doped N-type and P-type regions to create a DDC doping profile. The undoped epitaxial silicon region thickness can, in some implementations, be a significant factor in device performance. In another example, dual epitaxial silicon regions are used for providing a final gate stack with high, medium and low doping (or no doping). Alternatively one epitaxial silicon region for a final stack with one high doping region near the substrate level can be grown, followed by medium to low doping of epitaxially grown layer between the gate and the high doped screening region. To prevent dopant migration or diffusion between layers, in some implementations various dopant migration resistant techniques or layers can be employed. For example, in P-type epitaxial silicon, Boron (B) diffusion can be reduced using carbon doping. However, in N-type epitaxial silicon, the carbon may have a negative impact on As doping. The carbon could be located throughout the silicon epitaxy or confined to a thin region at each interface. It may be possible to use in situ doped carbon or implanted carbon. If in situ doped carbon is used, carbon may be present in both N-type and P-type. If carbon is implanted, in some embodiments it can be used in P-type only.

DDC transistors can be formed using available bulk CMOS processing technology, including techniques for depositing dopant migration resistant layers, advanced epitaxial layer growth, ALD, or advanced CVD and PVD, or annealing that are all available on advanced integrated circuit process node technologies, such as those at 65 nm, 45 nm, 32 nm, and 22 nm. While these process nodes generally have a low thermal budget for STI isolation, gate processing, and anneals they are still suitable for formation of DDC transistors.

FIGS. 14A through 14I show a process flow for fabricating a device having a channel with a DDC doping profile. These figures illustrate an example of a fabrication of two devices to show how an NMOS and a PMOS transistor can each be configured with a DDC and a screening region to provide the advanced features and operations of a novel DDC transistor and device. The structures in each step are shown in a progressive manner to illustrate this sample process of forming the two transistor devices. Alternatively, other process flows may be used to fabricate the DDC device, and this particular process and related steps are shown for illustration. The process is described in terms of "regions" that are formed, deposited or otherwise made to create the transistor structure, but is intended to also include regions of different shapes, sizes, depths, widths and heights, and different forms or contours or as layers.

Figure 14A:
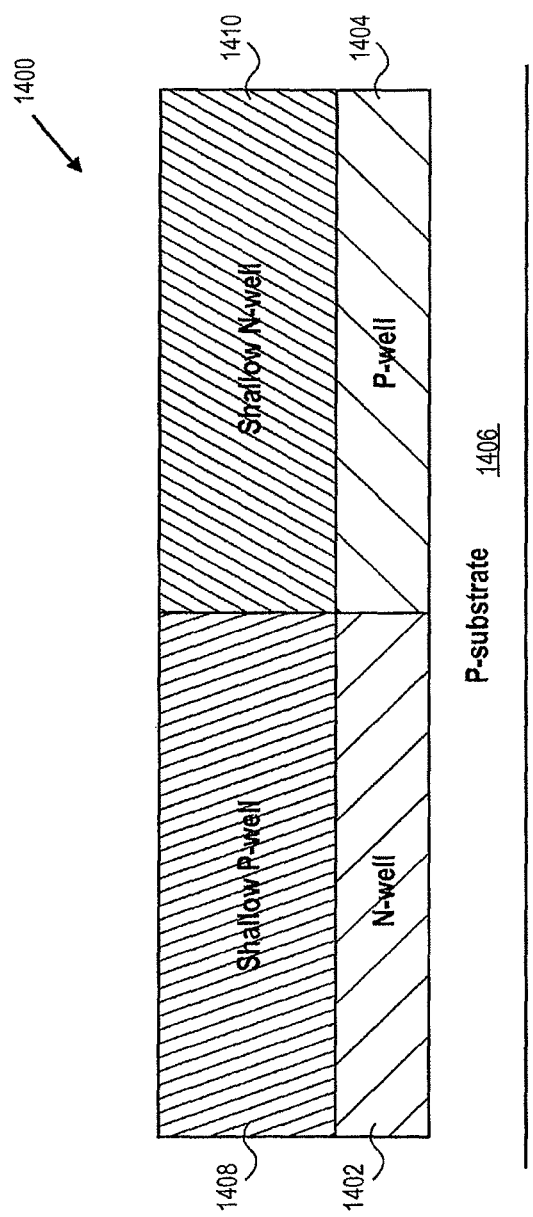
FIGS. 14A-I show examples of a process flow for fabricating a device having a channel with a DDC doping profile.

First, referring to FIG. 14A, the structure 1400 begins with a substrate, for example a P-type substrate 1406. An NMOS or a PMOS device can be created on the P-type substrate. For simplicity and for describing the possible embodiments and examples in these and other figures, this example of the process flow of a DDC device is described for the example of an NMOS and a PMOS device together with shallow and partial trench isolations to separate certain structures. Nevertheless, the corresponding flow associated with the other disclosed structures or devices would be readily understood. Also, though not shown, these processes can be carried out with various techniques known in the art, such as masking for use in forming structures side by side as different regions and regions formed on top of each other.

An optional N-well implantation 1402 and a P-well implantation 1404 are formed on the p-substrate 1406. Then, a shallow P-well implantation 1408 is formed over N-well 1402, and a shallow N-well implantation 1410 is formed over P-well 1404. These different regions may be formed by first forming a pad oxide onto the P-substrate 1406, followed by a first N-well implant of N-well 1402 using a photo resist. The P-well 1404 may be implanted with another photo resist. The shallow N-well 1410 may be formed by implant together with another photo resist. The shallow P-well 1408 may then be implanted together with another photo resist. The process may then be followed by an anneal process.

Figure 14B:
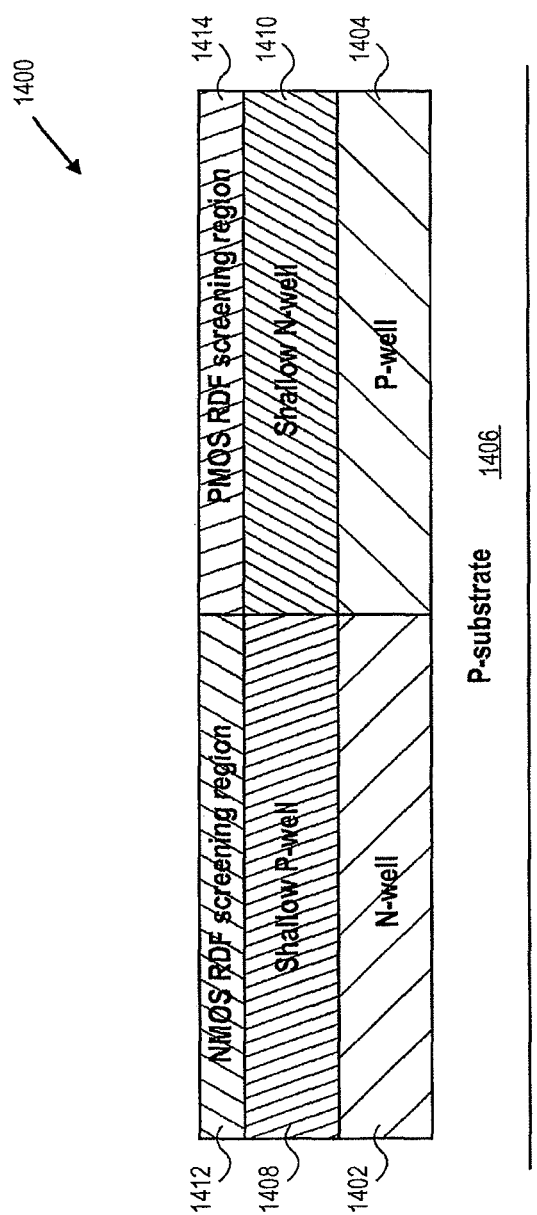

Proceeding to FIG. 14B, the process continues where an NMOS RDF screening region 1412 is formed on the shallow P-well 1408. According to this embodiment, the NMOS RDF region 1412 is a screening region of high dopant concentration such as previously described for reducing RDF and providing the many benefits of improved threshold voltage setting and reliability as well as enabling the dynamic adjustment of the threshold voltage of transistors. This screening region may be formed as an RDF screening implant using another photo resist. A PMOS RDF screening region 1414 is formed over the shallow N-well 1410. This region may be formed as a PMOS RDF screening implant using another photo resist.

Figure 14C:
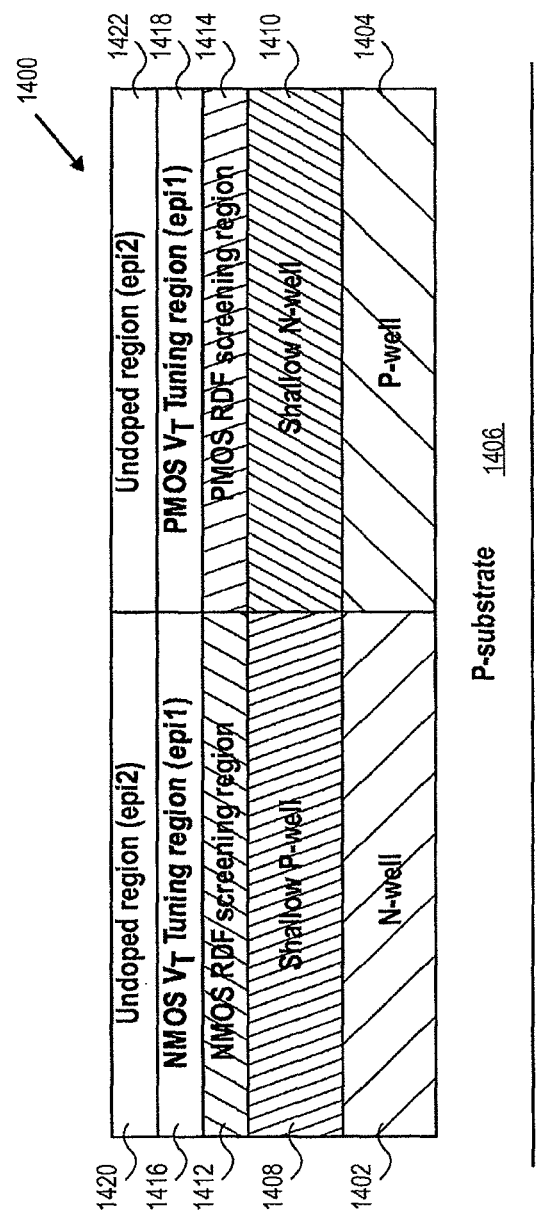

Referring next to FIG. 14C, after an initial oxide removal, an NMOS threshold voltage tuning region 1416 is formed on the screening region 1412 using a photo resist, where the method of epitaxial growth or other similar techniques may be used to deposit this threshold voltage tuning region. Similarly, a PMOS threshold voltage tuning region 1418 is formed over the PMOS RDF screening region 1414 using photo resist. Undoped regions or low doped regions 1420, 1422 are then deposited on each of the threshold voltage tuning regions, which are doped over the NMOS $V_T$ tuning region 1416 and PMOS $V_T$ tuning region 1418. The method of epitaxial growth or other similar techniques may be used to deposit these un-doped or low-doped regions. Through the above steps, a channel complying with DDC is formed. While two epitaxial regions are used in these examples to create the desired DDC profile for each transistor, a single epitaxial region may also be used on each to create a DDC device instead.

The above process flow prepares the device by creating a channel for subsequent processing to make two transistors or other more complicated circuitry. However, the following process flow discloses examples of remaining steps for creating an n-channel and a p-channel transistor as illustrated in FIGS. 14D through 14E.

Figure 14D:
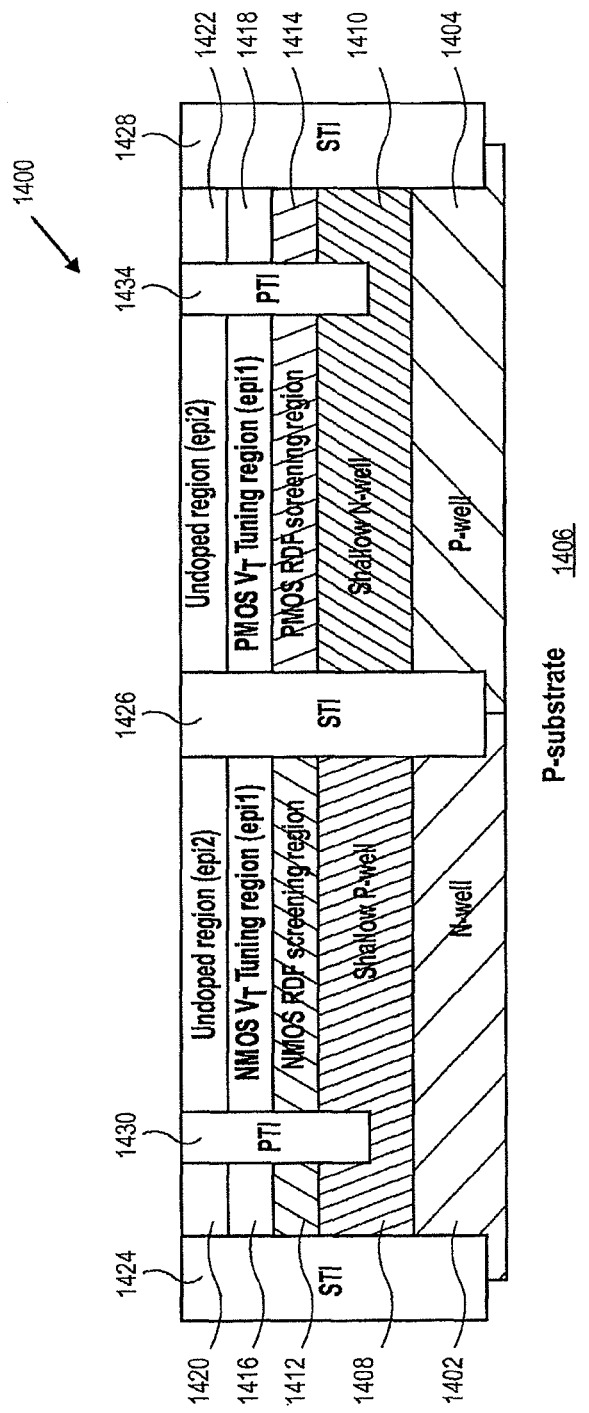
Figure 14E:
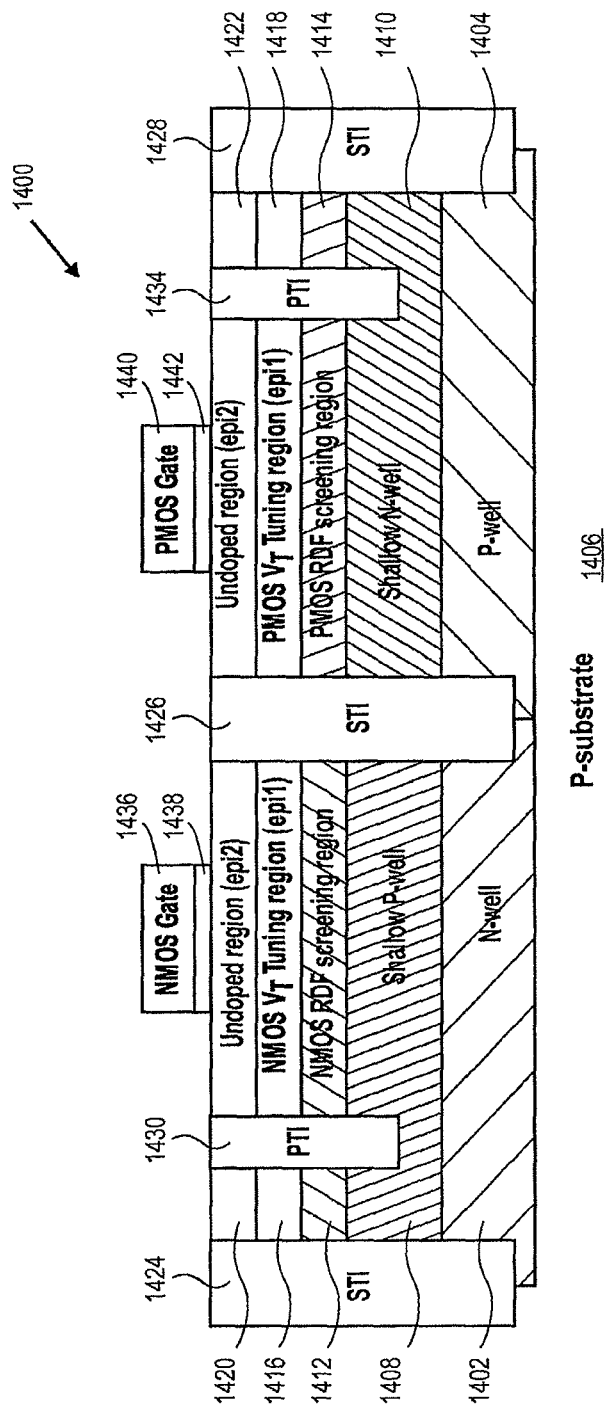

Referring to FIG. 14D, a shallow Trench Isolation (STI) process is then applied to form an STI transistor boundary 1424 by isolating the transistors from neighboring transistors. Here the depth of each STI 1424, 1426, and 1428 is set properly so that the STI will go into the P-well. As can be seen, the STI trenches extend below each of the shallow P-well 1408 and shallow N-well 1410. This allows for improved isolation between transistors.

In addition, Partial Trench Isolation (PTI) 1430, 1434 may be optionally applied to create an area where a well tap can be connected. The depth of the PTIs 1430, 1434 are set so that the PTIs will go partially into the shallow P-well. An insulator such as an oxide region 1438, 1442 is then deposited in the area where a channel will be formed, as shown in FIG. 14E. Here, the silicon dioxide may be used as an insulator, but other types of insulators may also be used. Gate electrodes 1436, 1440 are then attached to the respective gate insulators to enable the supply gate voltage during operation.

Figure 14F:
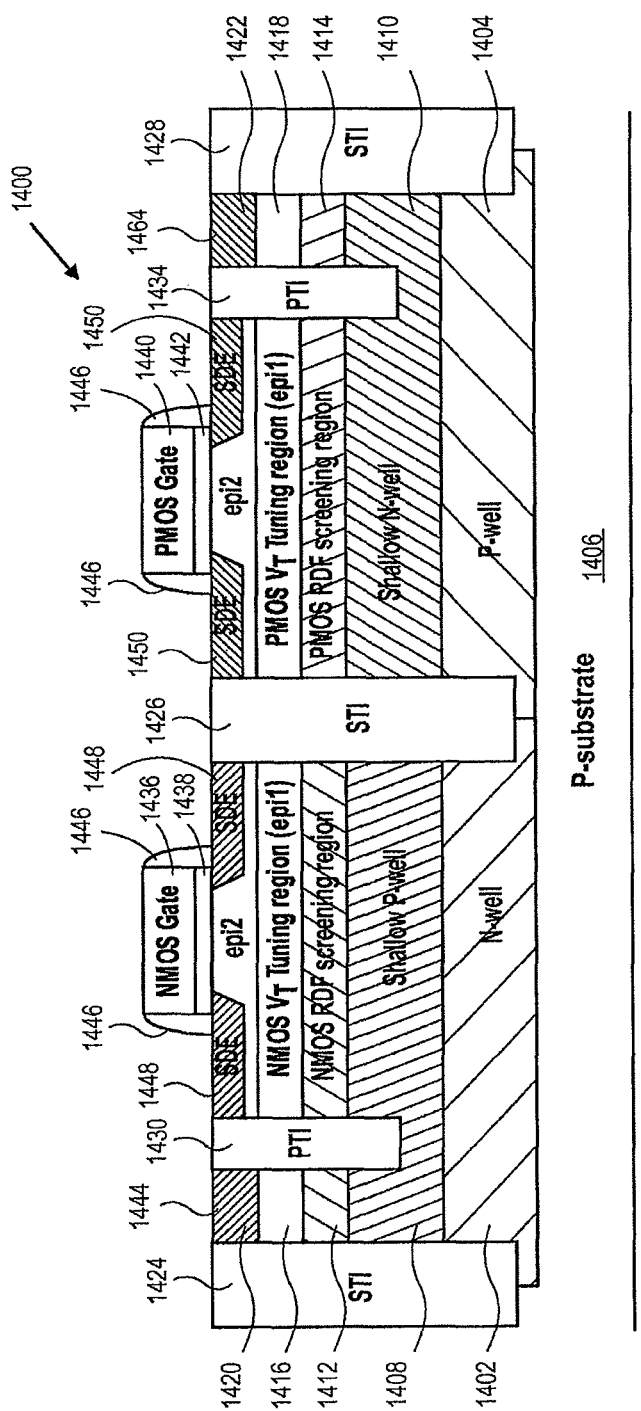
Figure 14G:
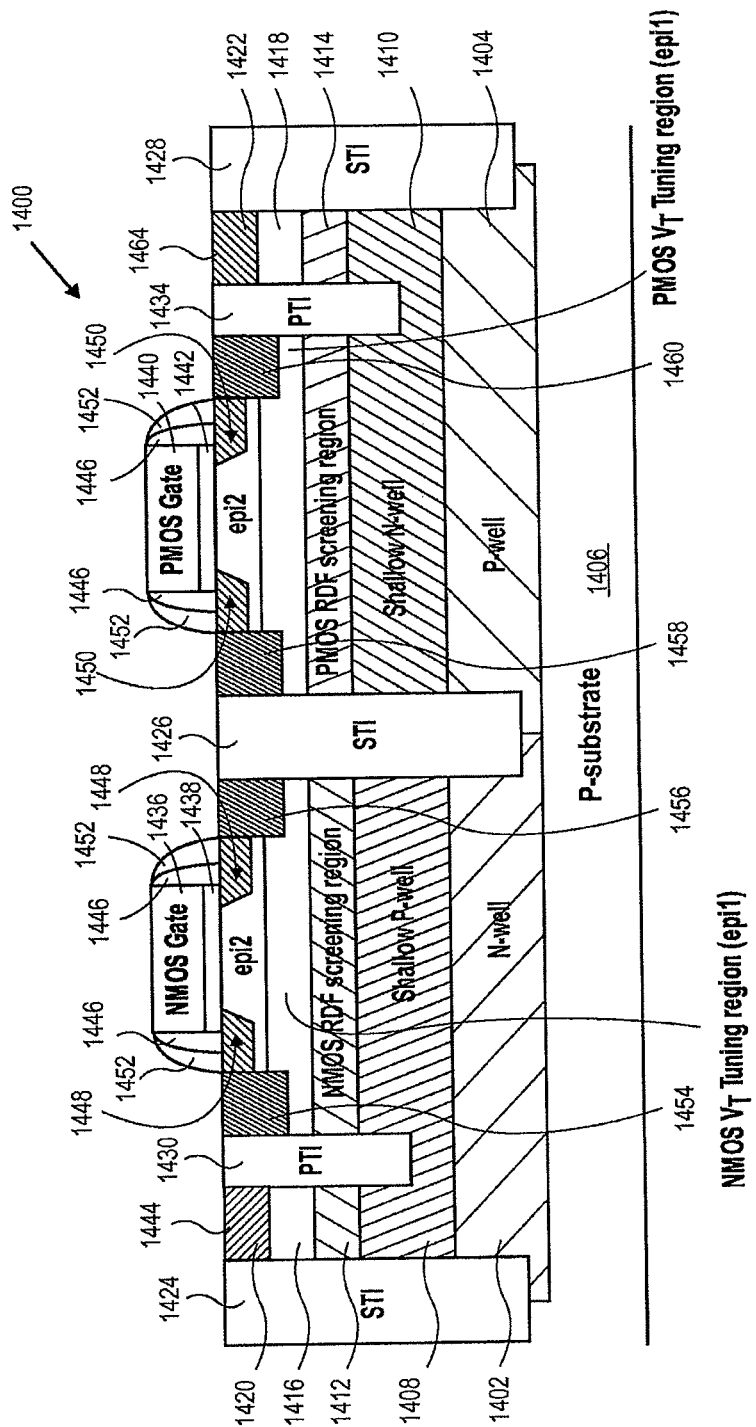

Referring to FIG. 14F, spacers 1446 are formed on the sides of each of the NMOS and PMOS gates and insulation regions forming source and drain extensions 1448, 1450. Optionally, NMOS and PMOS halo processes may be performed on legacy mode devices, which are described below. Also, the body contact areas 1444 and 1464 are subject to p+-type doping and n+-type doping respectively to create contact to the bodies of the transistors. NMOS and PMOS transistors are then created once the source and drain regions are formed, and contacts can be provided to supply the necessary voltage to the source region and the drain region to operate the device. This is shown in FIG. 14G, where source and drain regions 1454/1556 and 1458/1460 are formed respectively. Also shown in FIG. 14G are the second spacers 1452 that define the boundaries of the source/drains 1454/1456 and 1458/1460. Contacts and metals are then formed using photo resists, enabling electrical contact with the devices. Depending on where the process locates the source and drain, the electric fields can be greatly affected.

While certain steps of fabricating the DDC device are described above, other optional steps may be included to further improve the performance of the device, or to otherwise comply with different application specifications. For example, a technique known in the art as source/drain extension, as shown in FIG. 14G, can be applied to reduce leakage current. It will be appreciated by those skilled in the art that many different region combinations are possible, and the region combinations can be rearranged and replaced with different regions consistent with the teachings herein.

Figure 14H:
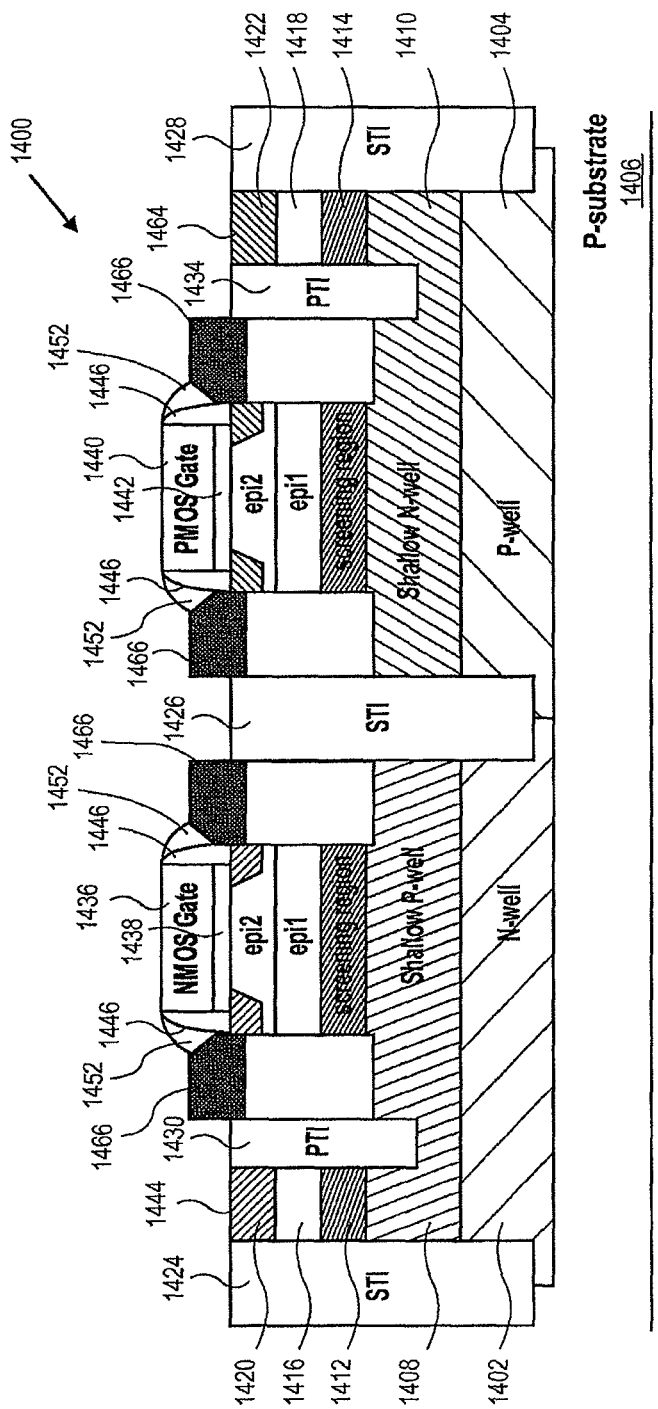
Figure 14I:
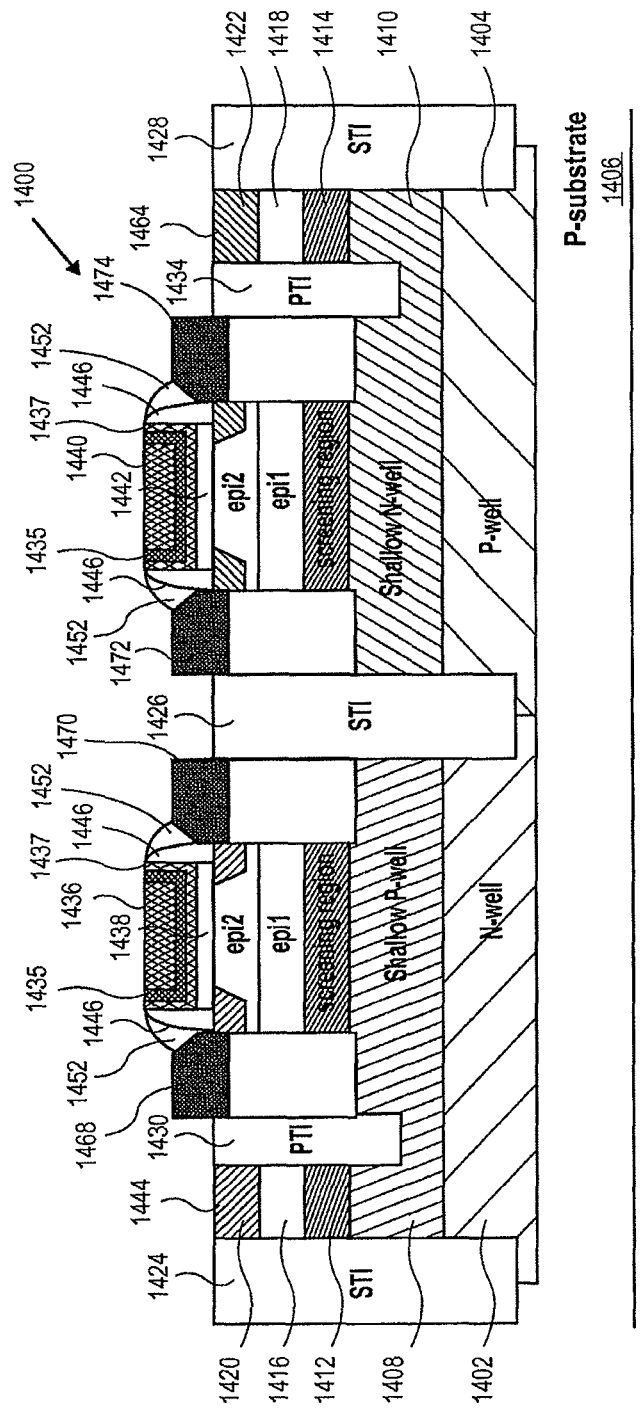

The threshold voltage tuning region and screen region doping levels are limited to a region between spacer edges under the channel. In one method, silicon is etched for outside spacers 1452 using a mask defined by spacers around respective gates 1436 and 1440 and hardmask on gate. The silicon depth that is etched is larger than the depth of screen region. In this example, silicon is etched for both NMOS and PMOS in the same or different steps. After the silicon etch, silicon 1466 is grown epitaxially to a level slightly higher than the gate dielectric as shown in FIG. 14H. The doping of the epitaxially grown silicon can be done either in situ or using a source/drain implant mask to form source/drain regions 1468, 1470, 1472 and 1474 as shown in FIG. 14I. First Gate dielectric 1438 and a second gate dielectric 1437 are layered. Layer 1435 and 1436 are metal gate electrodes engineered with appropriate N+ or P+ workfunction. In FIG. 14I, poly silicon is replaced with a Metal Gate electrode that is integrated with the gate dielectric. To replace poly with metal gate, two distinct metals with appropriate workfunction are required. Workfunction metals of ~4.2 and ~5.2 eV are needed to adjust the NMOS and PMOS devices' $V_T$ that are compatible with N+/P+ doped poly that is traditionally used in CMOS processing. The spacers 1452 around the gate and hardmask on gate makes self-aligned source/drain regions. This results in lower source/drain to body capacitance. In another method, a compensation source/drain implant may be performed. In this method, spacers around the gate and hardmask on the gate allow the gate to self-align.

As will be appreciated, being able to efficiently operate a circuit in multiple power modes is desirable. Also, being able to quickly and efficiently switch between different power modes can significantly improve the power saving capability and overall performance of a transistor, as well as chips made using such transistors, and also systems that implement such chips. With the ability to efficiently change modes of operation, a device can deliver high performance when needed and conserve power by entering into sleep mode while inactive. According to one embodiment, the modes of individual sub-circuits and even individual devices can be controlled dynamically. With the ability to vary the threshold voltage of a device dynamically, the modes of a device can also be varied dynamically.

Deeply depleted channel devices can have a wide range of nominal threshold voltages and can be operated using a wide range of operating voltages. Some embodiments may be implemented within current standard bulk CMOS operating voltages from 1.0 volts to 1.1 volts, and may also operate at much lower operating voltages, such as 0.3 to 0.7V for example. These provide circuit configurations for low power operation. Furthermore, DDC devices can be more responsive than conventional devices due to their strong body effect. In this respect, a strong body effect can allow the devices to effect change in a circuit through a substantially direct connection to other devices via a common shared well. In one example, a shared well may include a common P-well or N-well that underlies a group of devices. In operation, these devices are able to change modes by modifying the settings of the respective body bias voltages and/or operating voltages of the device. This enables the switching of a single device or one or more groups of devices much faster and using less energy than conventional devices. Thus, dynamic changes in modes can occur quickly, and systems can better manage power savings and overall system performance.

Also, in some applications, backward compatibility to an existing environment may be required so that DDC based devices can operate seamlessly with conventional devices. For example, there may be a mix of new DDC-based devices and conventional devices running at an operating voltage of 1.1 volts. There may be a need to perform level shifting in order to interface the DDC-based device with conventional devices. It is very desirable for DDC-based devices to operate seamlessly with legacy devices.

The screen region provides a high body effect, which is leveraged for responsive multimode switching in transistors. The response of a transistor having a screen region can vary within a wider range to a change in the body bias. More specifically, the high doping screening region can allow the device ON-current and OFF-current to change more widely under various body biases and can thereby facilitate dynamic mode switching. This is because the DDC devices can be configured with a lower $\sigma V_T$ than conventional devices, a lower variance of a set threshold voltage. Thus, the threshold voltage, $V_T$, can be set at different values. Even further, a device or group of devices can be body biased in order to change the threshold voltage, thus $V_T$ itself can be varied in response a changing body bias voltage. Thus, a lower $\sigma V_T$ provides a lower minimum operating voltage $V_{DD}$ and a wider range of available nominal intrinsic values of $V_T$. The increased body effect allows for dynamic control of $V_T$ within that wider range.

Furthermore, it can also desirable to configure the device to maximize performance if needed, even if such performance may result in an increase in power consumption. In an alternative embodiment, it may be desirable to place the device in a significantly low-power mode (Sleep mode) when the device is not in a high performance active operating condition. In utilizing DDC transistors in circuit, mode switching can be provided with an adequately fast switching time so as not to affect the overall system response time.

There are several different types of modes that may be desired in a transistor or group of transistors configured according the various DDC embodiments and examples illustrated and described herein. One mode is Low Power Mode, where the bias between body and source voltage, $V_{BS}$, is zero. In this mode, the device operates with low operating voltage $V_{DD}$ and lower active/passive power then non-DDC devices, but with equivalent performance as any conventional device. Another mode is Turbo mode, where the bias voltage of the device, $V_{BS}$, is forward biased. In this mode, the device operates with low Vcc and matched passive power with high performance. Another mode is Sleep mode, where the bias voltage, $V_{BS}$, is reverse biased. In this mode, the device operates with low Vcc and substantially low passive power. In legacy mode, the process flow is modified to allow for non-DDC MOSFET devices to operate substantially the same as legacy devices.

While a DDC structured device provides great performance advantages over conventional devices, it can also enable enhanced dynamic mode switching as a result of a strong body effect afforded by the screen region. The body tap allows for the application of a desired body bias applied to the device to achieve a desired mode. This may be achieved with a DDC having a low-doped channel and a screening region as discussed above, or alternatively with a DDC with multiple regions or layers having different dopant concentrations. When multi-mode switching is used for a group of transistors such as memory blocks or logic blocks, individual transistor control using conventional bulk CMOS techniques may be impractical and may result in substantial overhead for the control circuit. Extra control circuitry would need to be implemented, extensive dedicated wiring for controlling different devices or different groups of devices, and all would significantly add to the overall cost of the integrated circuit.

Therefore, it is desirable to develop sub-circuits or units that can be used to create one or more groups of transistors for dynamic mode switching. Furthermore, it is also desirable to provide a solution that may offer the body bias control technique to legacy devices so that, standing alone or in a mixed environment, legacy devices may also benefit from dynamic control.

Additionally, the relatively high body effect of the transistor with a screen region makes it suitable in certain embodiments for using the body bias as a means for controlling the device for operating in various modes, whether statically by design or dynamically, while a conventional bulk CMOS device may require physical design alterations.

Figure 15:
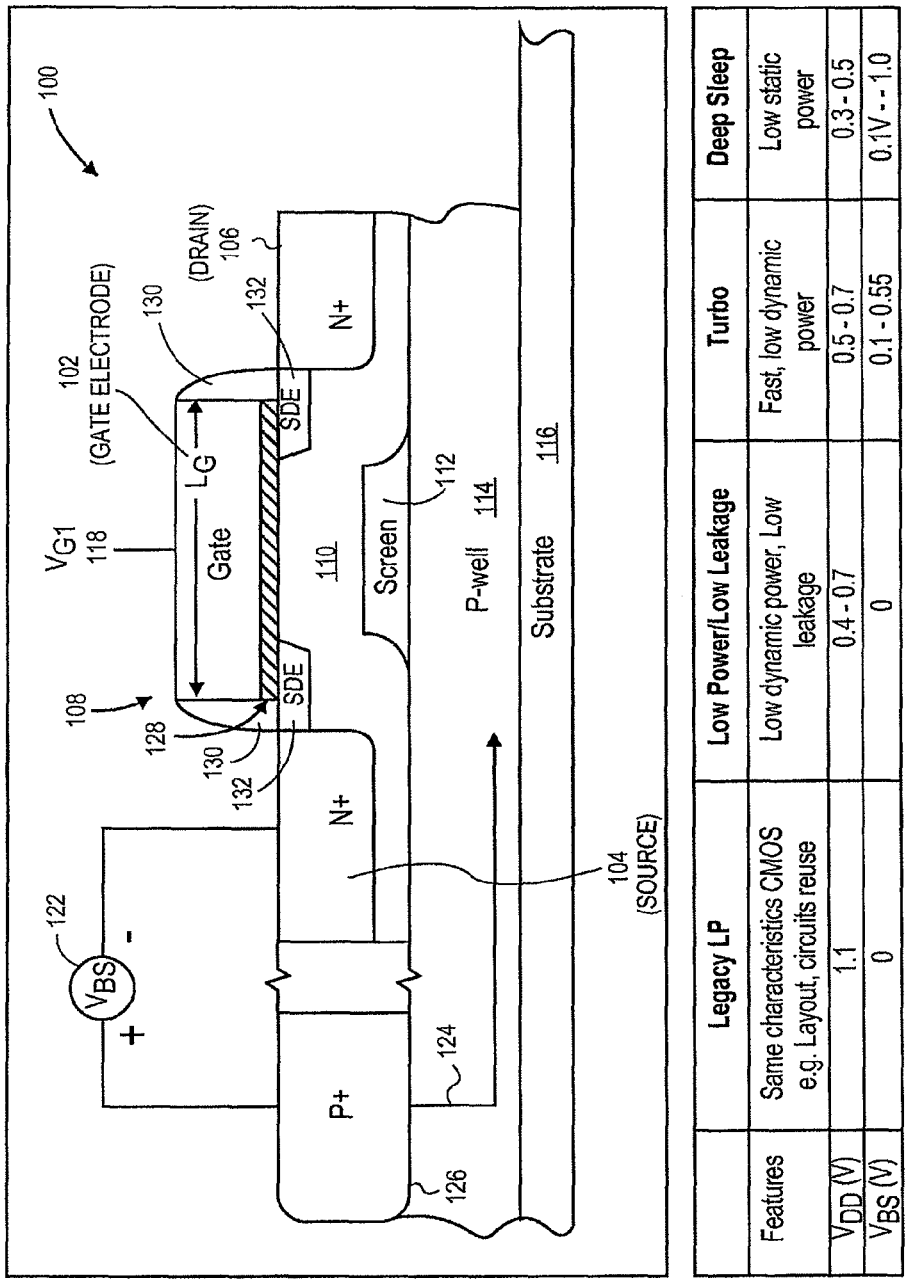
FIG. 15 shows an example of a multi-mode device having a highly doped screen region and a mechanism to apply a body bias voltage to the body.

A basic multi-mode device having a highly doped screen region and a mechanism to apply a body bias voltage to the body is shown in FIG. 15, reproduced from FIG. 2A along with a corresponding table illustrating different modes. As discussed in connection with FIG. 2A, a bias voltage may be applied between the well tap and the source, $V_{BS}$, to control the electrical fields of the device, including the field between the source and the device body. FIG. 15 illustrates a sample structure of an n-channel 4-terminal MOSFET. Terminal 106 is designated as the Drain and terminal 104 is designated as Source. During operation, current flows between these two terminals. Terminal 102 is called the gate electrode, and a voltage is often applied to this terminal to control the current flow between Drain and Source. The terminal 126 provides connectivity to the body of the transistor, which is the P-well 114 in this example. The voltage applied to the drain is the positive supply voltage, referred to as $V_{DD}$, and the voltage applied to the Source terminal is the lower supply voltage. The electrical fields affect the characteristics of the device. According to the various embodiments described herein, the device can be configured into multiple and distinct modes by properly selecting a bias voltage $V_{BS}$ and a supply voltage $V_{DD}$.

In a conventional bulk CMOS device, the substrate is often connected to the source to maintain the same source body voltage. Thus, the body bias is typically the same for all devices on a substrate. This is similar to the condition in which the DDC device is used in the normal low-power/low-leakage mode as discussed above, wherein the normal operating voltage is applied and zero bias voltage is applied, so $V_{BS}=0$. However, a multi-mode device configured according to various embodiments described herein may provide an effective mode control means in lieu of the body tap. This is particularly the case where the device includes a heavily doped screen region at a distance from the gate as described above. Unlike silicon-on-insulator based devices, which have low body effect, DDC-based devices can be configured on bulk silicon to produce a device having a high body effect. Thus, DDC configured devices can utilize a varying body bias as a means to enable multi-mode operations. A multi-mode transistor, as shown in the example of FIG. 15, can have an n-channel above a P-well. A P-plus type region is formed on the P-well. The body tap, not shown but discussed below, is coupled to the P-plus region to make conductive contact to the P-well, which is the body of the n-channel device. Since the body tap is p-plus doped, a connection to the body tap will enable connectivity to the P-well of the device (i.e., the body of the device). A body bias voltage may then be applied between the source and the body tap, where the body bias voltage can control the mode of operation of the n-channel device effectively. As in an n-channel device, the dynamic mode switch technique can be applied to a p-channel device above an N-well, where an n-plus region is formed to accommodate the body tap. Furthermore, the novel structures with the strong body bias described herein can be applied to CMOS devices where both n-channel and p-channel devices exist on the same substrate or a well. Examples of such embodiments are illustrated and described below.

The body bias voltage applied between the source and the body can effectively alter the behavior of a CMOS device. For the aforementioned device having a body tap, the source-body voltage can be applied independent of the gate-source and drain-source voltages. One of the advantages of using the body bias as a control means for multi-mode control is that the device can be connected as if it were a conventional device, for example, where the gate-source voltage and the drain-source voltage are configured the same way. In this case, the mode selection can be made in response to the body bias. Therefore, a device can be operated normally at zero bias, which is the same as a conventional device. When a higher performance mode (Turbo mode) is desired, a forward bias voltage may be applied between well tap and source, i.e., $V_{BS}>0$. The operating voltage for the Turbo mode can be the same or slightly higher than that of the normal mode. On the other hand, when a Sleep mode is desired, a reverse bias voltage may be applied between well tap and source, i.e., $V_{BS}<0$. The operating voltage for Sleep mode can be the same or slightly lower than that of the normal mode.

When a zero body bias is applied, the multi-mode device is operated in the normal low power mode. The body bias can be forward biased, a positive voltage applied, between the body and the source as shown in the example of FIG. 15, to increase the performance of the device. This forward bias mode is termed "turbo mode" for increased performance in the form of high drive current. However, the performance boost comes at the expense of increased leakage current. In a deep sleep mode, the body is reverse biased, where a negative voltage is applied between the body and the source as shown in the example of FIG. 15, to reduce the leakage current. This mode is desired when the device is in an idle or inactive state.

Figure 16:
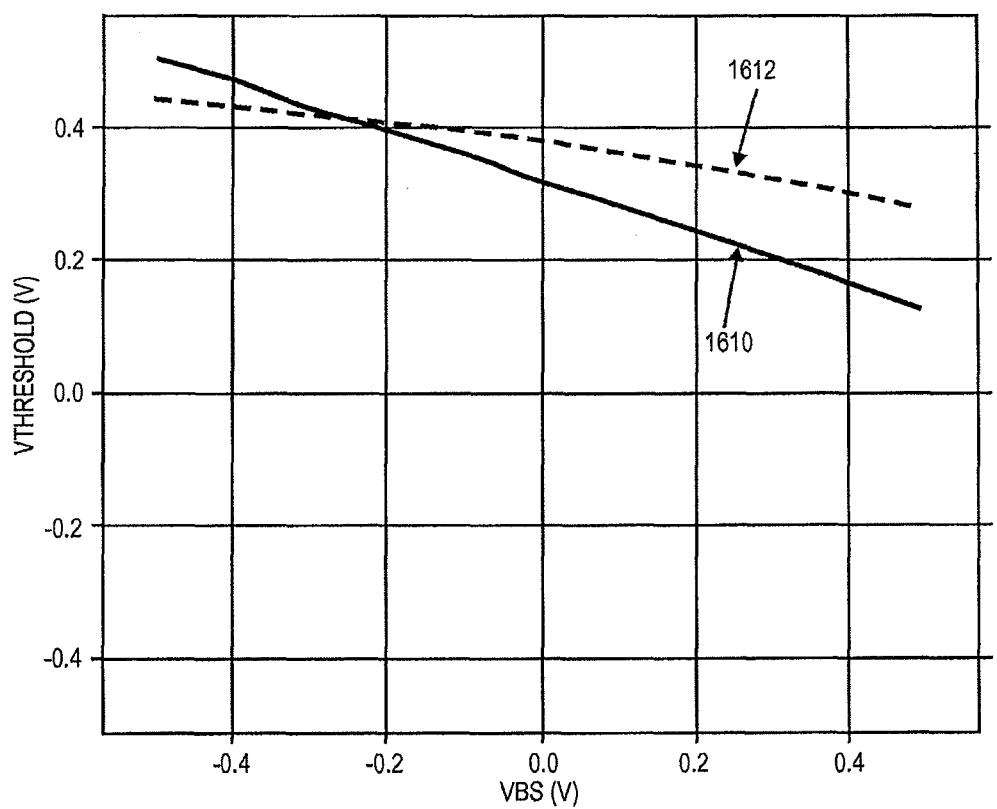
FIG. 16 shows an example of a comparison of threshold voltage $V_T$ versus bias voltage $V_{BS}$ between n-channel DDC devices and conventional n-channel devices.
Figure 17A:
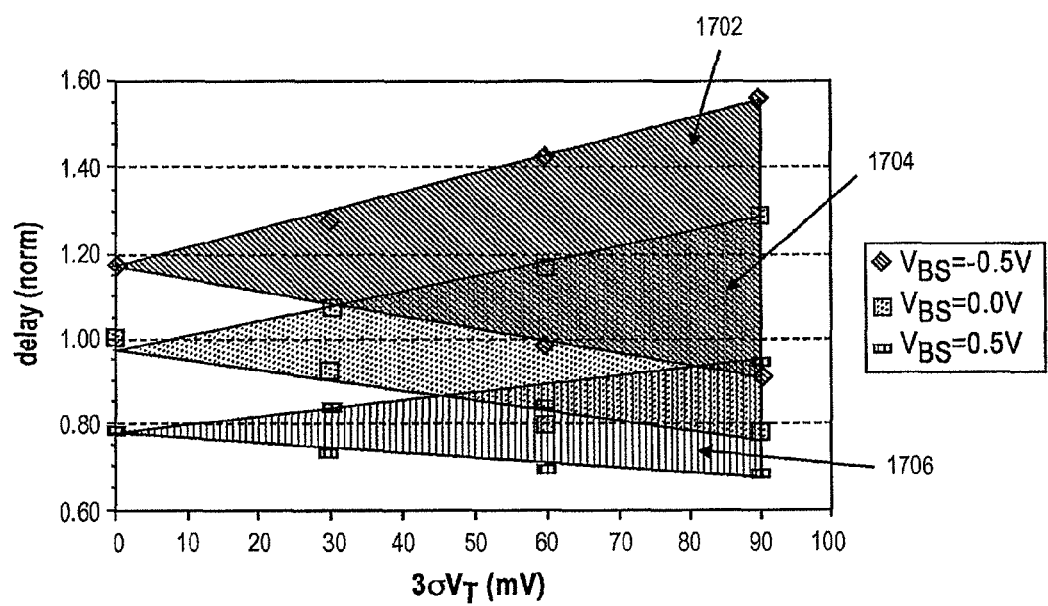
FIG. 17A shows an example of how the variation in threshold voltage from device to device causes a wide spread in delay time in a conventional device.
Figure 17B:
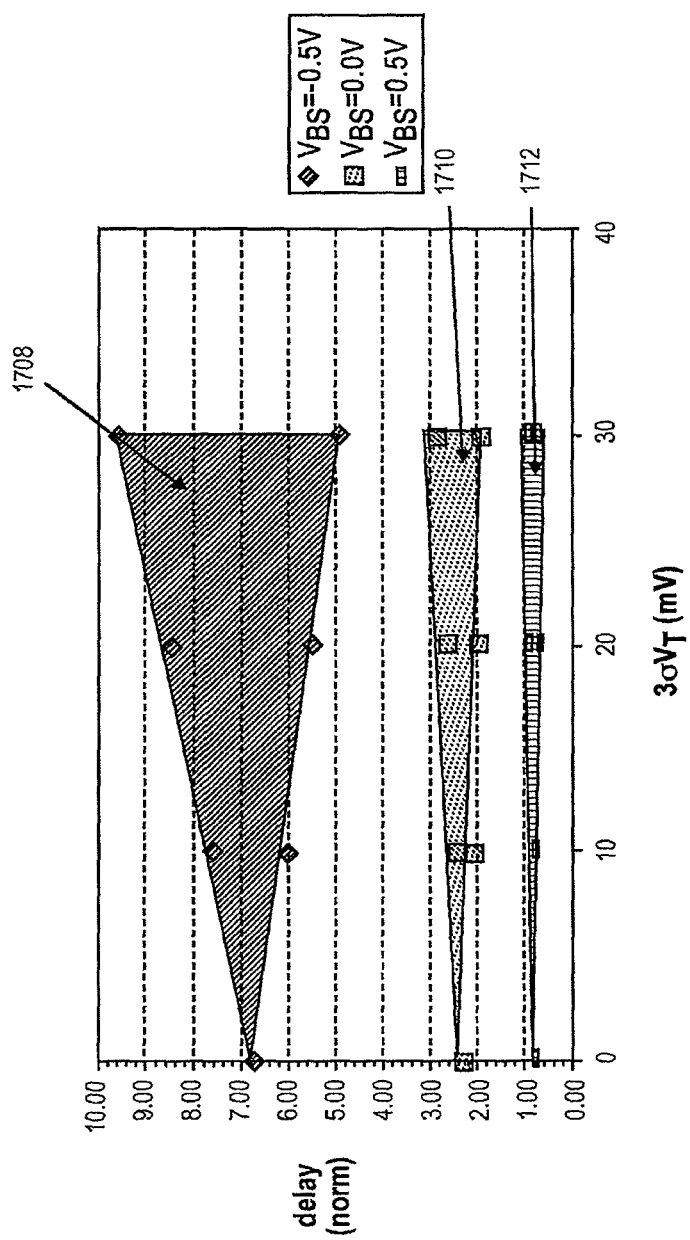
FIG. 17B shows an example of an improved delay time characteristic for DDC devices according to an embodiment.

FIG. 16 illustrates a comparison of threshold voltage $V_T$ versus bias voltage $V_{BS}$ between an example of an n-channel DDC devices and a conventional n-channel device. The curve 1610 represents the DDC device while the curve 1612 represents the conventional device. FIG. 16 shows that the threshold voltage of DDC devices in some implementations is much more responsive to the bias voltage than a conventional device. DDC devices can also offer a wide delay range responsive to the body bias. For a conventional device, the variation in threshold voltage from device to device causes a wide spread in delay time as shown in FIG. 17A. The bands 1702, 1704 and 1706 represent delay variations for bias voltage $V_{BS}$ at −0.5V, 0.0V and +0.5V respectively, where the delay time is shown in relative scale with the delay time for a conventional device at $V_{DD}$=1.1V, $V_{BS}$=0.0V, $\sigma V_T$=0.0V and Temperature=85° C. normalized to 1. The horizontal axis corresponds to $3\sigma V_T$ value. The $\sigma V_T$ for a conventional device is typically around 15 mV which leads to $3\sigma V_T$=45 mV. As shown in FIG. 17A, the three bands 1702, 1704 and 1706 are substantially overlapped, which makes it difficult to differentiate the mode according to the delay time. FIG. 17B shows the improved delay time for examples of DDC devices. In FIG. 17B, the three bands not only do not overlap, but also have a much smaller spread. At three different bias voltages, −0.5V, 0.0V and +0.5V (reverse bias, zero bias and forward bias), DDC devices illustrate three very distinct bands 1708, 1710 and 1712. The distinctive bands illustrate that DDC devices in some embodiments are very effective to use in multiple operation modes.

Figure 18:
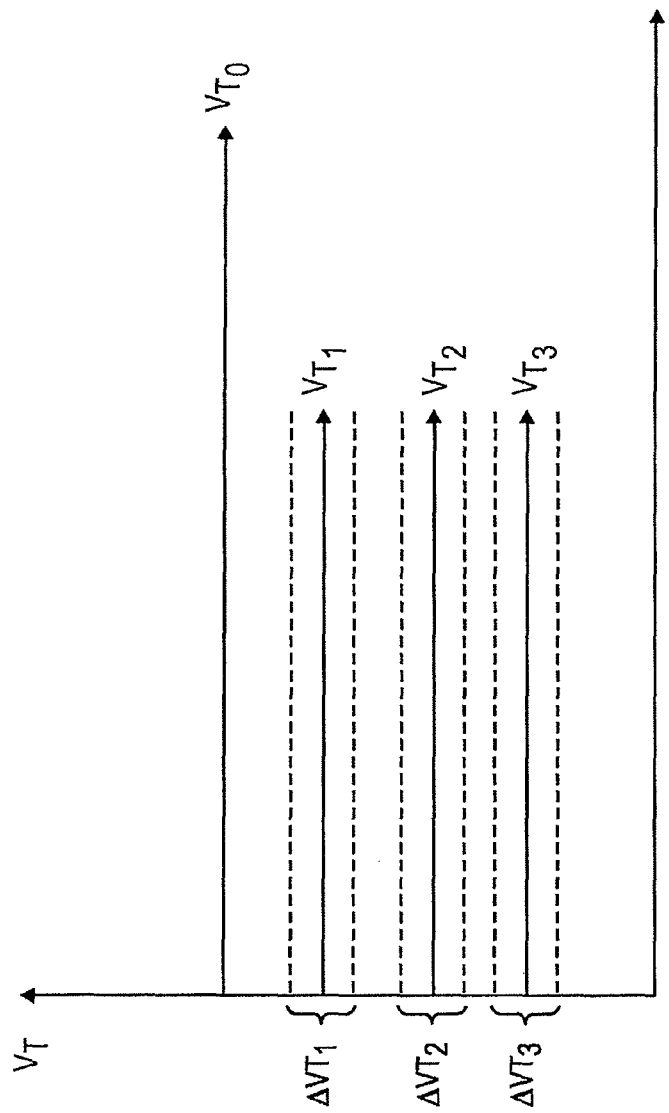
FIG. 18 shows a graph of static $V_T$ values set for a device according to one embodiment.

One other potential benefit of a transistor that can provide a reduced $V_T$, and thus a $V_T$ that can be more precisely controlled, is the ability to control $V_T$ dynamically. In conventional devices, $\sigma V_T$ is so large that $V_T$ needs to be accounted for across a broad range. According to embodiments described herein, $V_T$ can be varied dynamically by adjusting the body bias voltage. Dynamic adjustment of $V_T$ is provided by the increased body effect, and the range of dynamic control is provided by a reduced $\sigma V_T$. Referring to FIG. 18, one graphical example is illustrated that shows a static $V_T$ that is set for a device, $V_{T0}$, and further shows multiple $V_T$'s of which the device can be adjusted. Each has a corresponding $\Delta V_T$, or individual $\sigma V_T$ for each corresponding $V_T$ value. According to embodiments described herein, a device can be configured to have a dynamically adjustable $V_T$ adjusting the body bias voltage within the required voltage range and with a suitable speed of voltage adjustment. In certain embodiments, the voltage adjustment can be in predetermined steps, or it can be continuously varied.

According to another embodiment, while FIG. 15 illustrates a sample multimode device that is capable of operating under various modes, it could also be useful for the device to include a structure to isolate the body for a group of transistors. This would provide the ability for a device effectively operate independently under various modes. If the body of a group of multi-mode transistors is connected, the whole group will be switched at the same time, limiting the ability to facilitate mode switching. On the other hand, if the bodies of two groups of multi-mode transistors are not connected, the two groups can be individually controlled. Therefore, the basic multi-mode transistor shown in FIG. 15 can further provide a group of transistors that can be divided into a number of blocks with an individual body bias for each group. These are described below.

Thus, improved systems can be configured utilizing the DDC structures, such as the transistor structures illustrated in FIGS. 14A through 14I and discussed above. Variations on those structures may be implemented into integrated circuits and systems having compelling advances in performance. It has been shown how the structures can be configured to scale transistors, and now it will be shown how these structures can be used as building blocks to scale broader integrated circuits and systems. Utilizing the DDC structures, STIs, PTIs, shallow wells and/or shared wells incorporated in, for example, integrated circuits and systems can be configured for new and improved system performance. Furthermore, new innovations utilizing body taps and/or body access transistors can be utilized even apart from the DDC structures to provide new features and benefits for integrated circuits and systems.

Thus, these innovations in bulk CMOS and other novel structures and processes can be used to construct newly scaled integrated circuit chips with greatly improved operations.

While the transistor embodiments described thus far generally may provide for continued power scaling of bulk CMOS transistors and other devices, among other things, one desiring to take full advantage of some of the benefits and features of DDC structures at the chip level may also be able to do so by appropriate modification of the layout and routing of circuit blocks on the chip in accordance with the transistor embodiments discussed herein. For example, as discussed previously, the concept of dynamically adjusting the body bias voltage of transistors to adjust their threshold voltages is known but has generally not proven practical to implement in nanoscale devices. Reasons for this include that, in some implementations, (1) the large $\sigma V_T$ of conventional bulk CMOS nanoscale devices may not provide for sufficient differentiation between transistors in relation to existing nanoscale-scale devices; (2) the relatively low body coefficient of conventional bulk CMOS nanoscale devices may not provide the ability to switch between operating modes quickly enough to avoid affecting chip operation; and (3) routing the body bias lines to each transistor or circuit block can significantly reduce the number of transistors that can be integrated on a chip, thus inhibiting scaling at the chip level. Some DDC transistor embodiments can address the first two issues by (1) providing a significantly reduced $\sigma V_T$, which allows the same transistor to be designed not only to work at different threshold voltages but at different operating voltages; and/or (2) providing a significantly increased body coefficient that allows transistors and circuit blocks to quickly and efficiently switch between operating modes. DDC transistors can, in some embodiments, be treated as chameleon-like field programmable transistors (FPTs), in which some or all have the same nominal structure and characteristics but are independently configurable to operate as transistors that would have had to have been fabricated differently in conventional bulk CMOS. Improved routing of body bias lines is another element of the following discussion, which also provides further examples of how multi-mode transistors may be used.

Figure 19:
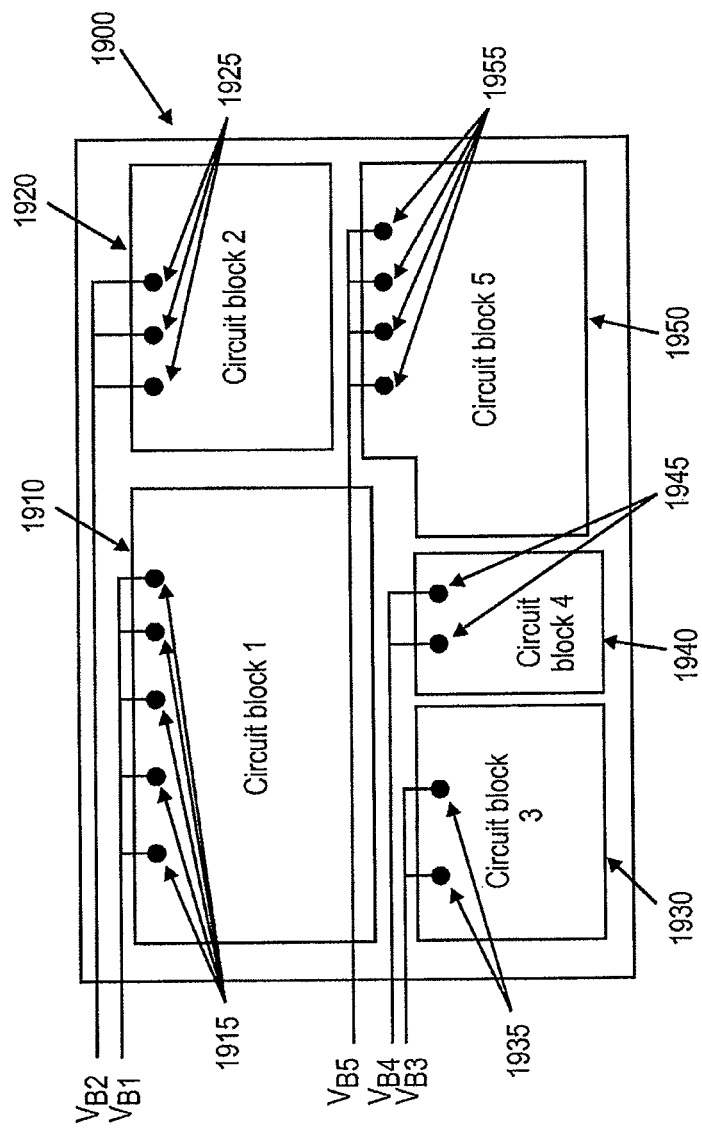
FIG. 19 shows an example of multiple groups of transistors having individual bodies according to one embodiment.

FIG. 19 is a simplified drawing that illustrates the concept of multi-mode operation for a group of transistors, where each block or circuit may operate at a different mode based on the body bias voltage and operating voltage supplied to it. In some implementations, applying separate body biases to the individual blocks can allow a system to be controlled by dynamically adjusting its threshold voltage, allowing the commonly connected components to operate in common modes, and separately connected components or systems to operate in separately controlled modes. In the exemplary scenario depicted in FIG. 19, a device 1900 is divided into five groups of transistors or circuit blocks 1910, 1920, 1930, 1940 and 1950 having separate body bias contacts. According to embodiments described herein, the bodies of the five circuit blocks are isolated from each other, such that a different body bias can be independently applied to each block. In this example, each of the circuit blocks has its body isolated from other groups, and the body is connected through respective body taps (1915, 1925, 1935, 1945 and 1955). The five blocks are intended to illustrate the need to facilitate isolation among the group of transistors to create isolated blocks. FIG. 19 also illustrates that each block is connected to individual body biases $V_{B1}$, $V_{B1}$, $V_{B3}$, $V_{B4}$ and $V_{B5}$, respectively. As is understood by those skilled in the art, each block will also require other supply voltages such as $V_{DD}$ for drains, $V_{SS}$ for sources, $V_G$ for gates and other signals. Additionally, different operating voltages $V_{DD}$ may be applied separately to each circuit block. The mode of each circuit block may be set statically by design (e.g., by connecting different circuit blocks to different body bias voltages and operating voltages to establish their operating modes independently of one another), and/or it may be set dynamically through control circuitry and algorithms that adjusts body bias and/or operating voltage of each circuit block during operation to set its operating mode. With low $\sigma V_T$ and the ability to adjust the threshold voltage, $V_T$, across a relatively wide range of values, the modes of operation of individual transistors or groups of transistors may be separately controlled.

In the following examples, various transistors will be described. These transistors are intended to be used as building blocks to form a group of transistors into blocks with an isolated body. Referring again to FIG. 14G for example, one embodiment of a pair of CMOS transistors configured with the novel DDC structures is shown, the transistors having body taps, where an n-channel device and a p-channel device are on the same substrate. These structures may be used to develop circuits and systems of greatly improved performance, including embodiments described below. Other transistors may be utilized in combination with the novel DDC structured transistors, and some of the embodiments herein may be configured without DDC configured transistors.

Figures 20A, 20B:
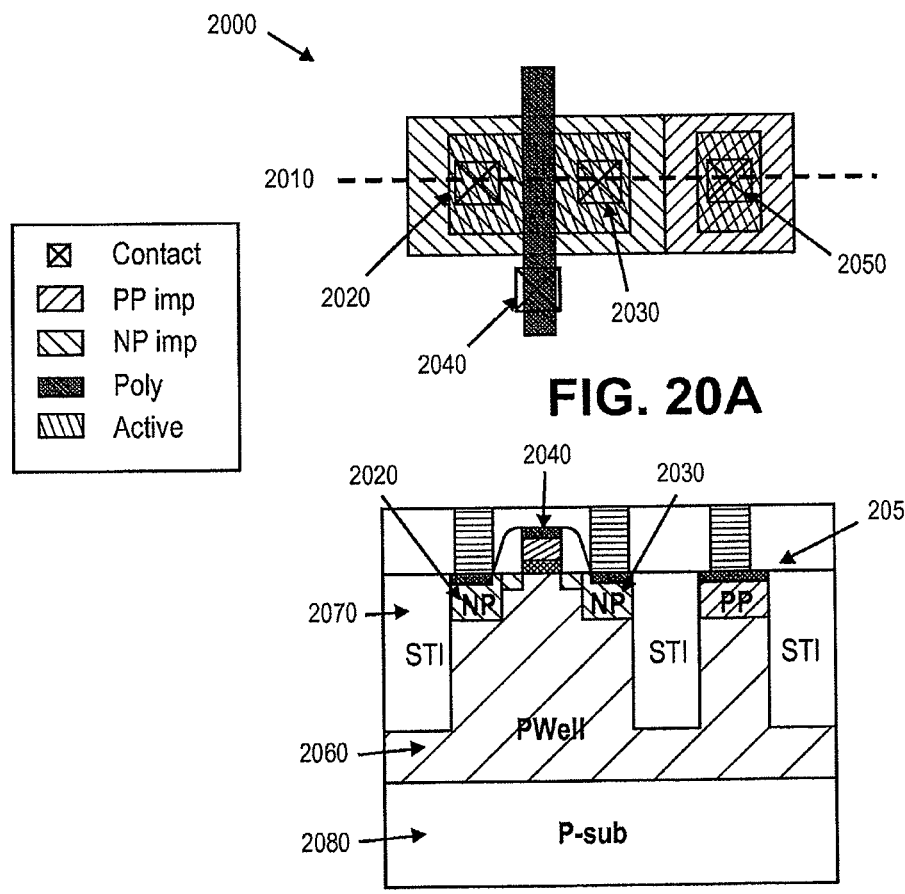
FIGS. 20A and 20B show an example of an n-channel 4-terminal transistor layout according to one embodiment.

FIGS. 20A and 20B illustrate an example of an n-channel 4-terminal transistor layout having a well structure where a single P-well 2060 is on a P-substrate 2080. The layout 2000 of the 4-terminal transistor shows the source/drain pair 2020 and 2030, a gate 2040 and a body tap 2050. A cross section view at location 2010 is also shown where the shallow trench isolation (STI) 2070 depth is less than the P-well depth. The P-well 2060 is common to all n-channel transistors on the P-substrate 2080. Therefore, the 4-terminal transistor may not provide isolation among n-channel transistors. As shown in this example, the body tap is P-plus doped and placed next to the transistor laterally (in reference to the gate orientation as shown). In addition, the body tap is isolated from the transistor by a STI 2070.

FIGS. 21A, 21B and 21C illustrate an example of an n-channel 4-terminal transistor having a novel shallow P-well (SPW), where the SPW depth is less than the STI depth. The layout 2100 of this 4-terminal n-channel transistor shows a source and drain pair 2020 and 2030, a gate 2040 and a body tap 2050. Cross section view 2180 illustrates location 2110 and cross section view 2190 illustrates location 2112. The shallow well can enable body isolation and, consequently, can in certain implementations allow dynamic mode switching for a group of devices such as memory cells or other digital circuits, thus reducing the number of body bias voltage lines that must be routed on the integrated circuit. As shown in cross section views 2180 and 2190, the transistor has a shallow P-well 2160 on a complementary N-well 2164. Due to the p-n junction, the N-well 2164 is not conductively connected to the shallow P-well 2160, and the N-well is not conductively connected to the P-substrate 2080. Therefore, the transistor can be isolated from other n-channel transistors having shallow P-well 2160 over the N-well 2164 on the same substrate. An active region is extended under the gate. The minimum active critical dimension (CD) is used for an extended active section under the gate. Extended active edges may be placed between spacer edges to avoid shortage due to silicidation. Body contact can be made over the extended active area outside the gate. The N+ implant edge may be under the gate extension (end cap) area. While the example illustrates one approach to creating an n-channel 4 terminal transistor, the layout can also be applied to create a p-channel 4 terminal transistor. As shown in FIGS. 21A-C, in some implementations the STI can be deeper than the SPW. In some embodiments, if two adjacent transistors do not have a common SPW, they can be biased independently of each other. Alternatively, a group of adjacent transistors may share a common SPW and can be operated in the same mode by applying the same body bias.

Figure 22A:
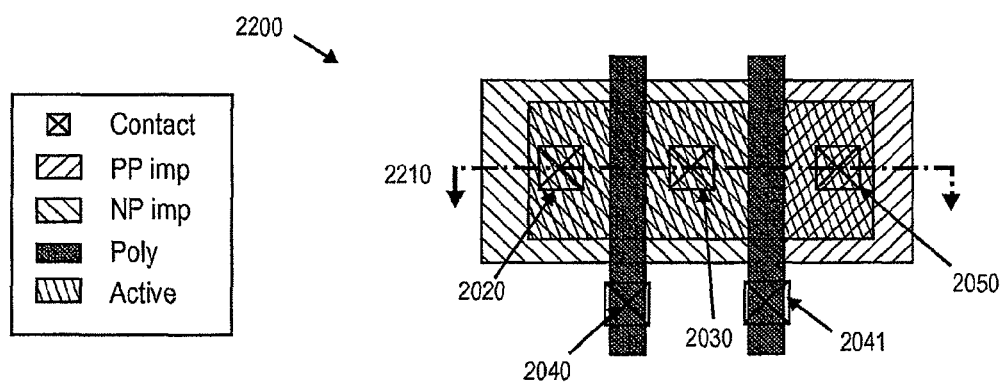
FIGS. 22A and 22B show an example of a dynamic multimode transistor having a body access transistor according to one embodiment.
Figure 22B:
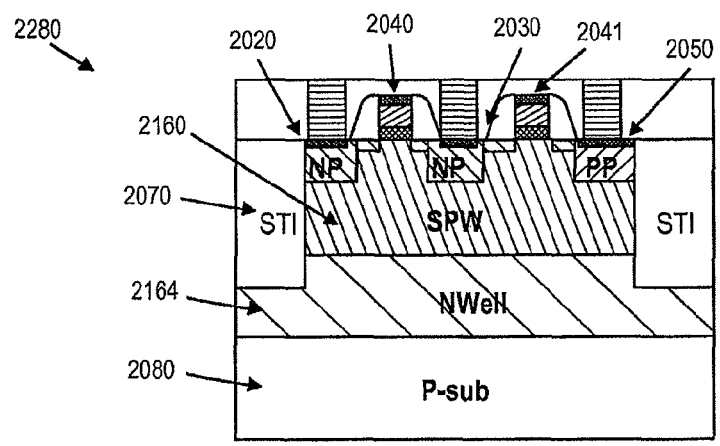

In yet another embodiment of the dynamic multimode transistor, a body access transistor can be formed between the actual transistor and the body tap as shown in FIGS. 22A and 22B. FIGS. 22A-B illustrate an n-channel 4 terminal transistor layout 2200 and associated cross section view 2280, where the shallow P-well (SPW) 2160 is isolated by STI 2070. The body access transistor can isolate the body tap from the transistor. The body access transistor can be created as if there were a transistor where the gate 2041 serves as the gate for the body access transistor and the body tap is treated as a source/drain. This can simplify the process and reduce the area required to make body tap connection. The use of a body access transistor combined with the shallow well becomes a useful building block to enable dynamic mode switching with fine granularity. For the group of transistors or circuits to be switched together, they can be placed to share the same shallow well. In addition, one or more gate taps can be created by using the body access transistor to provide connection to the body and supplying body bias.

Figure 23A:
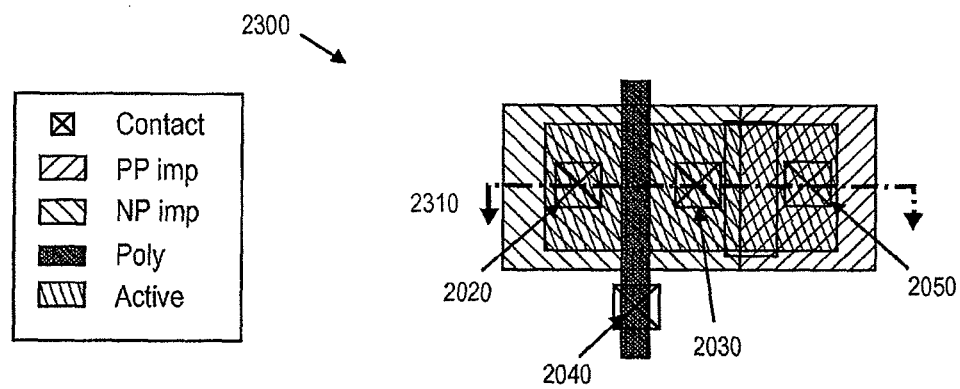
FIGS. 23A and 23B show another example of a dynamic multimode transistor having partial trench isolation (PTI) according to one embodiment.
Figure 23B:
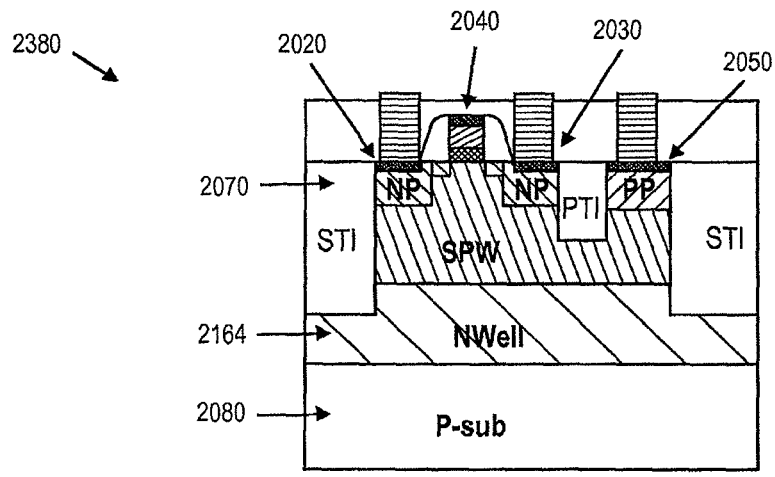

As discussed above, partial trench isolation (PTI) is another preferred way to isolate the body tap from the transistor. According to another embodiment illustrated in FIGS. 23A and 23B, an exemplary layout 2300 and cross section view 2380 for an n-channel 4-terminal transistor includes a shallow P-well (SPW) and partial trench isolation (PTI). The cross section view 2380 corresponds to the cross section at location 2310. The SPW depth can be less than the STI depth. The PTI oxide can prevent a silicide short between an n-type source/drain and a p-type bulk tap. The PTI depth may be less than the shallow well depth so that the continuity of the shallow well within the transistor is maintained. The PTI approach can, in some implementations, provide superior protection against possible shortage between the body tap and the source/drain due to silicide. However, the PTI would require one or more additional process steps during fabrication of the device. The PTI depth is, in some embodiments, preferably larger than the source/drain junction to separate P+ bulk tap and N+ source/drain and thereby minimize N+/P+ junction leakage.

The relative planar location of the active area for the source/drain and the active area for well tap may be arranged differently to create a variation of a 4-terminal transistor 2400 having PTI as shown in the example in FIGS. 24A, 24B and 24C. Cross sections views 2480 and 2490 correspond to locations 2410 and 2412 respectively. As shown, the shallow P-well is isolated by the STI.

While the above examples illustrate a 4-terminal transistor providing a body tap for applying body bias voltage, there are situations in which the fourth terminal for body bias may not be needed. For example, when CMOS transistors have a shallow P-well and N-well on a common N-well, the p-channel transistors having shallow N-well on the N-well will always have a common N-well. In such implementations, there may be no need to provide a separate fourth terminal connecting to the body. Consequently, several examples of 3-terminal transistors are illustrated here and will be used as building blocks to create a group of transistors with body-isolated blocks. In another scenario, the transistor may have a shallow well on a complementary well where said transistor is intended to operate with the body float. In such implementations, there may be no need to use the fourth terminal.

Figure 25A:
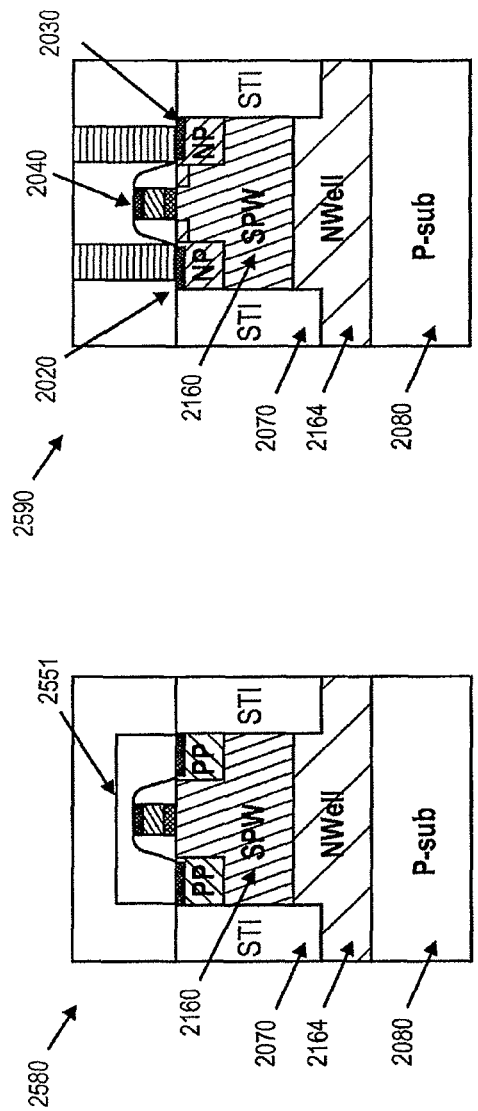
FIGS. 25A, 25B and 25C show an example of a 3-terminal transistor with local interconnect according to one embodiment.
Figure 25B:
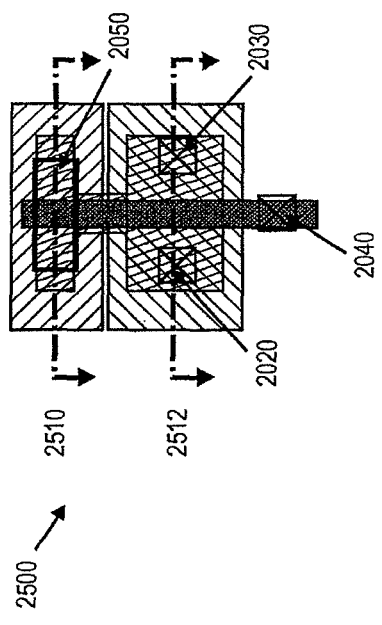
Figure 25C:
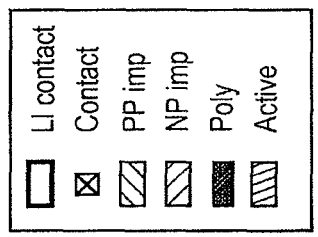

For one example of a 3-terminal structure 2500, a local interconnect connects the gate and the body to reduce the number of terminals from four to three, as shown in FIGS. 25A, 25B and 25C. The cross section views 2580 and 2590 correspond to locations 2510 and 2512, respectively. In 2580, Local Interconnection (LI) contact 2551 is used to connect the body contact to the extended gate. In this example, the gate to body contact is made over an extended active area using a metal contact. Rectangular contacts used in an SRAM cell may also be used to connect the gate to the body.

In yet another embodiment, a 3-terminal dynamic multimode transistor is formed by using the body contact under the poly. The oxide under the gate is removed using a GA (Gate to Active) contact mask. Over the gate dielectric removed area, a Polysilicon Gate Contact (PGC) implant may be made that has the same polarity as the SPW. The use of PGC 2650 connects the body to the gate, as shown in structure 2600 of FIGS. 26A, 26B and 26C. Cross section views 2680 and 2690 correspond to locations 2612 and 2614. There can be several potential advantages of this layout scheme, including the ability to make a self aligned gate contact to body, and/or also the ability to make a self aligned GC (Gate Contact) implant. Since a GC implant can have the same polarity as SPW (P+ doping), in some embodiments there may be no bends in the active region, which is design-for-manufacturing (DFM) friendly. The use of PGC for connection may result in higher contact resistance to the body. However, for static mode control in some embodiments, the contact resistance is not critical. Therefore, when a static control is needed, PGC may be used.

Alternatively, the body contact can be made in an active area extended under a gate extension, similar to the 3-terminal single gate transistor 2700, as shown in FIGS. 27A-C. Cross section views 2780 and 2790 correspond to locations 2712 and 2714. The minimum active critical dimension (CD) may be used for extended active section. Extended active edges can be located between spacer edges of active region under gate. The oxide under the gate may be removed using a GA contact mask. Over the area from which the gate has been removed, a GC implant may be made having the same polarity as the SPW, and a body may then be used to tie the body to the gate. In some implementations this approach can provide similar advantages, including the ability to use a self aligned gate contact to body or a self aligned GC implant, since a GC implant has the same polarity as SPW (P+ doping).

Figure 28A:
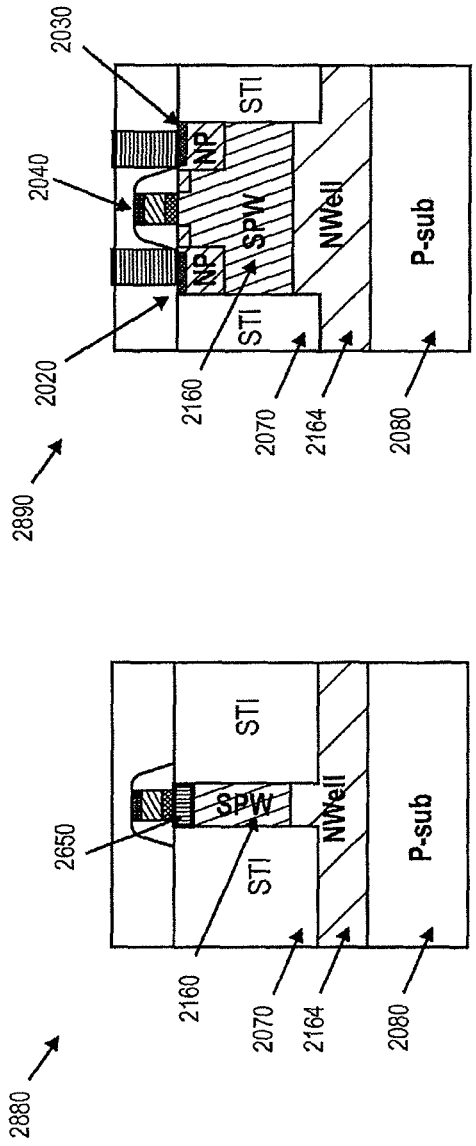
FIGS. 28A, 28B and 28C show another example of a 3-terminal transistor with the body contact according to one embodiment.
Figure 28B:
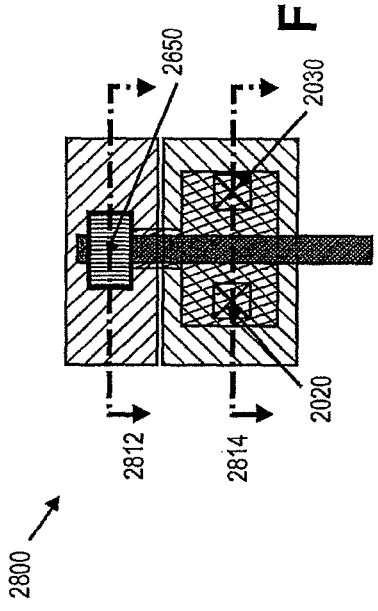
Figure 28C:
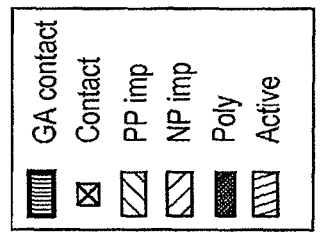

While the contacts for gate and well tap can be at different locations along the poly as shown in the example in FIGS. 27A-C, they can be oriented at the same location as shown in structure 2800 in FIGS. 28A-C. Cross section views 2880 and 2890 correspond to locations 2812 and 2814, respectively.

In another embodiment, the layout will allow for a programmable 4-terminal/3-terminal transistor. As shown in the structure 2900 of FIGS. 29A-C, the gate and the body may be disconnected or connected using a metal region 2950, resulting in either a 4-terminal or 3-terminal, respectively. Cross section views 2980 and 2990 correspond to locations 2912 and 2914, respectively. Consequently, the metal region connection facilitates a programmable 4-terminal/3-terminal transistor layout.

Various transistors have been described herein, and the different structures described in the various embodiments and examples can be used in different combinations and substructures to make useful systems, with improved performance over conventional systems in many instances. These transistor structures may also be used as building blocks for creating a group of transistors divided into multiple blocks and having individual body bias connections for dynamic mode switching. Some examples are described below.

Figure 30:
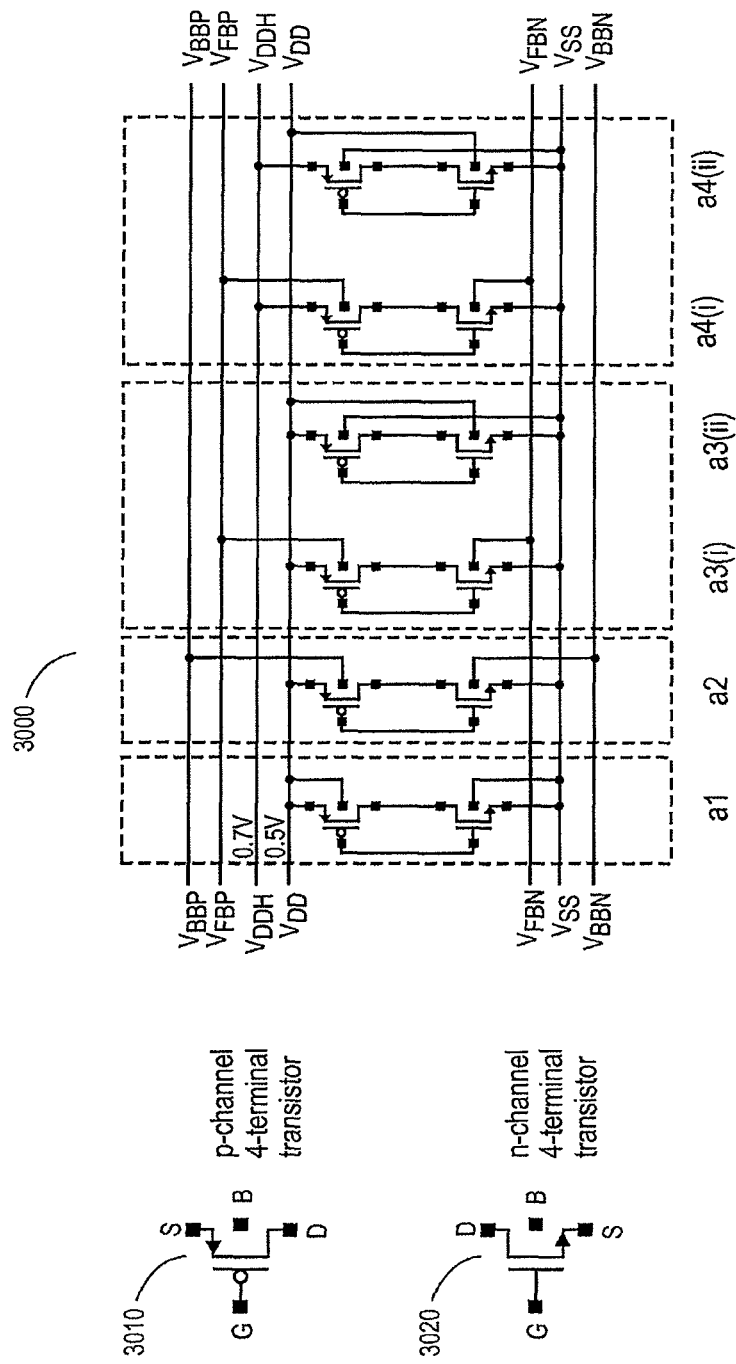
FIG. 30 shows an example of a circuit capable of dynamic mode switching using 4-terminal transistors according to one embodiment.

One of the preferred advantages of the transistors configured according to some of the embodiments described herein is dynamic mode switching capability. This can be enabled by applying a controlled body bias voltage to set or adjust variable operating voltages. FIG. 30 illustrates one example of circuit 3000 capable of dynamic mode switching using 4-terminal transistors, where various bias voltages and operating voltages are shown. The circuit blocks, a1-a4, correspond to standard, low-leakage, and two turbo modes, respectively. Each of the circuit blocks uses a pair of 4-terminal transistors, a p-channel 4-terminal transistor 3010, and an n-channel 4-terminal transistor 3020, where the 4 terminals are designated as S (Source), D (Drain), G (Gate) and B (Body). In block a1, the 4-terminal transistor having a body tap is used as a conventional transistor. The body for the n-channel device (the lower transistor shown) is tied to source voltage Vss. The body for the p-channel device (the upper transistor shown) is connected to the operating voltage $V_{DD}$. In block a2, the device is reverse biased to achieve low leakage when the device is not actively used. The reverse bias can be achieved by connecting the body for the n-channel device to a reverse bias voltage for n-channel $V_{BBN}$, which is lower than $V_{SS}$, and the body for the p-channel device to a reverse bias voltage for p-channel $V_{BBP}$, which is higher than $V_{DD}$. If higher performance is desired, the device can be put into a forward bias condition as shown in blocks a3 and a4. In a3(i), the p-channel body and n-channel are connected to dedicated forward bias voltages $V_{FBP}$ and $V_{FBN}$ respectively, where $V_{FBP}$ is less than $V_{DD}$ and $V_{FBN}$ is higher than $V_{SS}$. Alternatively, source and drain voltages can be used for forward bias to save system cost by eliminating the required additional supplies for the forward bias voltage. As shown in a3(ii), the body of the p-channel is tied to $V_{SS}$ and the body for the n-channel device is tied to $V_{DD}$. The circuits in a4(i) and a4(ii) are similar to those of a3(i) and a3(ii) except that a high operating voltage $V_{DDH}$ is connected.

Figure 31:
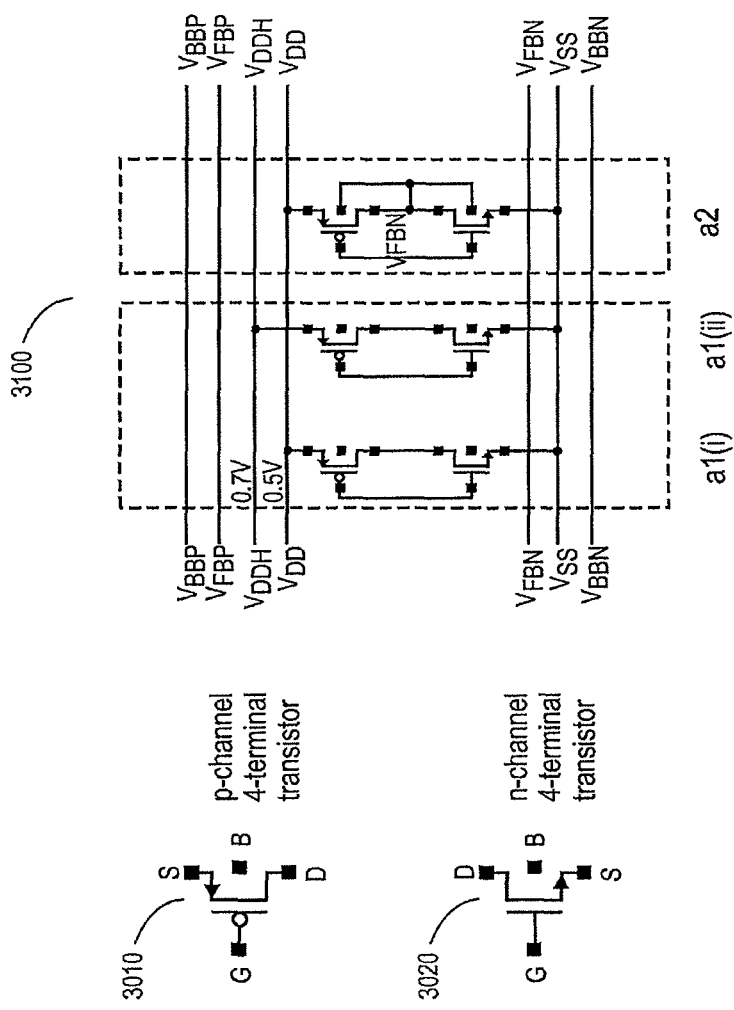
FIG. 31 shows an example of a dynamic mode switching circuit using 4-terminal transistors according to one embodiment.

As shown in FIG. 31, there are also several other variations of using the 4-terminal device in a dynamic switching environment. In FIG. 31, the circuit block a1 illustrates the scenario in which the body of the 4-terminal device is left unconnected to make the body float. There are two versions of floating body 3100 illustrated in FIG. 31, where sub-block a1(i) uses $V_{DD}$ as operating voltage while sub-block a1(ii) uses $V_{DDH}$ as operating voltage. This will deliver a medium performance. In circuit block a2, the body and drain of the p-channel and n-channel devices are all tied together to achieve a turbo mode. The same dynamic mode switching feature can be extended to a large scale of circuits having many more transistors according to one embodiment described herein.

Figure 32A:
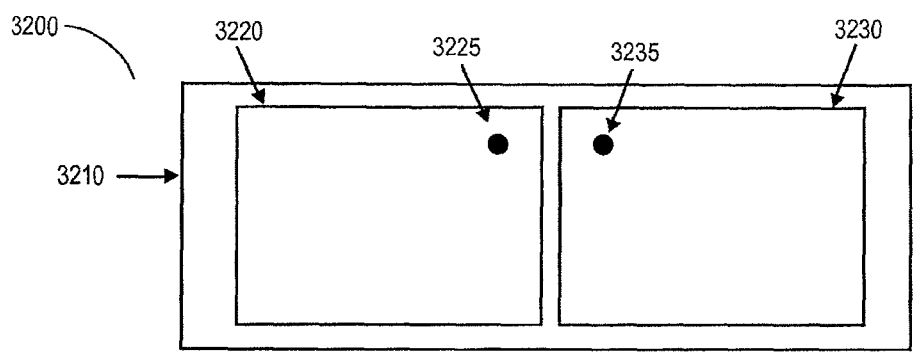
FIG. 32A shows an example of a circuit capable of dynamic mode switching according to one embodiment.
Figure 32B:
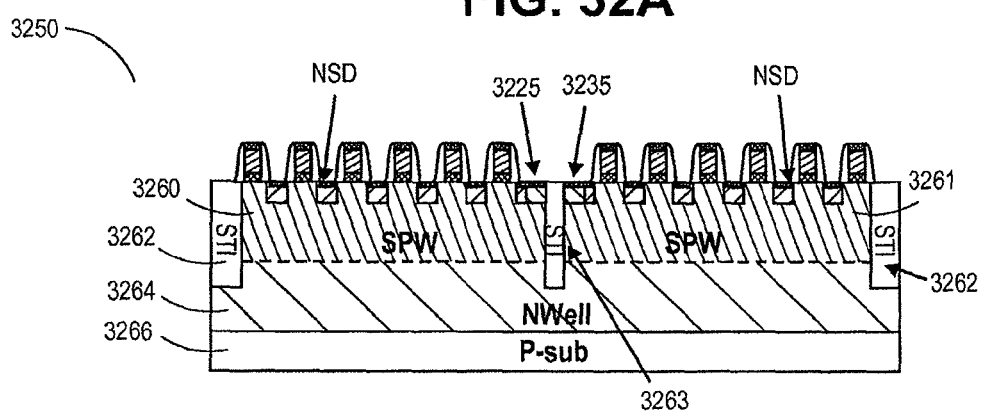
FIG. 32B shows an example of a cross section for the circuit blocks in FIG. 32A.

FIG. 32A illustrates the implementation of dynamic mode switching using a simplified case. FIG. 32A shows a circuit 3200, wherein two circuit blocks, 3220 and 3230, have isolated bodies so that independent body bias can be applied. The body bias for circuit block 3220 can be applied via the body contact 3225, while the body bias for circuit block 3230 can be applied via body tap 3235. The power supply rack for other voltages, similar to the one shown in FIG. 30, is not shown. However, those skilled in the art will easily understand the implementation of a power supply rack for the system in FIG. 32. An exemplary cross section 3250 for such circuit blocks is shown in FIG. 32B, depicting, corresponding to the circuit blocks 3220 and 3230, n-channel devices having shallow P-wells 3260 and 3261 on N-well 3264. The shallow P-wells 3260 and 3261 are isolated between the two circuit blocks by the STI 3263 to create separate shallow wells for the two circuit blocks. The two shallow P-wells 3260 and 3261 are not connected by the underneath N-well 3264, located over P-sub 3266, due to p-n junction effect. A body access transistor is used to create a tap and also isolate a tap from active transistors sharing the SPW well. A p-type contact region 3210 is used for the body contact to provide connectivity to the shallow P-well. The example in FIG. 32B illustrates the use of shallow channel, STI 3262 along with body tap to create isolated multiple circuit blocks for dynamic mode switch. While the example is illustrated for n-channel devices, it can be easily applied to p-channel devices.

Furthermore, it can also be extended to device 3300 illustrated in the example in FIG. 33A having p-channel and n-channel devices together in structure 3310. FIG. 33B represents a scenario in which a CMOS device has two shallow P-wells 3260, 3261, and also has a shallow N-well 3360 with respective body contacts 3325, 3335 and 3345. All are on an N-well 3264. Three circuit blocks are shown: circuit block 3320 and circuit block 3330 are n-channel devices and circuit block 3340 is a p-channel device. Each of the circuit blocks can share the same N-well 3264. Due to the p-n junction effect, the shallow P-wells for circuit blocks 3320 and 3330 can, in some implementations, always isolate from the p-channel devices. There may be more than one p-channel circuit block. However, since the shallow N-well is always connected to the N-well underneath, each of the p-channel devices can have the same body bias. Therefore, in some applications, the shallow N-wells such as 3360 for the p-channel device cannot share the common N-well with other shallow N-well devices. In such applications, the N-well devices cannot be divided into isolated shallow wells when a common well is used. Thus, there may be no need to form individual circuit blocks for the p-channel device from the dynamic power mode switching point of view. In some embodiments, only the n-channel devices may be separately controlled via the body bias mechanism in the single N-well scenario. When the underlying transistors are configured with the high body effect transistors as described herein, the use of body bias can become an effective way to facilitate dynamic mode switching. For the p-channel devices, a shallow N-well in the N-well is optional.

The following figures illustrate a number of circuit examples that may be formed using multiple methods and structures, which can be used as building blocks for integrated circuits according to embodiments discussed herein. The discussion will begin with examples using some building-block processes and structures that are currently used in the industry. Later-described figures will illustrate examples using building-block structures and processes that materially improve on conventional approaches.

Figure 34A:
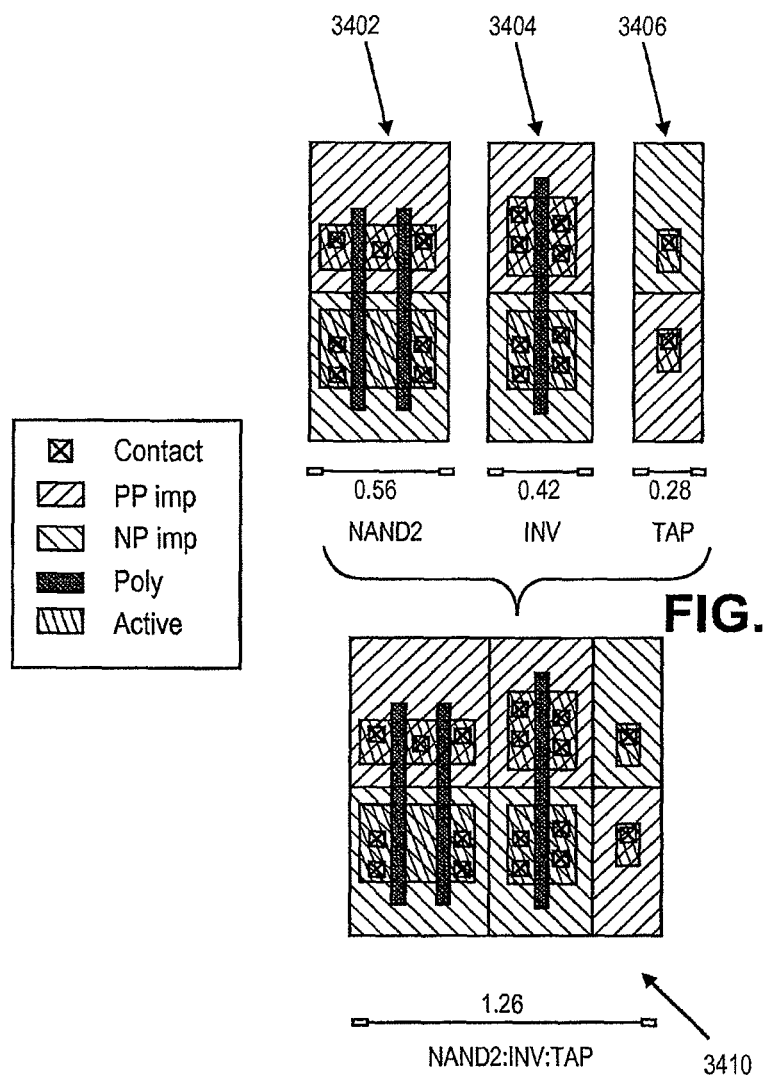
FIGS. 34Ai AND 34Aii show an example of a circuit configured with different commonly used components.

FIGS. 34Ai and 34Aii show an example of a circuit configured with different commonly used circuit components that will be used in later figures to illustrate the implementation of dynamic mode switching. In FIGS. 34Ai and Aii, a combined circuit 3410 is shown having a NAND gate NAND2 3402, inverter INV 3404 (inverter) and body tap TAP 3406. These useful structures may be used according to various embodiments disclosed herein to provide better structured and useful circuits with new and enhanced features.

Figure 34B:
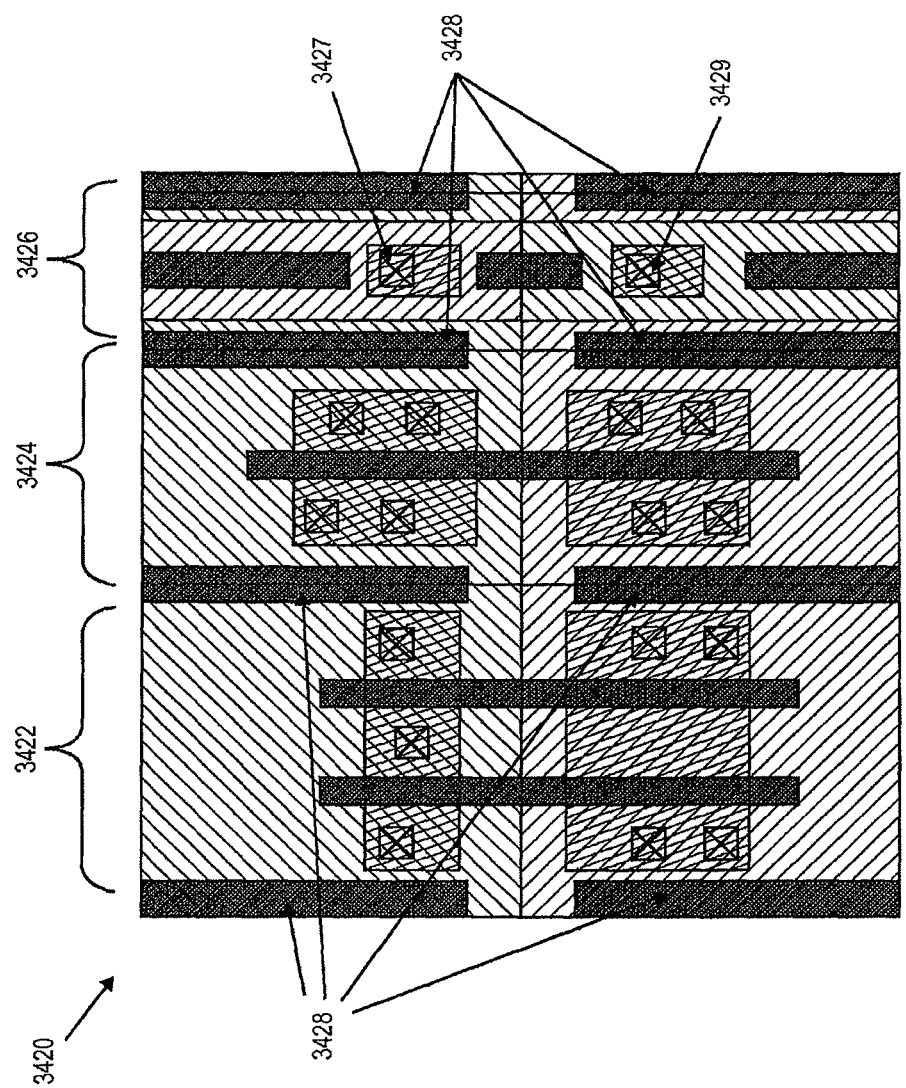
FIG. 34B shows an example of a group of transistors using body access poly according to one embodiment.
Figure 34C:
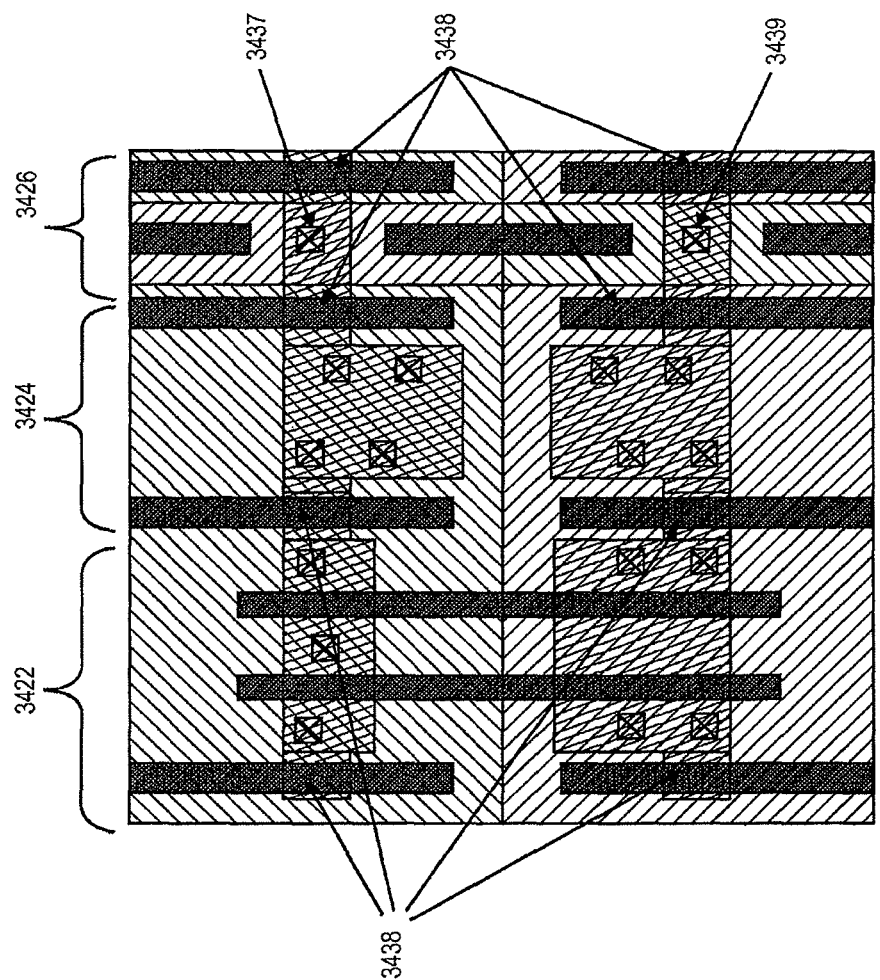
FIG. 34C shows an example of a group of transistors using body access transistor according to one embodiment.

In FIG. 34B, the layout 3420 shows a conventional approach of implementing the group of transistors using dummy poly 3428 to create taps 3427 and 3429 into respective wells. The body tap provides connectivity to the well or substrate which is common for all devices. FIG. 34B shows body taps that extend into the wells. The lower part of the layout shows this part of the device implemented in an n-channel having a shallow P-well on an N-well. The shallow P-well is isolated from adjacent devices by the STI because the depth of the shallow P-well is less than the STI depth. The upper part of the layout shows this part of the device implemented in p-channel having a shallow N-well on a P-well. Again, the shallow N-well is isolated from neighboring devices by STI. Since two separate wells (P-well and N-well) and respective shallow wells are used, the fully complementary device allows separate individual dynamic controls for n-channel devices as well as for p-channel devices. In FIG. 34B, which includes a NAND gate NAND2 3422, an inverter INV 3424 and a TAP 3426, the upper and lower parts of the device have their respective body ties 3427 and 3429. The lower part of the layout shows this part of the device implemented in n-channel having a shallow P-well on a P-well. The upper part of the layout shows this part of the device implemented in p-channel having a shallow N-well on an N-well. FIG. 34C, which includes a NAND gate NAND2 3422, an inverter INV 3424, and a body access transistor TAP 3426, is similar to FIG. 34B except that single body taps 3437 and 3439 are implemented based on novel body access transistor 3438. These novel body access transistors provide a novel configuration that allows access to the transistor body. Unlike conventional device designs, these structures provide meaningful operational capability to the device and circuit.

Figure 34D:
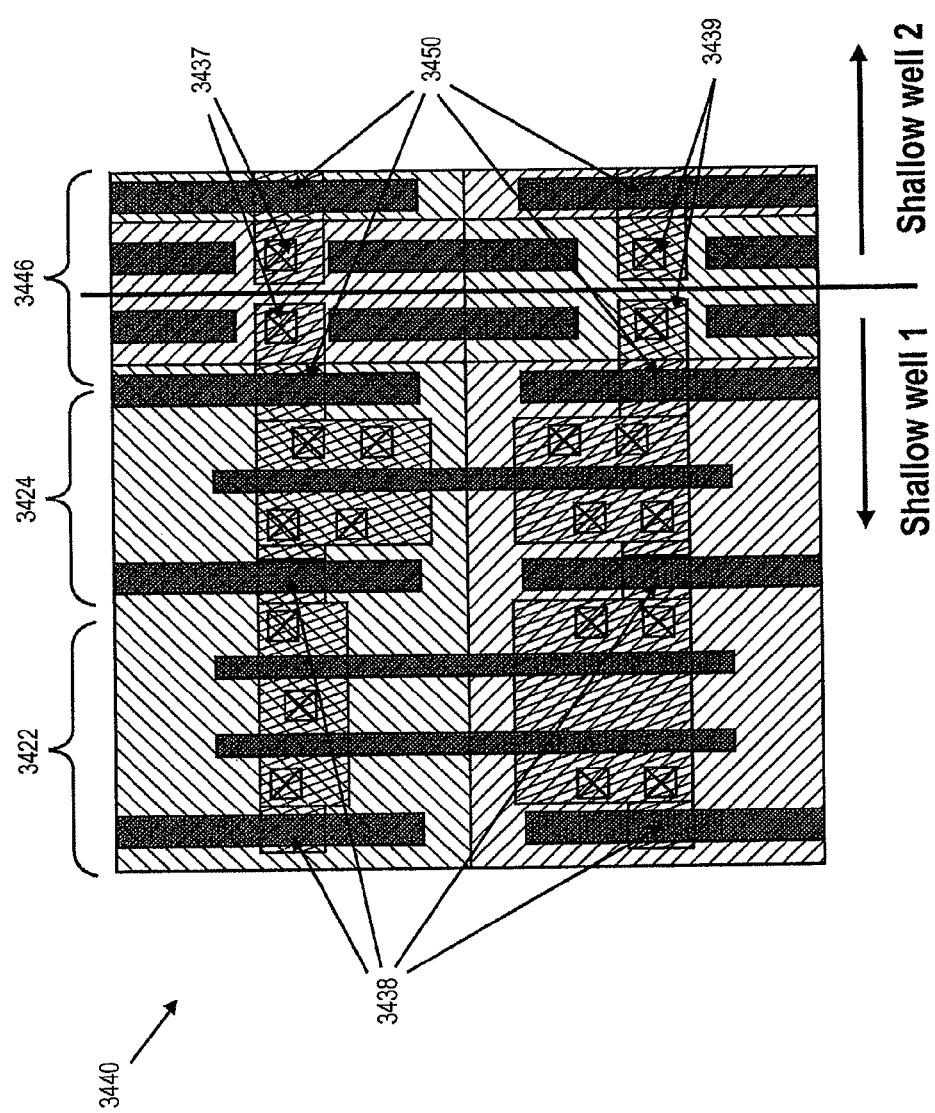
FIG. 34D shows an example of a group of transistors using body access transistors with separate taps according to one embodiment.

FIG. 34D illustrates an example of circuit layout 3440, including a NAND gate NAND2 3422, an inverter INV 3424, and a body access transistor TAP 3446, using body access transistors 3450 to create two body taps 3437 or 3439 separated by the STI to provide connectivity to the respective well. For FIG. 34D, the body access poly is used to implement the connectivity to the body. The body access transistor having two separate body taps are isolated by STI; the left side and the right side of the STI have isolated shallow wells to allow individual body biases connected to the left side and the right side. FIGS. 34Ei, 34Eii and 34Eiii show cross section views 3490 and 3495 corresponding to locations 3482 and 3484 respectively. In cross section view 3490, the n-channel transistors (e.g., 3460) are on shallow P-well 3462 isolated on both sides by STI 3464 and 3465. The shallow P-well 3462 is on an N-well 3466 and the N-well is on a P-substrate 3468. The body taps 3439 are connected to the shallow P-well 3462. The upper part of the device 3440 includes p-channel transistors (e.g., 3470) on a shallow N-well 3472 isolated by STI 3474 and STI 3475. The shallow N-well 3472 is on a P-well 3476, which is on the same P-substrate 3468. The body tap 3437 provides connectivity to the shallow N-well 3472. The device 3440 illustrates an example of an embodiment with fully complementary multiple transistors having isolated shallow wells (3462 and 3472) with separate body taps (3439 and 3437) for dynamic mode control.

While FIG. 34D shows a dynamic mode switching implementation based on transistors configured with DDC, the dynamic mode switching can also be applied to a mixed environment having legacy devices and new devices. FIGS. 35A, 35B and 25C illustrate an example of an implementation using mixed legacy devices and new devices for the same circuit consisting of NAND gate NAND2 3502, INV 3504 and TAP 3506, which includes STIs 3524 and 3534 to separate shallow wells. Again, both N-well and P-well are used. However, both NAND2 and TAP are implemented using the legacy approach where the shallow well is on the well of the same doping type. The NAND2 3502 and TAP 3506 always have common well either on N-well or P-well. Therefore, the shallow well for the NAND2 3502 and TAP 3506 cannot be isolated by STI. This arrangement may only leave the shallow well for the INV 3504 capable of being isolated. Depending on design, the INV 3504 body can be floating (i.e., no body tap provided to connect to the respective shallow well or the body tap is not connected) or connected to a body bias. However, since two separate wells are used, two separate body bias voltages can be applied to n-channel devices on P-well and p-channel devices on N-well.

FIGS. 35A-C also illustrate examples of cross section views 3550 and 3560 at locations 3510 and 3512, respectively. The cross section view 3550 shows both the n-channel transistor and the tap 3516 on shallow P-wells 3522 and 3521. Both shallow P-wells 3522 and 3521 are on P-well 3526, which is on P-substrate 3528. The body tap 3516 provides connectivity to the body for the n-channel transistor. The shallow N-well 3532 for the p-channel in the lower part is isolated and left floating. The cross section 3560 shows both the p-channel transistor and the tap 3514 on shallow N-wells 3533 and 3535. Both shallow N-wells 3533 and 3535 are on N-well 3536, which is on P-substrate 3538. The body tap 3514 provides connectivity to the body for the p-channel transistor. The shallow P-well 3523 for the n-channel in the upper part is isolated and left floating. Body taps for the p-channel devices in shallow N-well 3532 and the n-channel devices in shallow P-well can be added with body access transistors as described before.

Figure 36:
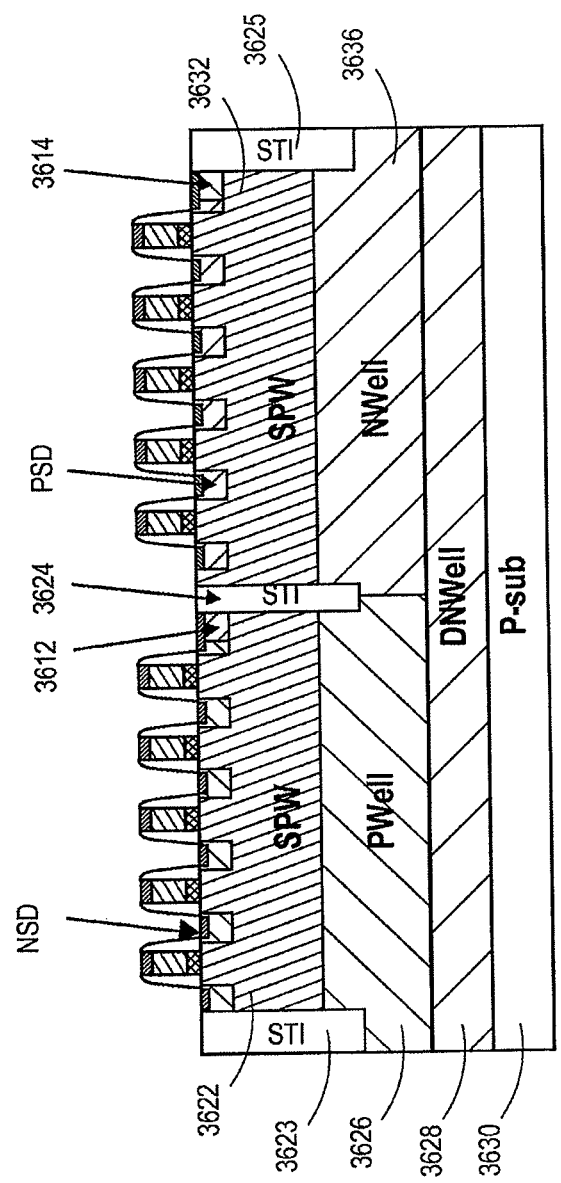
FIG. 36 shows an example of another multi-mode switch circuit based on a legacy approach.

FIG. 36 illustrates an example of an implementation based on the legacy approach where two separate wells are used. The n-channel transistors are on shallow P-well 3622 isolated by STI 3623 and 3624. Since the shallow P-well 3622 for all re-channel transistors is on P-well 3626, the shallow P-well 3632 will be isolated from neighboring circuits between STI 3624 and STI 3625 because the P-well provides conductivity among the n-channel transistors on other shallow P-wells. Both the P-well 3626 and the N-well 3636 are on a deep N-well 3628, which is on a P-substrate 3630. Body access contacts 3612 and 3614 are also shown.

The preceding examples illustrate various dynamic mode switching implementations using bulk CMOS. Nevertheless, the novel body tie design can also be applied to a semiconductor device using a non-CMOS bulk device. For example, the body taps can be formed on the partially depleted (PD) SOI technology, as shown in FIGS. 37A, 37B and 37C, which includes a NAND2 3722, an INV 3724, and a TAP 3746. The circuit 3700 is similar to FIG. 34D where body access transistors are used to create separate body taps 3712 and 3714. FIGS. 37A-C also show cross section views 3740 and 3760 corresponding to the layout along locations 3716 and 3718. The lower part of the circuit 3700 is associated with n-channel devices on P-well 3744 isolated by STI 3743 and 3745. Thus, it can allow formation of multiple isolated P-wells on the SOI so that body biases can be applied to the respective circuit blocks independently. The upper part of the circuit 3700 is associated with p-channel devices on N-well 3764 isolated by STI 3747 and 3749. Thus, it can allow formation of multiple isolated N-wells on the SOI so that body biases can be applied to the respective circuit blocks independently. Both the P-well 3744 and N-well 3764 are on Buried Oxide (BOX) 3748. This construction facilitates the ability to separately bias a group of transistors or related switchable devices, according to various embodiments described herein.

Static random access memory is widely used in, or in association with, various digital processors, such as central processing units (CPUs), microprocessors/microcontrollers, digital signal processors (DSPs), field programmable gate arrays (FPGAs) and other devices. There are several device structures in wide use in the industry. Among them, the 6T-SRAM (6-Transistor SRAM) cell is most often used because it can be implemented using generic CMOS processes. Consequently, it can be easily embedded into any digital processor. Utilizing the novel structures discussed above, an improved SRAM can be configured with better performance, and reduced circuit area. By implementing novel body taps, body access transistors, and/or the novel DDC structures, a significantly improved SRAM can be produced using well known processing equipment and facilities. Also, some of these SRAM circuit embodiments may be made using the novel DDC structured transistors, and also other types of transistors in combination with the novel DDC structured transistors. And, some of the embodiments herein may be configured without DDC configured transistors while still benefiting from improved SRAM performance and features.

Figure 38:
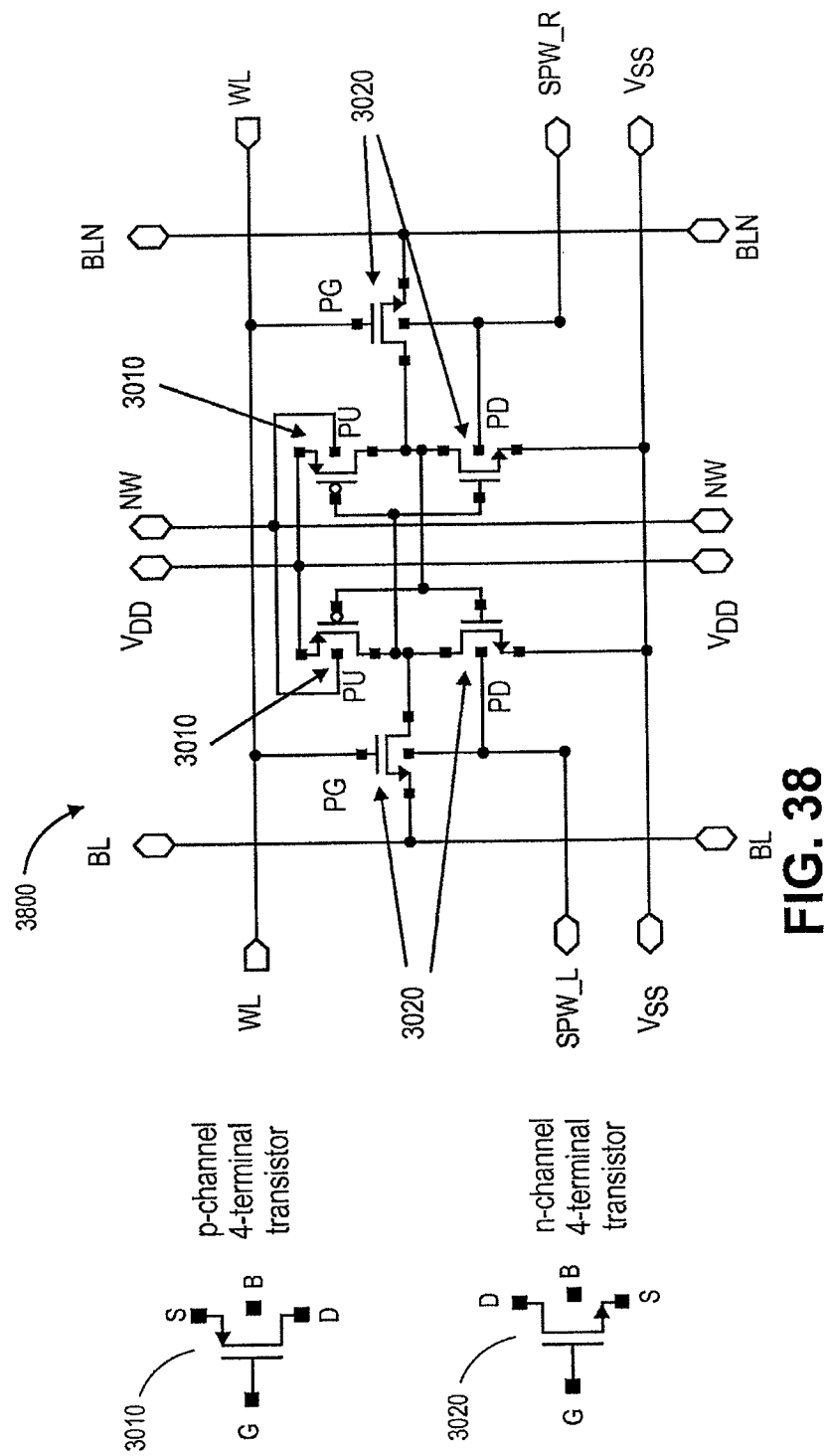
FIG. 38 shows an example of a 6T SRAM cell according to one embodiment.

In one embodiment, the basic 6-T SRAM cell includes two pull-up (PU) transistors and two pull-down (PD) transistors that store one bit of data and use two pass gate (PG) transistors to control the bit_line and the inverted bit_line. An example of this is shown in FIG. 38, structure 3800. The pass transistor switching can be controlled by a word line, allowing design of an SRAM that has low operating power consumption as well as low leakage current. In the example of 6T SRAM in FIG. 38, the PU transistors are implemented using p-channel 4-terminal transistors 3010 while others are implemented using n-channel 4-terminal transistors 3020. FIG. 38 also shows various signals and power supplies for the 6T SRAM, including Word Line (WL), Bit Line (BL), Bit Line Negation (BLN), $V_{SS}$ and $V_{DD}$. FIG. 38 also shows that connections to the body for the n-channel transistors (shallow P-well, SPW) and the body for the p-channel transistors (N-well, NW) can be provided.

Memory access can consume significant amounts of power in an electronic system. There have been efforts in the field to develop implementations and systems for lowering power consumption during memory access as well as during data retention. SRAM is typically used in a computer system for program as well as data storage. During program execution or data access, part of the memory may be actively accessed while other parts may be idle. It would be beneficial if the mode of operation for an SRAM could be dynamically switched at a fine granularity. In one embodiment, the body of each cell may be structurally isolated so that the bias of the cell can be individually controlled. In practice, a row of cells may be controlled together by connecting the source voltage for the row. In addition to the $V_{SS}$ based 6T SRAM mode switch control and the body tap and body access transistor techniques described above, this is another approach to create a multi-mode enabled SRAM. The approach can be implemented for use in an SRAM, for instance, by breaking the shallow well diffusion for a block of cells using body access transistor technology. A desired body bias can be selectively applied to the block of SRAM cells via the body tap to determine the desired mode of operation.

In order to create a dynamic multi-mode SRAM array, examples of embodiments are provided that use component building blocks. These blocks include various 4-terminal, 3-terminal, and programmable 3/4-terminal transistors. These building blocks together with various body connection structures may be combined to build improved SRAM circuits that operate more efficiently. For example, body access transistor can be formed by converting poly over STI into a transistor, while treating the body tap as one of the source/drain pairs. The body access cell can be added to surrounding areas to isolate the shallow well of an SRAM array so that the body bias can be individually applied to the SRAM array. An example of a 6T SRAM implementation and associated body access transistors along with the process of connecting the SRAM cells and the body access cells to create a dynamic multi-mode SRAM array is described below.

Figure 39:
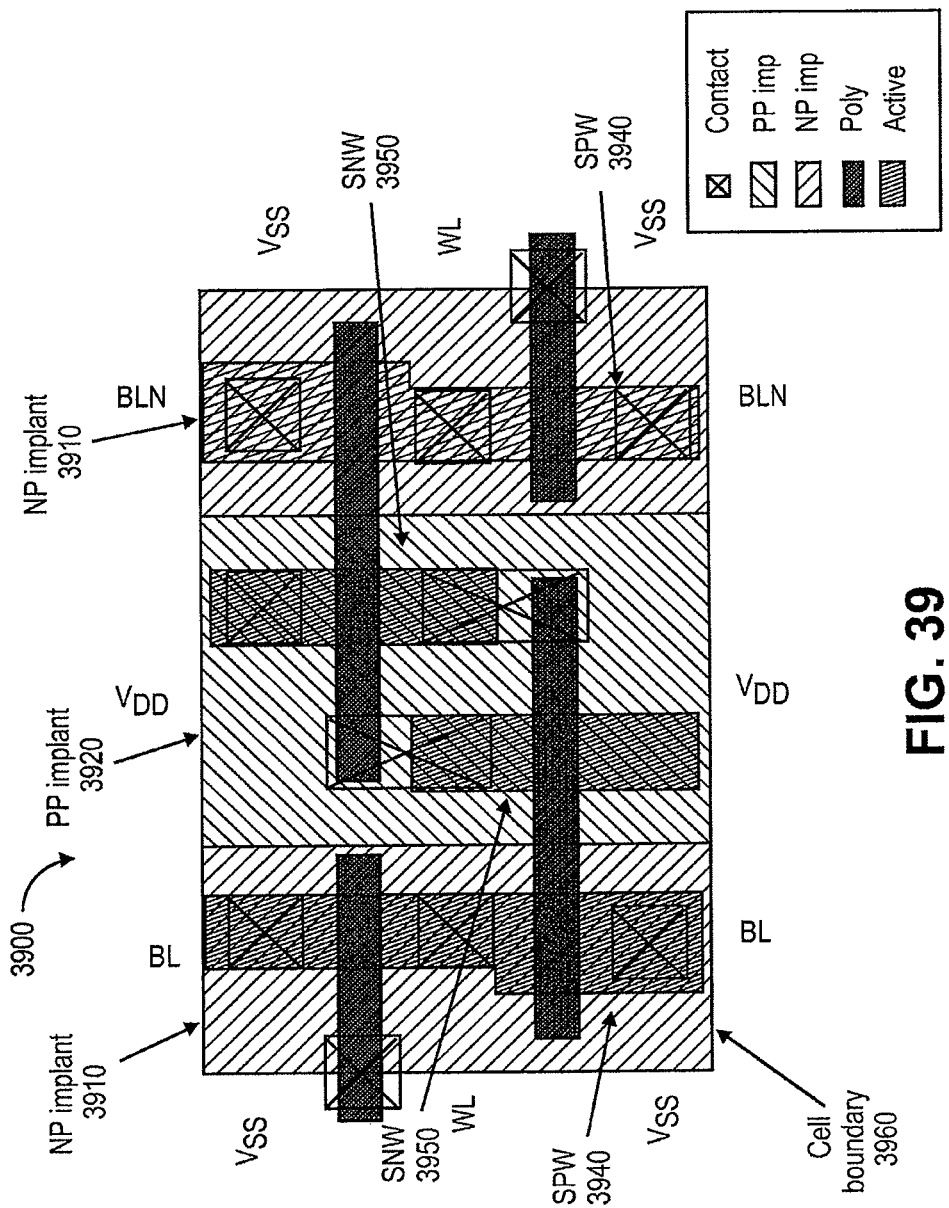
FIG. 39 shows an example of a layout example for the 6T SRAM of FIG. 38.

FIG. 39 illustrates a layout example for the 6T SRAM of FIG. 38. The 6T SRAM cell contains 6 transistors, where PG indicates the locations of pass-gate transistor, PD indicates the locations of pull-down transistors, and PU indicates locations of pull-up transistors. The PD and PG transistors are n-channel transistors and are formed in the N+ implant region 3910 and the PU transistors are p-channel transistors formed in the P+ implant region 3920. The n-channel transistors are formed on shallow P-well 3940 while the p-channel transistors are formed on N-well 3950. Use of a shallow N-well in N-well 3950 is optional in the implementation of this embodiment. The signal line and power supply lines are shown in FIG. 38, and also other figures.

Figure 40B:
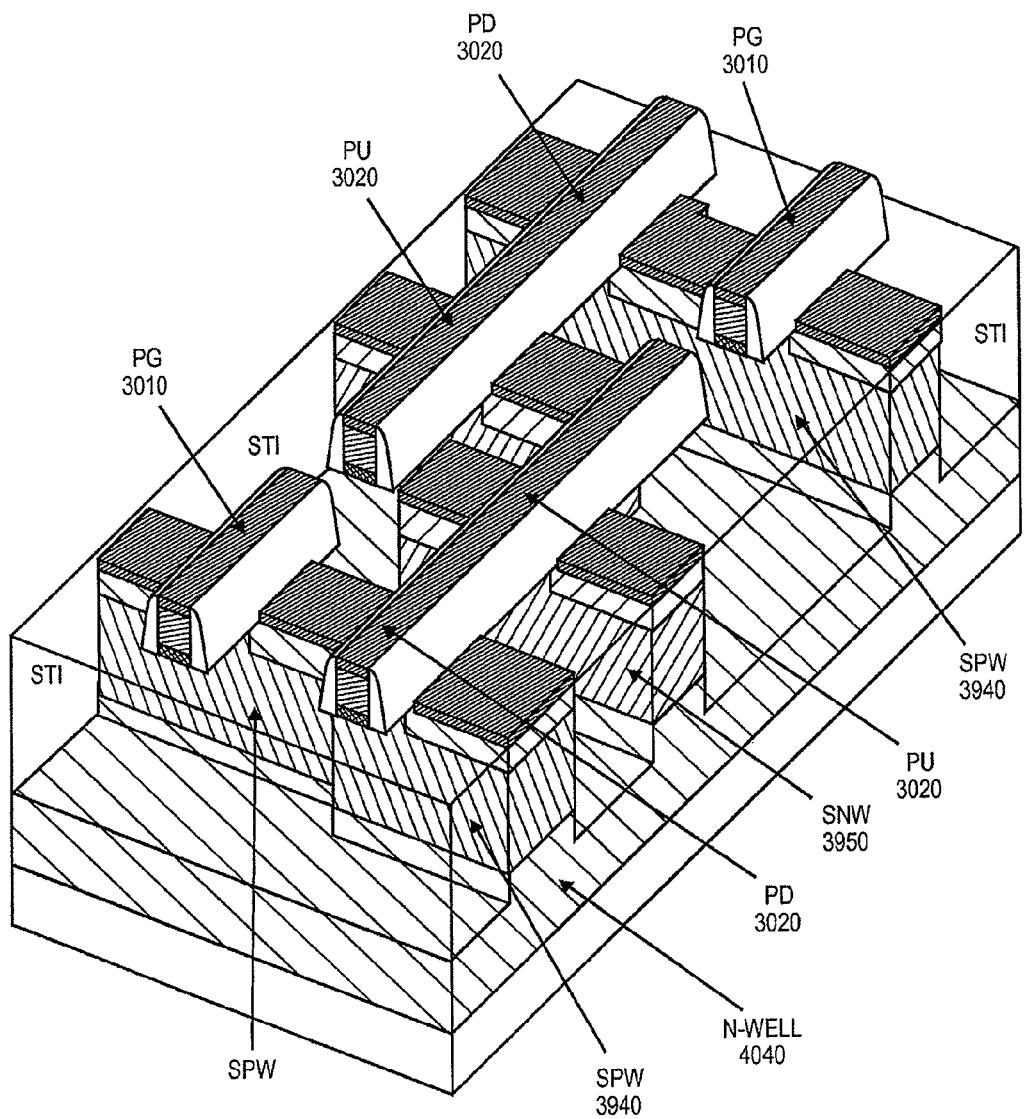
FIG. 40B shows an example of a perspective view of the 6T SRAM cell corresponding to FIG. 39.

Cross sections of one preferred layout for a SRAM cell structure 3900 are shown in FIGS. 40Ai, 40Aii and 40Aiii. The cross section view 4010 corresponds to the line 4015, where a PG transistor and a PD transistor are located. Additional PG and PD transistors are located toward the other end of the SRAM cell and have similar cross section views. The cross section view 4010 also shows that the transistors have a shallow P-well 3940 on an N-well 4040. The N-well is on a P-type substrate 4050. The cross section view 4020 corresponds to the line 4025, where a PU transistor is located. The cross section shows that the PU transistor has a shallow N-well 3950 on the N-well 4040. The shallow N-well 3950 for the p-channel transistors is on a well (N-well) with the same type of dopant. Therefore, the shallow N-well and the N-well may be conductively connected. Shallow N-well in N-well is optional. However, for the n-channel device, the shallow P-well 3940 may be isolated from the N-well 4040 beneath it. A 3D view of the 6T SRAM cell corresponding to FIG. 39 is shown in FIG. 40B, where the well structure and transistor types are labeled.

Figure 41A:
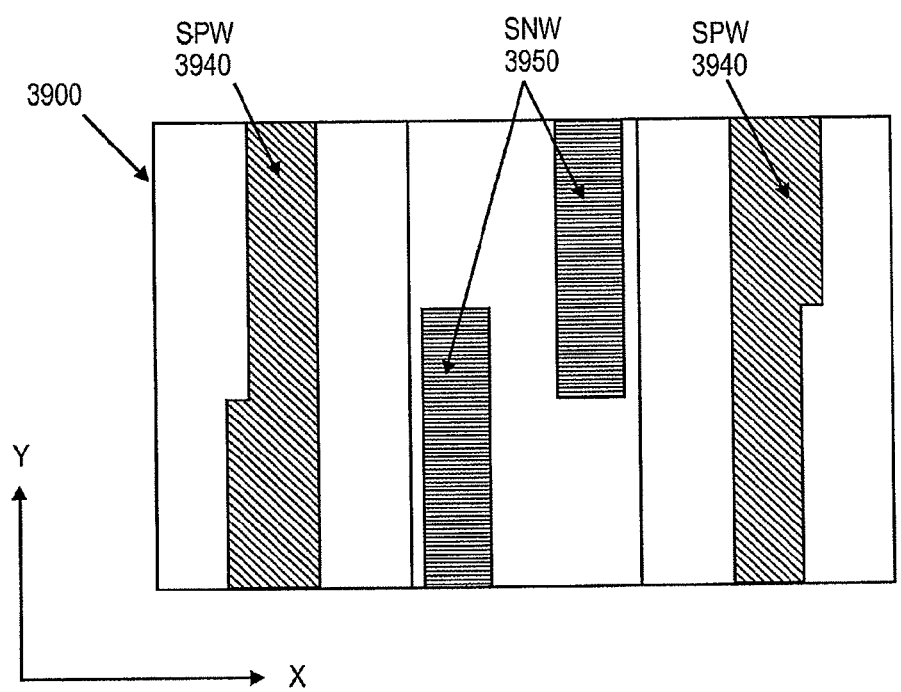
FIG. 41A shows an example of a top view of the well corresponding to FIG. 39.
Figure 41B:
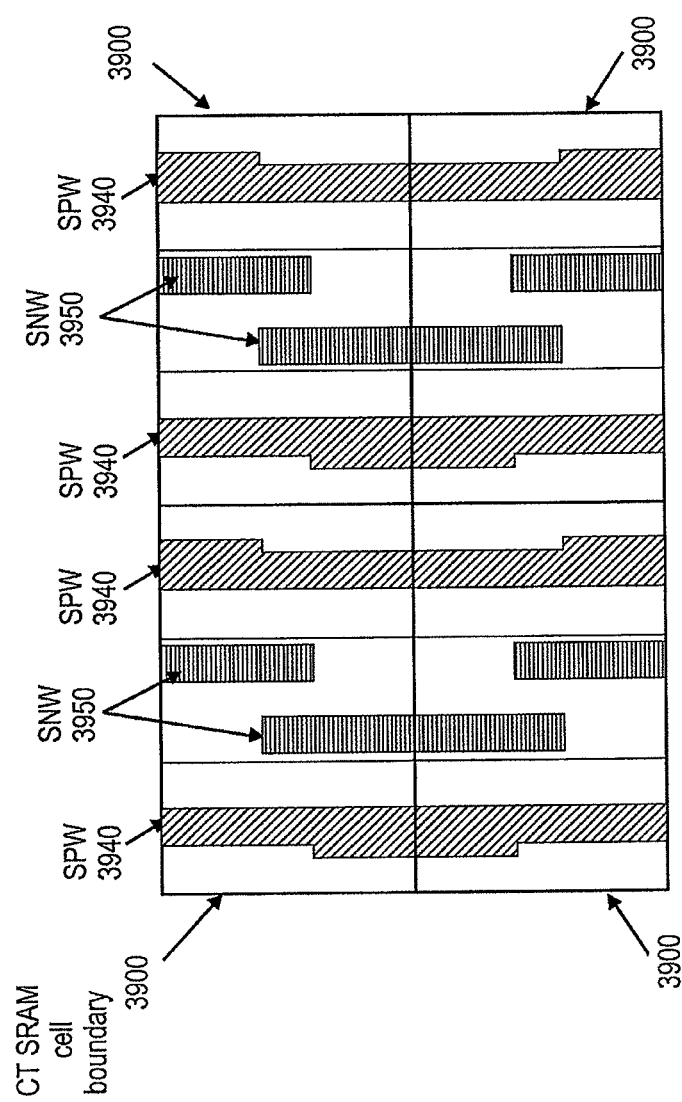
FIG. 41B shows an example of 6T SRAM cells stacked up to form a 2×2 array according to one embodiment.

FIG. 41A illustrates an example of a top view of one preferred well structure (the N-well is not shown because it extends throughout the entire cell area). For the 6T SRAM layout of FIG. 39, the shallow P-well extends from end to end in the y direction, where x and y represent arbitrary directions characterizing the relative orientation of the 6T SRAM cell. FIG. 41B illustrates the 6T SRAM cells stacked up to form a 2×2 array, where one of two neighboring cells in the y direction is flipped in the y direction to form a mirror image of the cell. As shown in FIG. 41B, the shallow P-well 3940 becomes continuous from cell to cell in the y direction. Therefore, if a large number of cells are connected in the y direction, all the cells will share the same shallow P-well. In order to add granularity for dynamic mode switch, there is a need to use a structure to break the continuity of the shallow P-well 3940. The tap cell serves the purpose of isolating the shallow P-well as well as providing connectivity to the shallow P-well.

Figure 42:
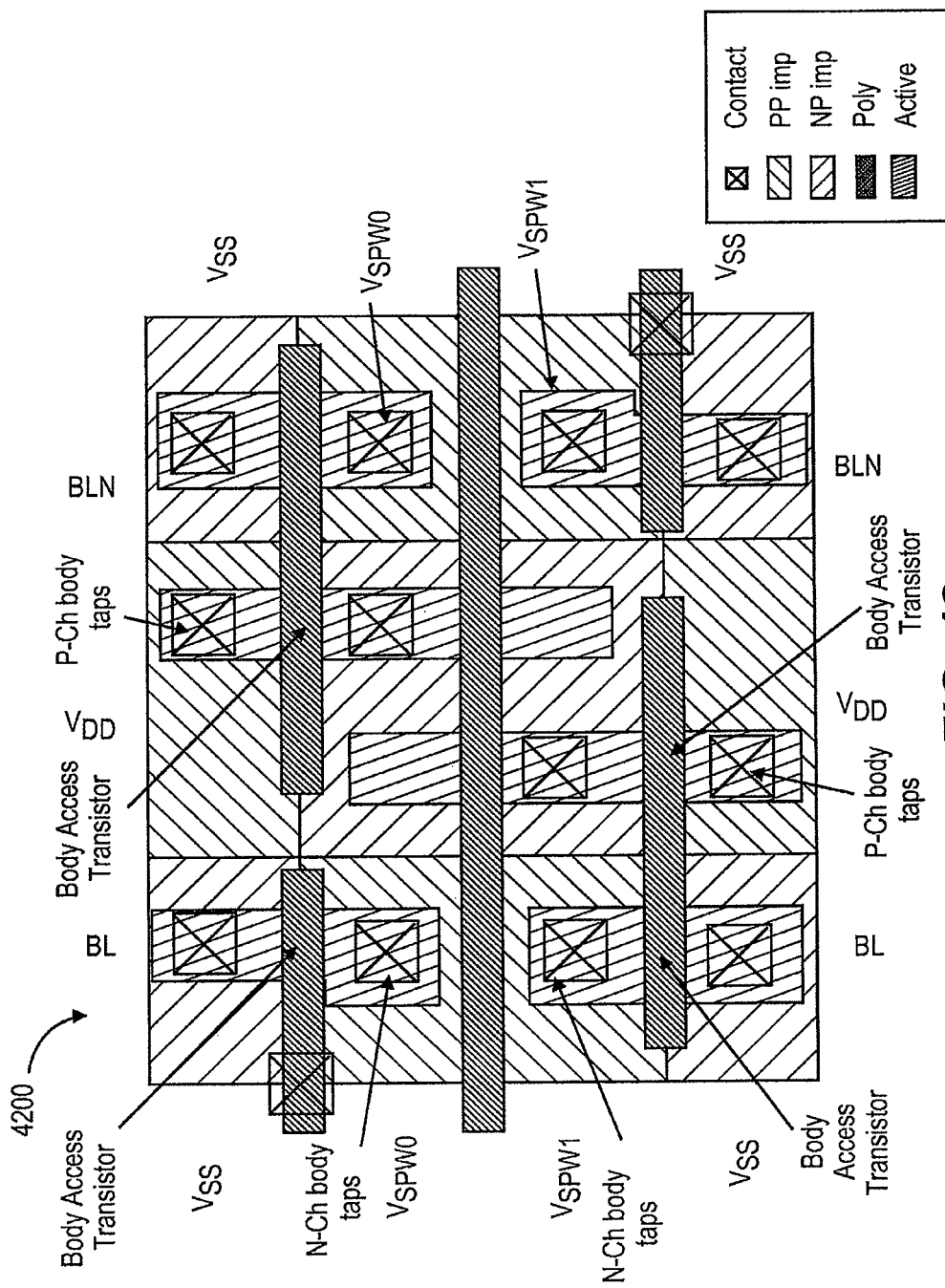
FIG. 42 shows a layout example of a tap cell usable in conjunction with embodiments described herein.
Figure 43A:
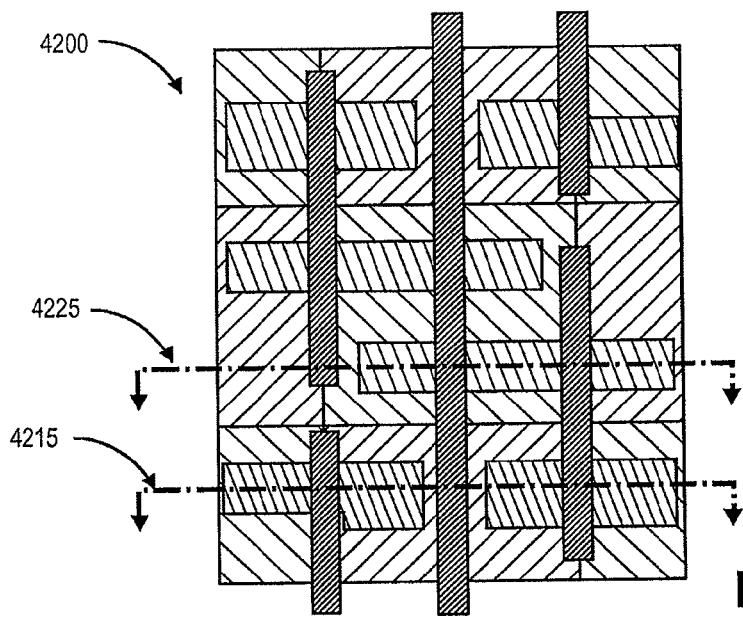
FIGS. 43A, 43B and 43C show an example of cross sectional views corresponding to FIG. 42.
Figure 43B:
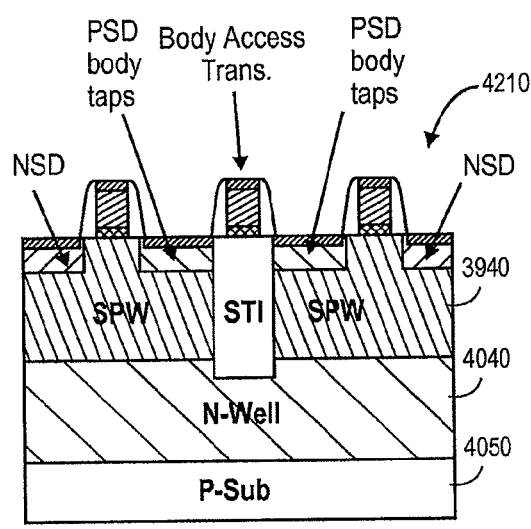
Figure 43C:
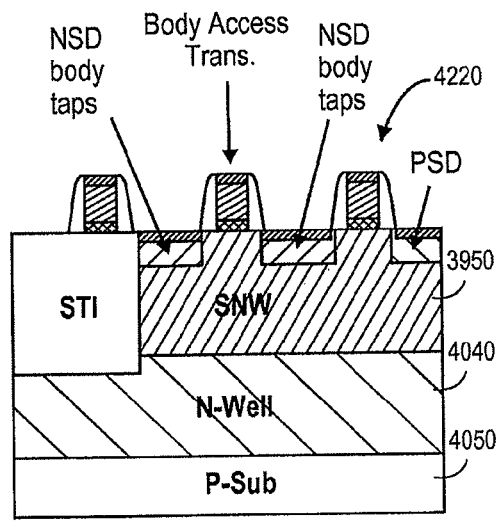

FIG. 42 illustrates a layout example of the tap cell that could be used in conjunction with embodiments described herein. The layout is designed to match the SRAM cell layout described below. The upper part and the lower part of the tap cell have isolated shallow P-wells so they can be individually connected to a respective supply for body bias (shown as VSPW0 and VSPW1). FIGS. 43A, 43B and 43C illustrate examples of cross section views at two locations as indicated by the dashed lines, where the drawing is rotated. The cross section view 4210 corresponds to the cut out view at location 4215. The shallow P-well 3940 on the left side can be isolated of conductivity from the shallow P-well 3940 on the right side of the STI. This shallow well isolation can allow different body biases applied to the two shallow wells. In order to create a contact to the shallow P-well, a p-type implant is used for the body access transistor source/drain region. Since this p-type source/drain region has the same doping type as the shallow P-well, conductivity is made from the p-type source/drain (i.e., body tap) to the shallow P-well. The cross section view 4220 corresponds to location 4225. Since the body tap region is doped with the same doping type as the shallow N-well, the body tap creates connectivity to the shallow N-well. The well structure of cross sections 4210 and 4220 is similar to that of cross sections 4010 and 4020, respectively.

Figure 44:
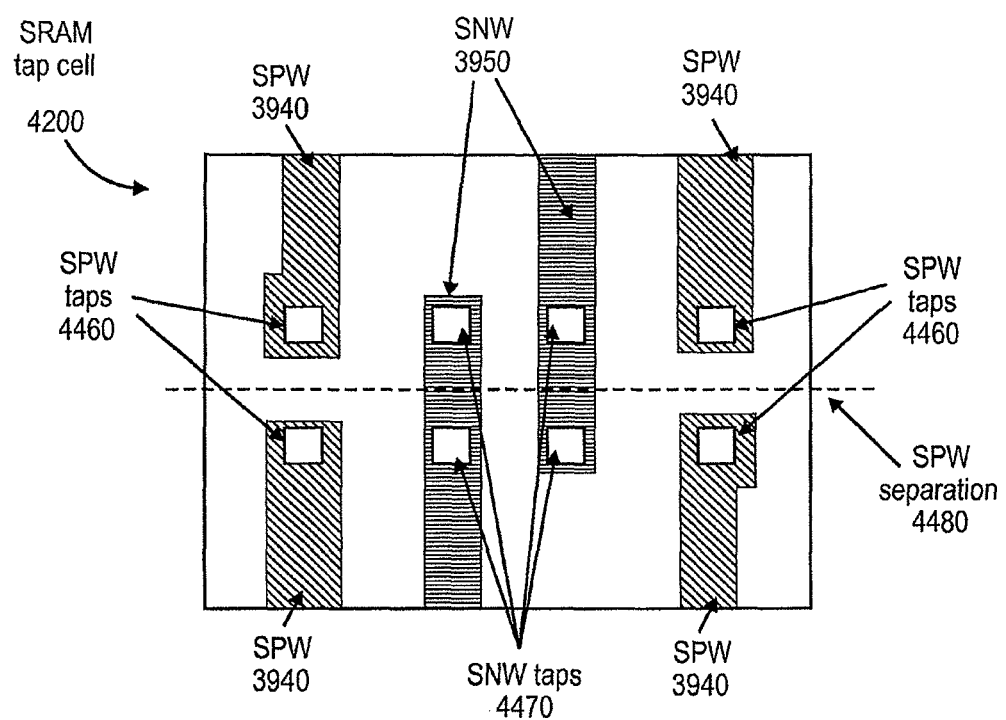
FIG. 44 shows an example of a top view of the tap cell of FIG. 42.
Figure 45:
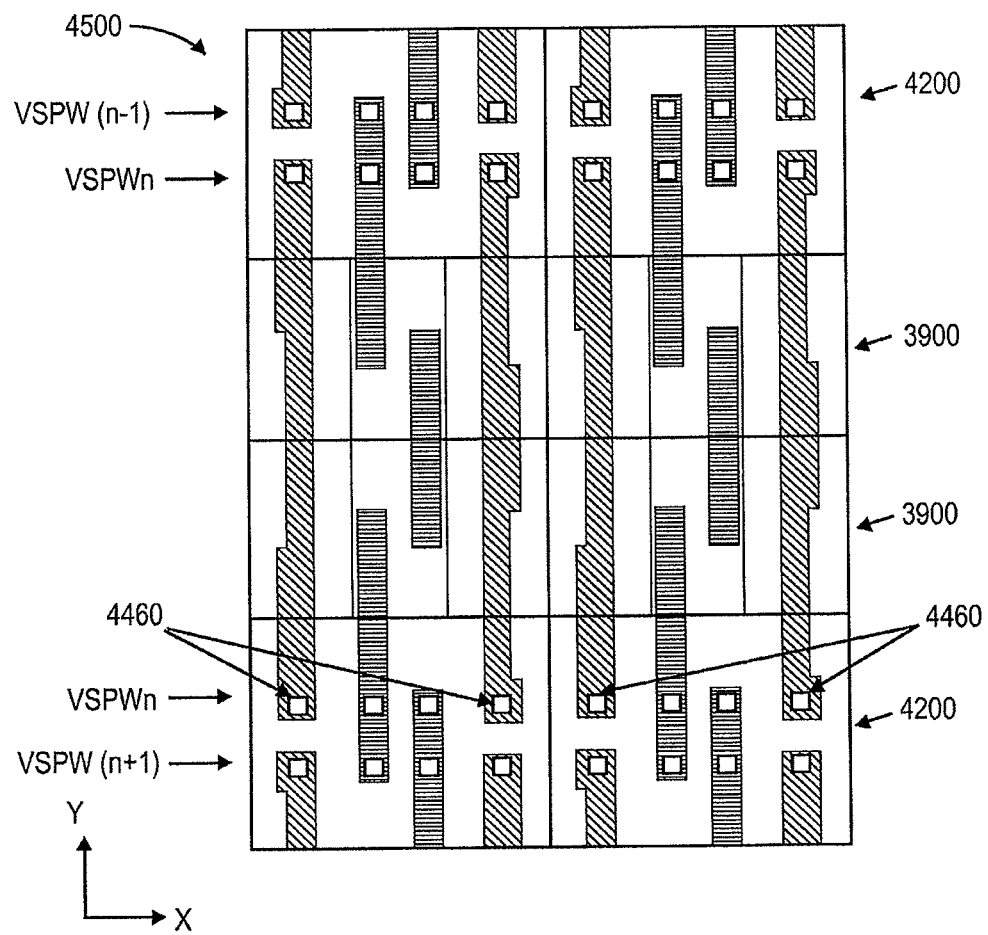
FIG. 45 shows an example of forming a 2×2 SRAM array according to one embodiment.
Figure 46:
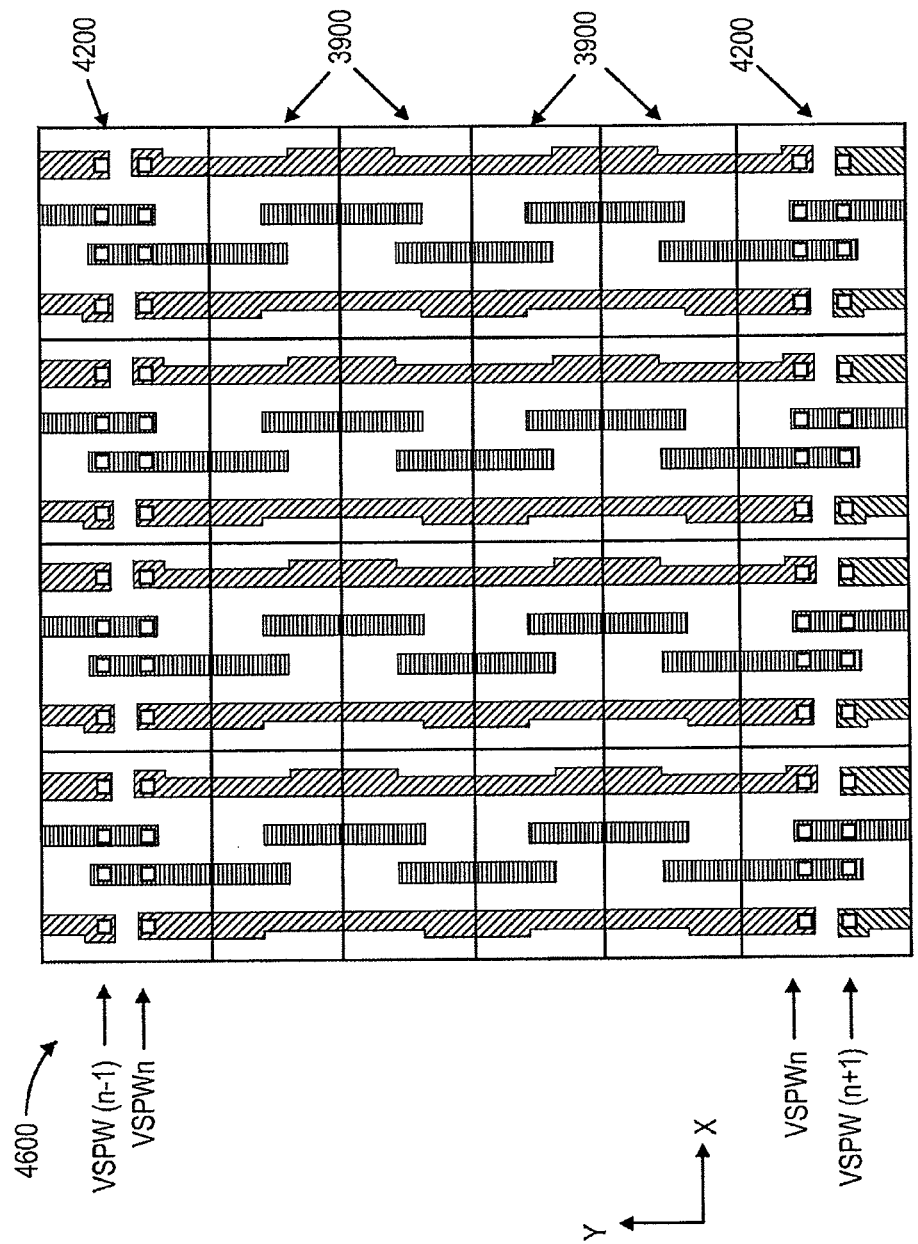
FIG. 46 shows an example of a 4×4 SRAM array using tap cells for SPW isolation according to one embodiment.

FIG. 44 illustrates an example of a top view of the tap cell of FIG. 42. Unlike an SRAM cell where the shallow P-well 3940 extends end to end, the shallow P-wells 3940 for the tap cell on the upper side can be isolated from those on the lower side at the dividing line 4480. The isolation of the shallow N-wells 3950, as before, is not a concern since the shallow N-well is conductively connected to the N-well region beneath it and the N-well extends throughout the entire cell. The tap cell also provides connectivity to the shallow P-well 3940 through SPW taps 4460 and connectivity to the shallow N-well 3950 through SNW taps 4470. FIG. 45 illustrates an example of forming a 2×2 SRAM array 4500 embodying the dynamic mode control feature according to embodiments described herein. The SRAM array consists of 2×2 SRAM cells, and two tap cells on each side of the y boundaries to form SPW taps and isolation. Again, the x-y directions are relative directions to show the array orientation. As shown in FIG. 45, the two neighboring SRAM cells in the y direction have continuous SPW. Further continuity of the SPW beyond the two neighboring cells in the y direction is terminated by STI in tap cell 4200. Therefore, a body bias VSPWn can be applied to the 2×2 SRAM array while body bias VSPW(n−1) can be applied to the neighboring array on the top (not fully shown) and body bias VSPW(n+1) can be applied to the neighboring array on the bottom (not fully shown). FIG. 46 illustrates an example of 4×4 SRAM array 4600 using tap cells for SPW isolation. FIGS. 45 and 46 illustrate the use of SRAM cells having SPW connectivity in the y direction and the use of body access cells (also called tap cells) to terminate the continuity of the SPW. Therefore, a dynamic mode switching SRAM array having a desired size can be formed accordingly.

While FIGS. 45 and 46 focus on examples of the SPW continuity and isolation, many other signals and supply voltages, as described above, are needed to form a complete array. The connection of these signals and supply voltages to the SRAM array are well known in the field by those skilled in the art and the details will not be presented here. In a fully connected 4×4 SRAM array corresponding to FIG. 46, the Word Line (WL) signal can be connected to each row of the SRAM array and the Bit Line (BL) signal can be connected to each column of the SRAM array.

The body control signals (VSPWn) can run parallel to the word line. During operation of the SRAM array, body bias of the selected word group can be switched to positive if any word in the selected word group is selected. This helps improve read and write performance. All other word groups in the sub-array can have body reverse biased (or zero biased) for leakage reduction when reading or writing from a particular word group.

In some usages of the 6T SRAM using body tap/body access cell to facilitate mode switch, the shallow P-well body can be used for dynamic switching while the p-channel body (N-well) can be used for static bias. Any word selected in the group can cause the shallow P-well body of all n-channel transistors in selected word group to switch. The bias for the p-channel and n-channel can be set to zero, and then forward or reverse biased according to desired mode.

The body access cell-based dynamic mode switching SRAM array as described above has advantages in scalable fine granular control. However, this approach will require body access cells in addition to the SRAM cells. There are other methods and systems that do not require the extra body access cell. One of these approaches uses $V_{SS}$ per row while all the cells of the SRAM array in the body access cell based approach share a common Vss. If the $V_{SS}$ can be individually controlled per row, a unique $V_{SS}$ can be applied to each row to create a desired body bias for the row. In this scenario, the body voltage may not be controllable. However, the $V_{SS}$ can be separately controlled to cause different $V_{BS}$ voltage (the voltage between the body and the source) and achieve dynamic mode switching.

Figure 47:
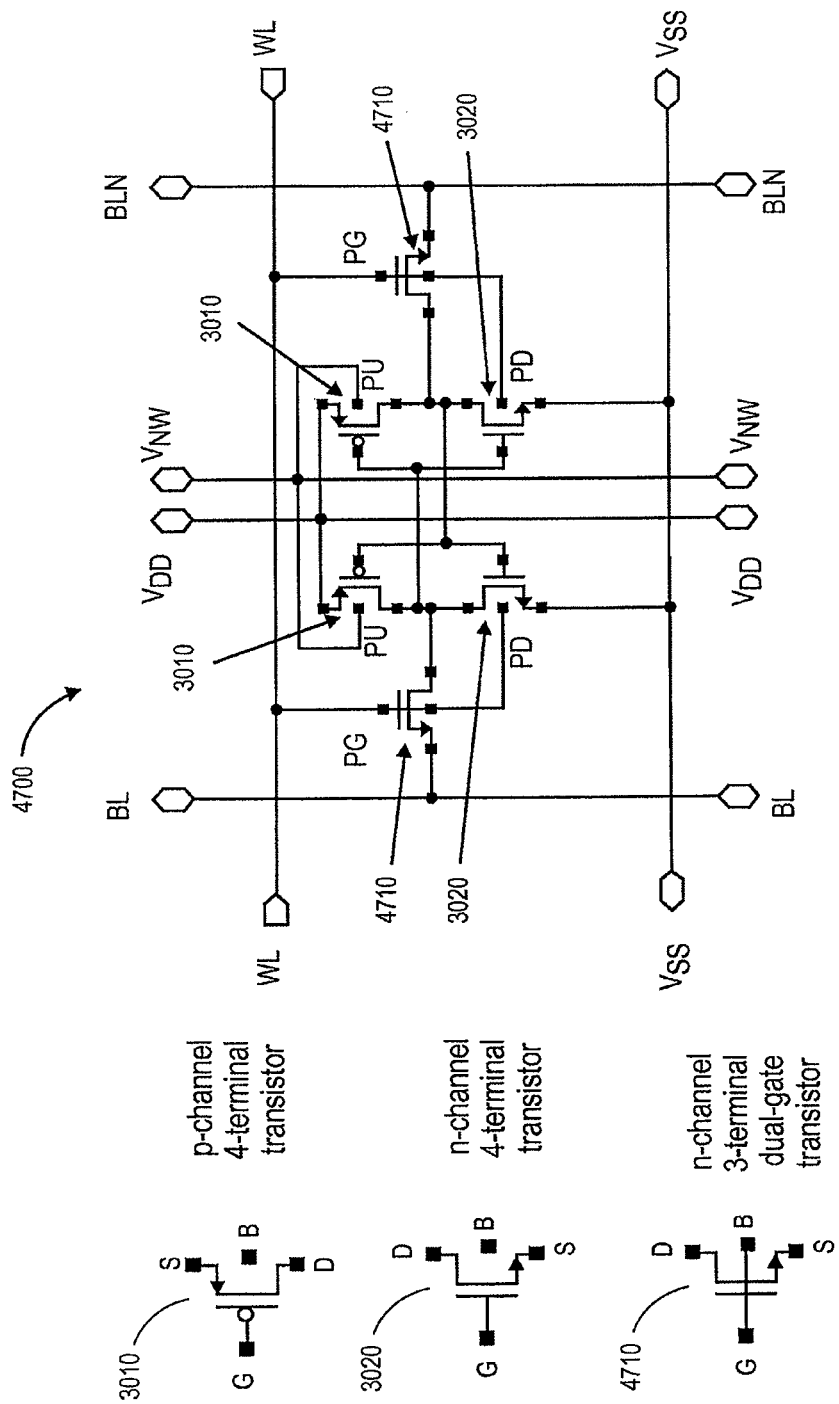
FIG. 47 shows an example of a 6T-SRAM circuit for $V_{SS}$ per row according to one embodiment.
Figure 48:
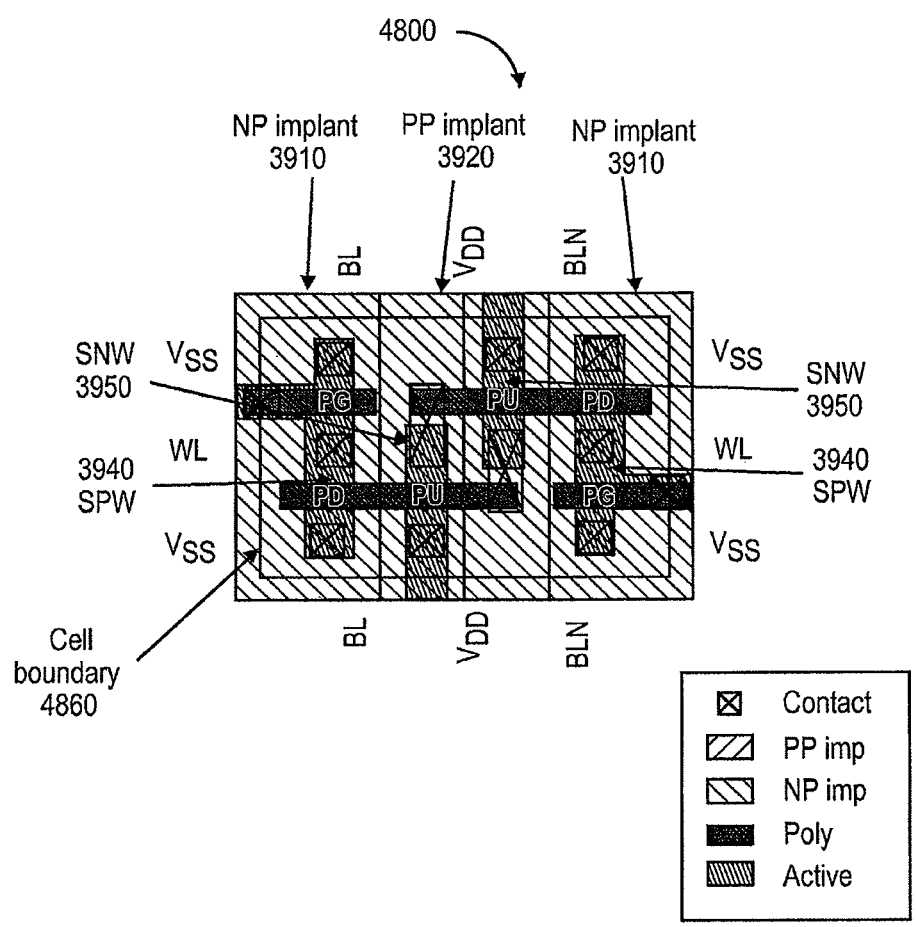
FIG. 48 shows an example of layout of the SRAM cell corresponding to FIG. 47.

FIG. 47 illustrates one example of a 6T-SRAM circuit 4700 for $V_{SS}$ per row based multi-mode switch. Again, the SRAM cell consists of two pull-up (PU) transistors, two pull-down (PD) transistors and two pass-gate (PG) transistors. One of the differences between the example illustrated in FIG. 47 and the 6T SRAM cell of FIG. 38 is that the pass-gate (PG) used in FIG. 47 is an n-channel 3-terminal dual-gate transistor 4710. A layout and corresponding cross section view of 3-terminal dual gate transistor is shown in FIG. 26 and FIG. 27. The dual gate transistor has a gate connected to the body, i.e., the gate of the PG transistor (i.e., the WL) is connected to the body of the cell. The PU and PD transistors are of the same type as in the example of FIG. 38. FIG. 48 illustrates an example of layout 4800 of the SRAM cell of FIG. 47, where the cell boundary 4860 is shown. The n-channel devices for the PG and PD transistors in a shallow P-Well are used while p-channel devices are used for PU transistors. The well structure of this SRAM cell is very similar to that of FIG. 39. Therefore, the cross section views are shown. Both the SPW and SNW are on a common N-well and the N-well is used all over the cell.

Figure 49A:
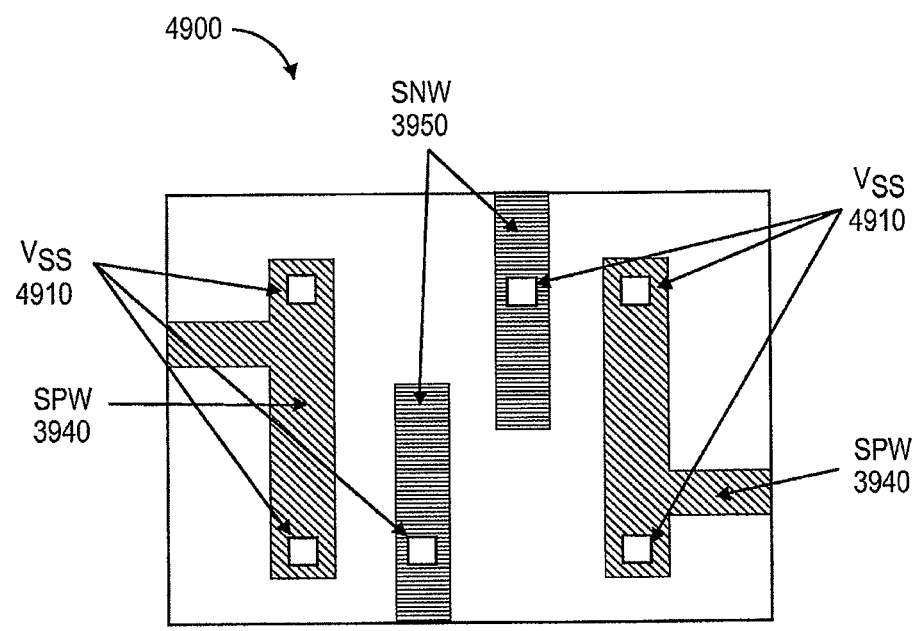
FIG. 49A shows an example of the SPW and SNW of the SRAM layout corresponding to FIG. 48.
Figure 49B:
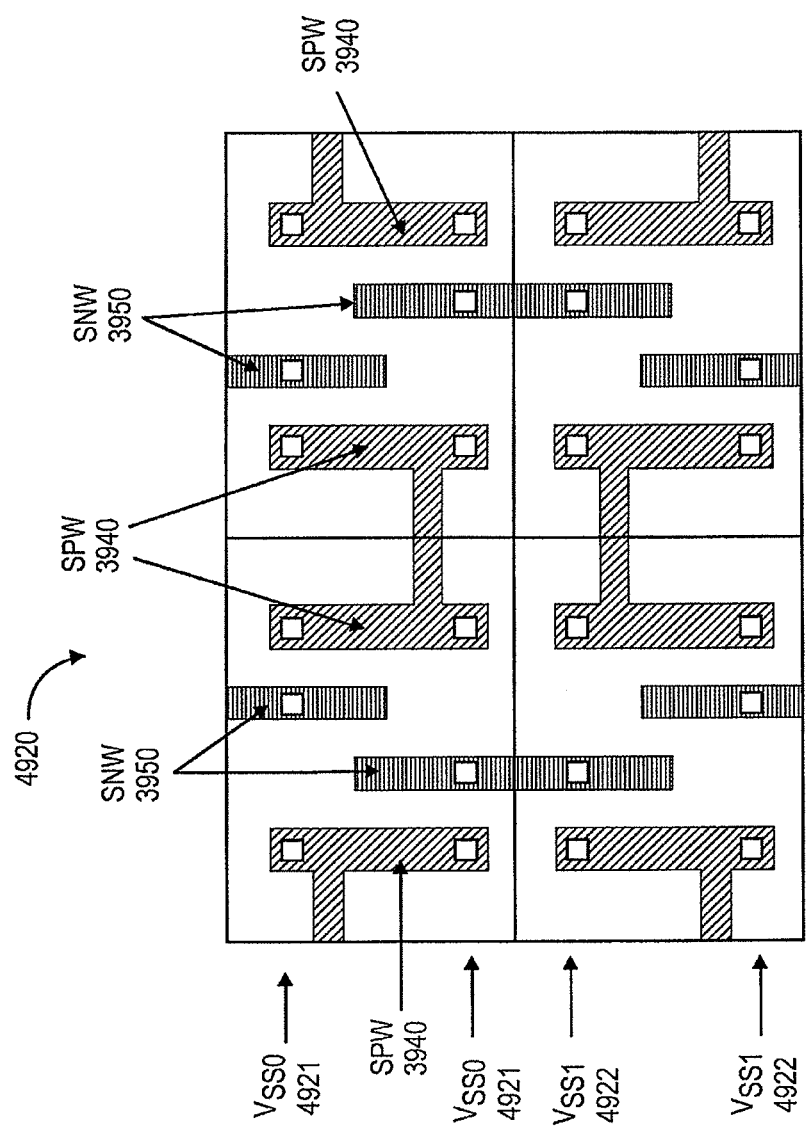
FIG. 49B shows a 2×2 SRAM array having a $V_{ss}$ per row technique according to one embodiment.
Figure 49C:
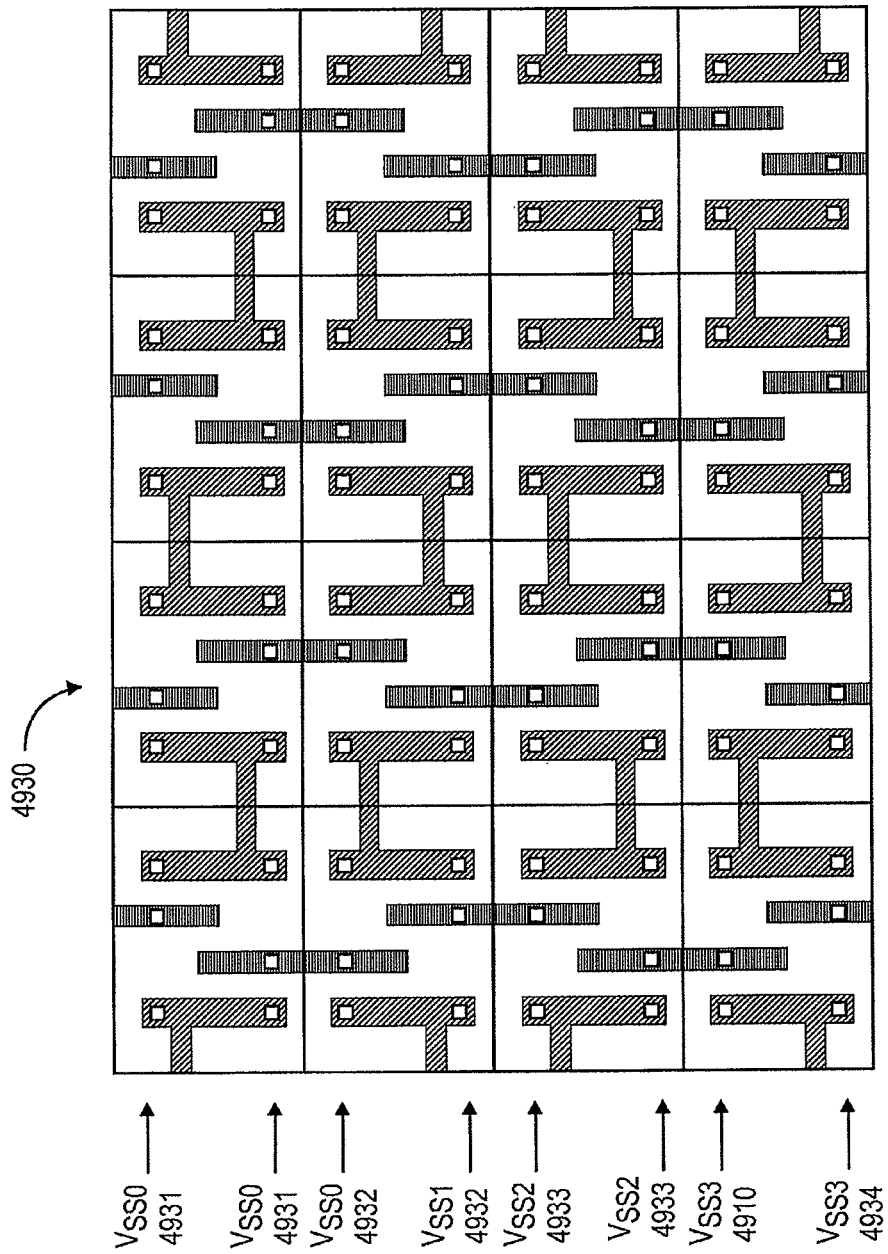
FIG. 49C shows a 4×4 SRAM array having a $V_{ss}$ per row technique according to one embodiment.

FIG. 49A illustrates a structure 4900 showing the SPW and SNW of the SRAM layout of FIG. 48. The $V_{SS}$ contacts 4910 are explicitly shown for this layout. When connecting multiple SRAM cells, the contacts are often connected using metal regions. FIG. 49B illustrates a 2×2 SRAM array 4920 using the SRAM cell of FIG. 48, where the SPW 3940 does not form continuously as the SRAM array of FIG. 45 or FIG. 46. FIG. 49B also illustrates that the $V_{SS}$ is individually connected for each row ($V_{SS0}$ 4921 and $V_{SS1}$ 4922). FIG. 49C illustrates a 4×4 SRAM array 4930 based on the Vss per row technique, where a unique $V_{SS}$ ($V_{SS0}$ 4931, $V_{SS1}$ 4932, $V_{SS2}$ 4933, and $V_{SS3}$ 4934) is used for each row.

In a full layout of the 4×4 SRAM array corresponding to FIG. 49C, similar to the dynamic mode switch 4×4 SRAM array based on the body access cell technique, the Word Line (WL) may be connected on a row-by-row basis while the Bit Line (BL) is connected column-by-column. The Word Line for each row may be connected to the SPW (i.e., the body of the respective device). The $V_{SS}$ may be also connected on a row by row basis. Therefore, an individual body bias can be achieved on a row by row basis. The N-Well body taps may occur every 16 (or 32) word lines.

Figure 50:
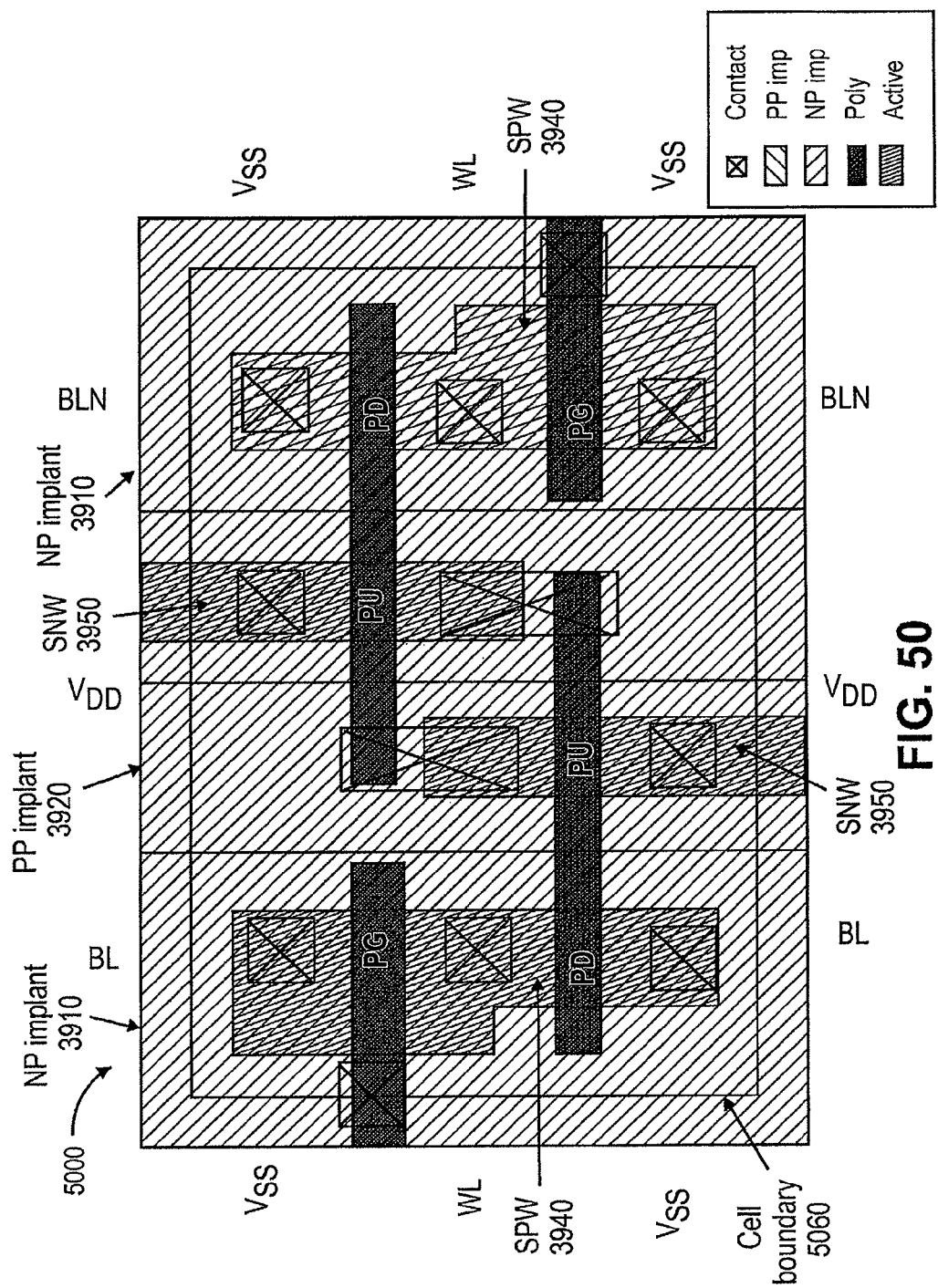
FIG. 50 shows another example of a layout of the SRAM cell corresponding to FIG. 47.
Figure 51A:
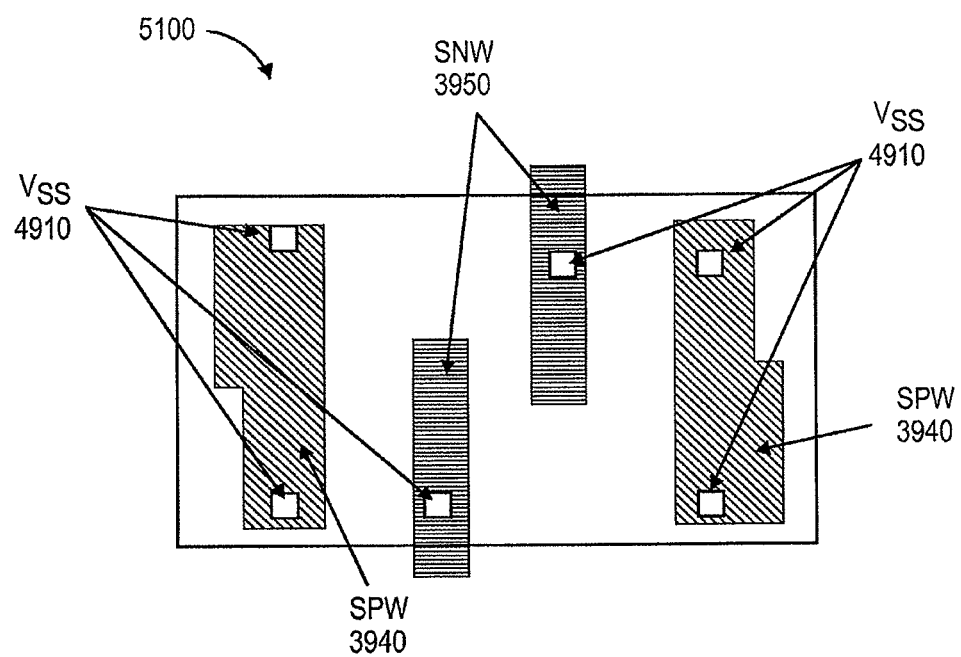
FIG. 51A shows an example of the SPW and SNW of the SRAM layout corresponding to FIG. 50.
Figure 51C:
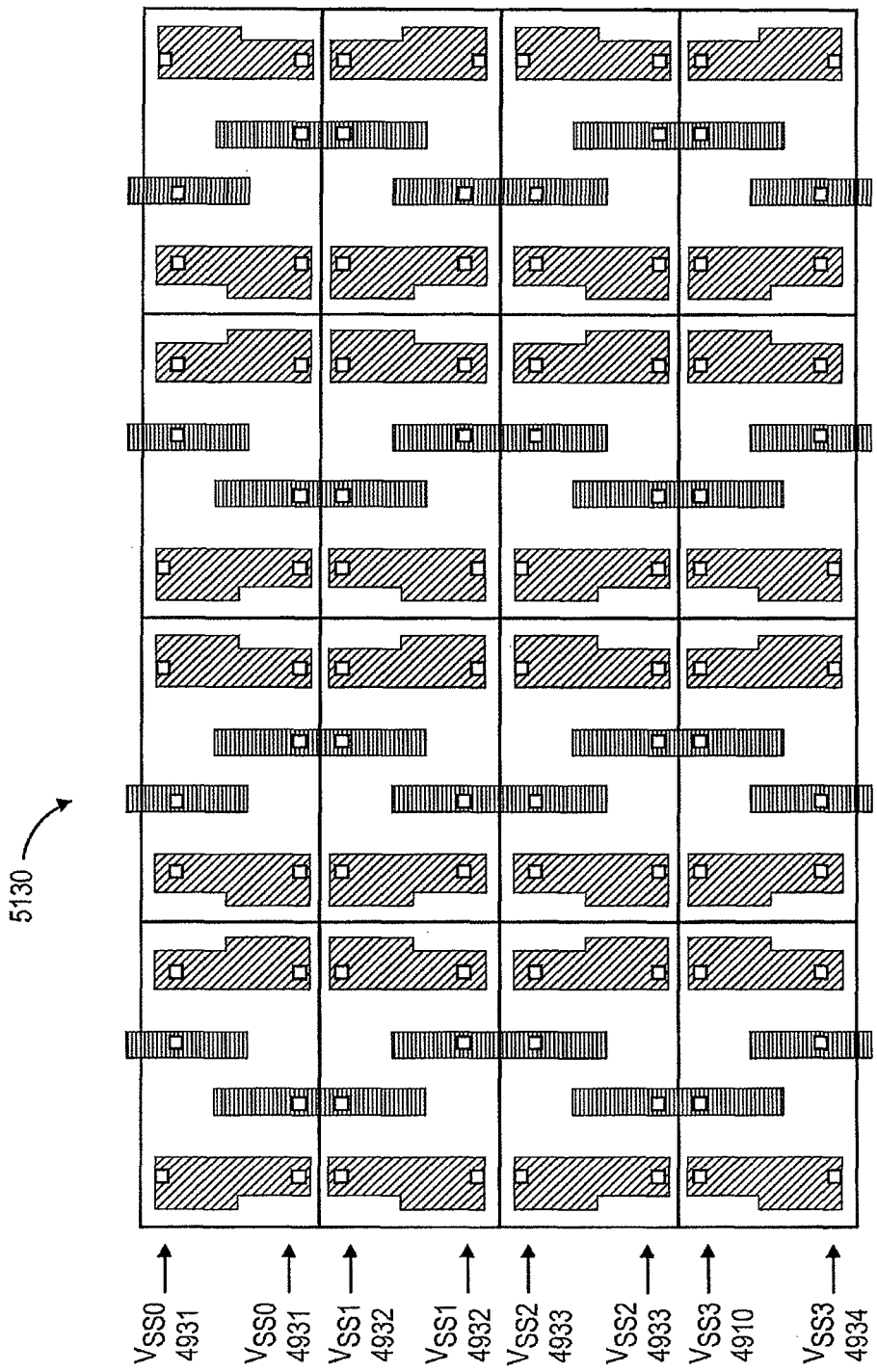
FIG. 51C shows a 4×4 SRAM array having $V_{ss}$ per row according to one embodiment.

An alternative implementation of the $V_{SS}$-based mode switch for 6T SRAM 5000 is shown in FIG. 50, where an Epi-body contact of the 3-terminal dual gate transistor is formed over PG channel, where the cell boundary 5060 is shown. FIG. 51A illustrates the SPW and SNW of the SRAM layout of FIG. 50. The $V_{SS}$ contacts 4910 are explicitly shown for this layout. FIG. 51B illustrates a 2×2 SRAM array 5120 using the SRAM cell of FIG. 50, where the SPW 3940 does not form continuously as the SRAM array of FIG. 45 or FIG. 46, FIG. 51B also illustrates in structure 5100 that the $V_{SS}$ is individually connected for each row ($V_{SS0}$ 4921 and $V_{SS1}$ 4922). FIG. 510 illustrates a 4×4 SRAM array 5130 based on the $V_{SS}$ per row technique, where a unique $V_{SS0}$ ($V_{SS0}$ 4931, $V_{SS1}$ 4932, $V_{SS2}$ 4933, and $V_{SS3}$ 4934) is used for each row. The characteristics of this cell and the area are the same as in the example of FIG. 48.

The mode of operation for the cell is determined according to several conditions including $V_{SS}$, n-channel bias, word line (WL) state, bit line (BL) state, $V_{DD}$ and p-channel body bias. The $V_{SS}$, n-channel bias, word line (WL) state and bit line (BL) state can be used for dynamic control while $V_{DD}$ and p-channel body bias can be used for static mode control. For the SRAM array, dedicated $V_{SS}$ is used on a per-row basis ($V_{SS0}$, $-V_{SS2}$, $V_{SS3}$). Similarly, the WL, which is connected to the shallow P-well to dynamically control the n-channel body bias, is also organized with one WL per row (WL0-WL3). The BL and $V_{DD}$ lines are used to connect the cells in the vertical direction. As shown, both BL and $V_{DD}$ are organized to provide one BL and one $V_{DD}$ per column. A typical SRAM may include Read/Write, NOP (No Operation) and deep sleep modes. Further details of these modes are discussed below.

In Standby and Data Retention modes (corresponding to a deep sleep mode), $V_{SS}$ can be biased positive to reverse bias the body of the n-channel devices, and to reduce effective $V_{DS}$. This configuration lowers standby leakage. For example, $V_{SS}$ can be set to 0.3V and $V_{DD}$ set to no more than 0.6V such that $V_{DS} \leq 0.3V$. Both the PG and PD transistors will be reverse biased under this condition. The p-channel device is zero biased or reverse biased to keep the PU transistor current 1000× that of the PD off current. In the NOP mode, both PG and PD n-channel devices have a biased body with reverse bias and the PU p-channel device body is biased at zero bias or reverse bias. As an example, the $V_{DD}$ is set to 1.0V and $V_{SS}$ and BL are set to 0.6V, so that $V_{DS} \leq 0.4V$ and a low standby current are achieved.

In the Read mode, both PG and PD n-channel devices can have forward bias. The dynamic Vss switching may be limited to a selected word (or row). For a PG device, $V_{GS}=V_{BS} \leq 0.6V$ and $V_{DS} \leq 0.6V$. For a PD device, $V_{GS}=1.0V$ and $V_{BS} \leq 0.6V$. A favorable PD/PG beta ratio can be achieved due to a larger PD $V_{DS}$. The PG device width can be the same as the PD device width. This can achieve favorable read static noise margin and low read cell current.

In the write mode, both PG and PD n-channel devices can have forward bias. The dynamic $V_{SS}$ switching may be limited to the selected word (or row). For a PG device, $V_{GS}=V_{BS} \leq 0.6V$. While the n-channel PG transistors and PD transistors in a shallow P-Well and the p-channel PU transistors are used in the above example, the p-channel PG transistor and PD transistor in a shallow N-Well and the n-channel PU transistors can also be used to achieve the same design goal.

While the $V_{SS}$ per-row technique does not require body access cells for shallow well isolation, each SRAM cell is larger than the SRAM cell for the body access cell based technique. In order to isolate the cell from neighboring cells to facilitate Vss based body bias control per row, inactive areas can be added around the cell. Consequently, the cell height may be increased, in this example, by 130 nm. This corresponds to about a 38% increase in cell area. All transistors are oriented in the same direction. As a design example, the dimensions of transistors are as follows:

Passgate (PG):W/L=70 nm/40 nm
Pulldown (PD):W/L=85 nm/35 nm
Pullup (PU):W/L=65 nm/35 nm This example results in an area, x*y=0.72)µm*0.475 µm=0.342)µm2 in a 45 nm process node.

Figure 52:
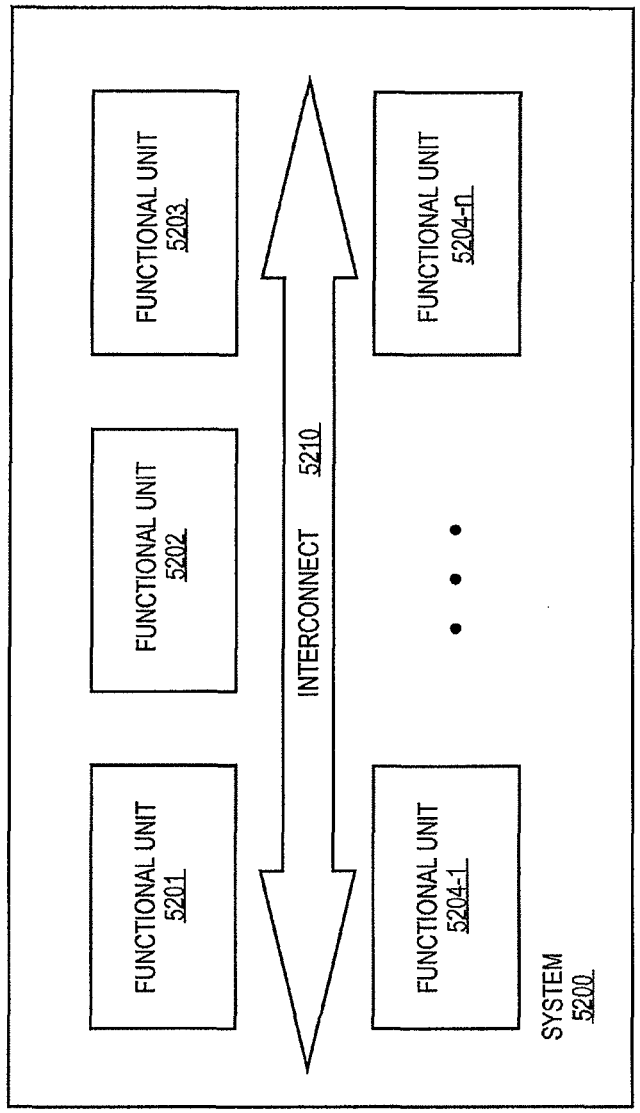
FIGS. 52 through 54 illustrate system applications of DDC devices and embodiments discussed herein.

FIG. 52 shows a System 5200 that includes a number of functional units interconnected, as necessary, using interconnect 5210. For example, in some cases, interconnect 5210 provides a common path for communication between all of the functional units 5204-1, 5204-2, 5204-3, and through 5204-n. In other cases, interconnect provides point-to-point communications between one set of functional units while providing a common communications path among another set of functional units. Interconnect 5210 thus may be configured in any way that is appropriate to meet the goals of the system designer using conventional techniques for communicating using the functional units available in the target system, including, for example, wired, wireless, broadcast and point-to-point. The "n" of On is meant to convey that there may be as many functional units as the system designer deems necessary and does not imply that there is a maximum of nine functional units.

According to some embodiments, System 5200 is an electronics system having multiple, independently packaged components and/or subassemblies. Examples of such systems today include personal computers, mobile telephones, digital music players, e-book readers, gaming consoles, portable gaming systems, cable set top boxes, televisions, stereo equipment, and any other electronic similar electronics system that might benefit from the increased control of power consumption provided by the technologies disclosed herein. In such systems, the functional units 5201, 5201, 5203, 5204-1 through 5204-n are the typical system components for such systems, and the interconnect 5210 is typically provided using a printed wiring board or backplane (not shown). For example, in the case of personal computers, the functional components would include the CPU, system memory, and a mass storage device such as hard disk drive or solid state disk drive, all of which would be interconnected as necessary by a system interconnect implemented on a motherboard. Similarly, a mobile telephone would include a variety of one or more chips and a display panel, for example, all of which typically would be interconnected using one or more printed wiring boards (PWBs), which may include flex connectors According to other embodiments, system 5210 is a system-in-package (SIP) in which each of the functional units is an integrated circuit, all of which are packaged together in a single multi-chip package. In SIP systems, the interconnect 5210 may be provided by direct chip-to-chip interconnections such as wire bonds, lead bonds, solder balls or gold stud bumps, for example, as well as by interconnections provided by a package substrate, which may include common bus-type interconnects, point-to-point interconnects, voltage planes and ground planes, for example.

According to yet other embodiments, System 5200 is a single chip, such as a system-on-chip (SOC), and the functional units are implemented as groups of transistors (e.g., circuit blocks or cells) on a common semiconductor substrate or semiconductor-on-insulator substrate (e.g., when bulk CMOS and Sal structures are implemented on an Sal substrate). In such embodiments, interconnect 5210 may be provided using any technique available for interconnecting circuit blocks in an integrated circuit.

As discussed above, the transistor and integrated circuit technologies discussed allow the manufacture and use of multi-mode transistors that can be independently specified, statically by design and/or dynamically by adjusting body bias and/or operating voltage, on a common semiconductor substrate. These same technologies can also provide similar benefits at the system level, even if only one of the functional units implements the technology. For example, functional unit 5202 may include logic (not shown) that dynamically adjusts the operational mode(s) of its DDC transistors to reduce power consumption. This may be done, for example, through digital or analog techniques implemented on functional unit 5202. Alternatively, functional unit 5202 may control power consumption in response to external control signals from another functional unit, e.g., functional unit 5201. Whether the power consumption is each functional unit is controlled locally by the functional unit, centrally by a controller functional unit, or by a hybrid approach, typically more control over power consumption can be achieved.

System level control of power consumption is something that is known, particularly in computing systems. For example, the Advanced Configuration and Power Interface (ACPI) specification is an open standard for power management of system components by the operating system. The deeply depleted channel, transistor, and integrated circuit technologies described above complement and extend the capabilities of such power management approaches by allowing system control of individual circuit blocks in each functional unit in the system. For example, the lowest level of control provided by ACPI is the device level, which corresponds to the functional unit (e.g., a chip or a hard drive) of a multi-component system such as personal computers. By providing granular individual control over the power consumption of individual circuit blocks within a device, many more device and system power states are possible.

System level power management may be of particular benefit in SOC systems that use DDC structures. As discussed previously, DDC structures allow for a high level of programmability in nanoscale transistors. Because of the relatively wide range of available nominal threshold voltages $V_T$, the relatively low $\sigma V_T$, and the relatively high body coefficient of DDC structures, transistors that are all manufactured to have the same intrinsic $V_T$ and to be operated with the same operating voltage $V_{DD}$ can be configured after to power up to operate in distinct operating modes, using different actual $V_T$ and, potentially, different actual operating voltages $V_{DD}$, on a circuit block by circuit block basis. This kind of flexibility allows the same chip to be designed for use in a variety of target systems and operating conditions and dynamically configured for operation in situ. This could be particularly useful for systems, whether sacs or not, that are connected to AC power sometimes and use battery power at other times.

Figure 53:
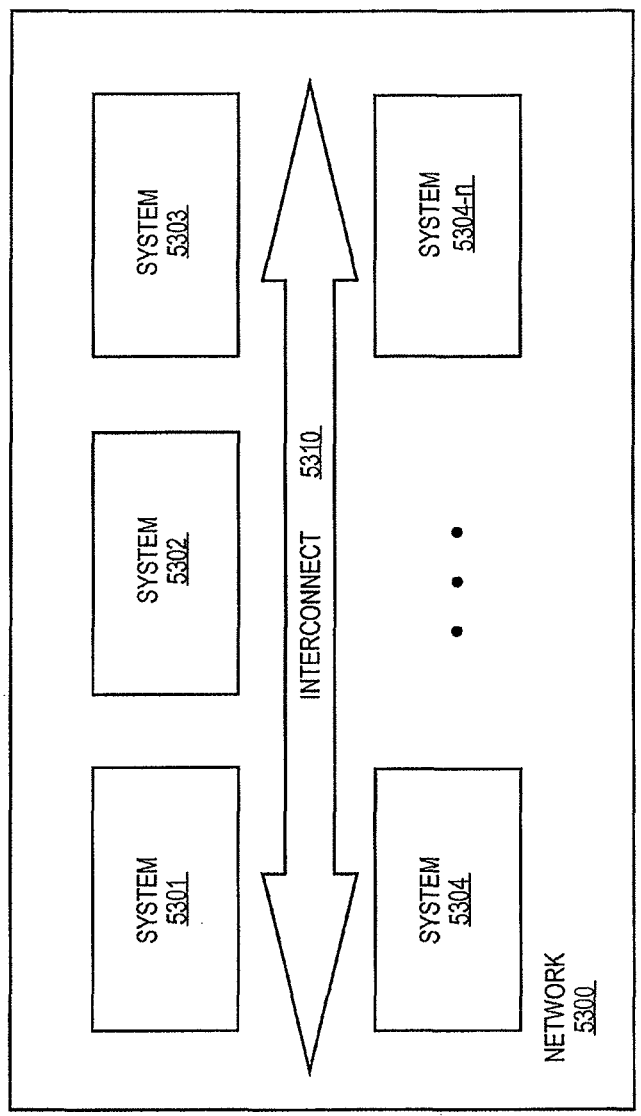

FIG. 53 shows a Network 5300 that includes a number of systems 5301, 5302 and 5303 interconnected, as necessary, using interconnect 5310. For example, in some cases, interconnect 5310 provides a common path for communication between all of the systems 5304-1 through 5304-*n*. In other cases, interconnect provides point-to-point communications between one set of systems while providing a common communications path among another set of systems. Interconnect 5310 thus may be configured in any way that is appropriate to meet the goals of the network designer using conventional techniques for communicating using the system that can be connected to the target network including, for example, wired, wireless, broadcast, point-to-point and peer-to-peer. The "n" of 5304-*n* is meant to convey that there may be as many systems as a network may allow and does not imply that there is a maximum of nine systems.

The deeply depleted channel, transistor, integrated circuit and system technologies described above provide the ability for highly granular control of systems attached to a network. Having such a high level of control over networked systems could be of particular use in enterprise networks to reduce energy costs incurred by equipment that is on but not being used. Such control could also be of subscription-based wireless networks including, for example, cellular telephone networks, whether to assist in controlling power consumption, turning system capabilities on or off depending on the terms of subscription, selectively putting certain functional units or portions thereof into a higher performing mode of operation (e.g., "turbo mode") to boost performance.

Figure 54:
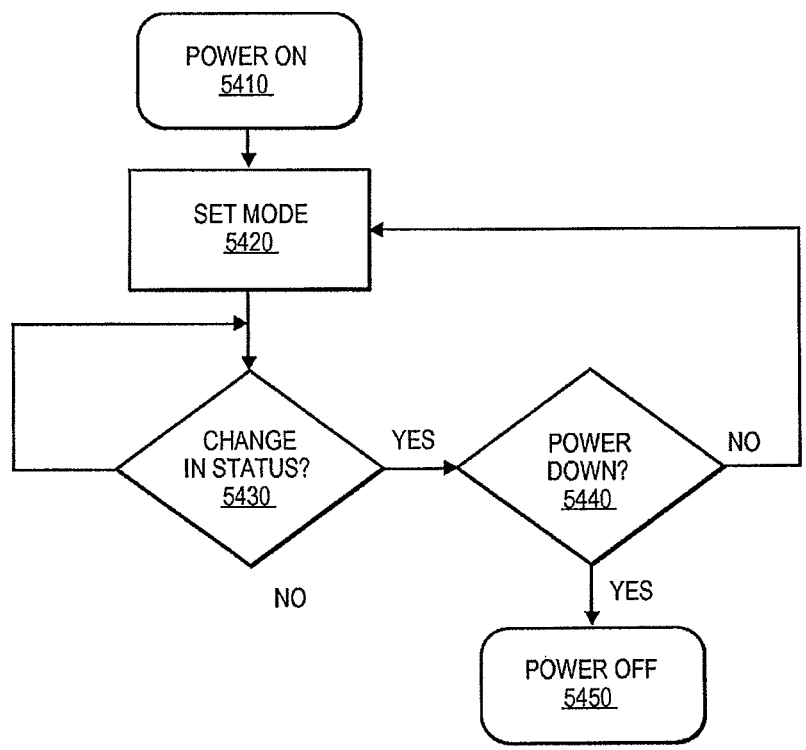

FIG. 54 shows an exemplary method for using a system such as that described with respect to FIG. 52, whether alone or in conjunction with a network such as that described with respect to FIG. 53. After the system is powered on in step 5410, the system sets the power modes of the system components (e.g., functional units) that are made using the types of transistors, groups of transistors, and/or integrated circuits discussed herein, either in response to an external signal provided over the network, a central mode control signal provided by a functional unit within the system, or local mode control signal generated separately in each functional unit that is capable of multimode operation. As described above, a single component may have different portions configured to operate in different modes; e.g., one portion of a component may be configured to operate in the legacy mode, while another portion of the same component may be configured to operate in low power, low leakage mode. In step 5430, the system monitors its usage to determine whether to change its power modes. The monitoring function may be performed centrally by one functional unit, it may be distributed to multiple functional units that each may make local determinations about modes based on monitoring specific conditions, or both (e.g., one functional unit may determine that it should go into sleep mode based on its own criteria, notwithstanding that a central monitor has not determined to put the entire system into deep sleep; similarly, a central monitor may determine to put the entire system into a deep sleep mode notwithstanding that one component has determined to put itself into turbo mode after the initial mode setting in order to boost performance). Step 5430 repeats until it is determined that the status of the system or a functional unit has changed such that a new power mode is required, in which case step 5440 is performed. As shown, if it is determined at step 5440 that system power down is required, the system is shut off in step 5450. Otherwise, step 5420 is repeated for one or more functional units, depending on what status change is required. In this manner, a user of a system or chip made using the technologies described herein may benefit from the advantages thereof.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Accordingly, the specification and drawings are to be regarded in an illustrative rather than a restrictive sense.

What is claimed is:

1. An SRAM array, comprising:
    a plurality of SRAM cells formed in a doped well, at least one of the SRAM cells of the plurality of SRAM cells having field effect transistors (FETs) comprising:
    a source, a drain and a gate stack having a gate length;
    a screening region positioned above the doped well, the screening region being doped with a first type of dopant to have a dopant concentration between $5 \times 10^{18}$ and $1 \times 10^{20}$ atoms/cm$^3$, the screening region being electrically coupled to the doped well, the screening region being positioned below the gate to set a depletion depth;

a substantially undoped semiconductive layer formed above the screening region, the substantially undoped semiconductive layer being adjacent to the screening region; and a threshold voltage setting region in the substantially undoped semiconductive layer, the threshold voltage setting region being doped with the first type of dopant, the threshold voltage setting region dopant concentration modifying the threshold voltage of the FETs, wherein the gate stack has a length Lg and is positioned above the doped well to control conduction between a drain and a source, the source and drain being doped with a second type of dopant, and wherein at least a portion of the substantially undoped semiconductive layer is maintained as a substantially undoped channel region having a dopant concentration less than $1/10$ of the screening region dopant concentration, with the substantially undoped channel region laterally positioned between the source and the drain and vertically positioned between the gate stack and the threshold voltage setting region, and the threshold voltage setting region is vertically positioned between the substantially undoped channel region and the screening region.

2. The SRAM array of claim 1, wherein the threshold voltage setting region has a dopant concentration less than about $1/2$ of the screening region dopant concentration.

3. The SRAM array of claim 1, wherein screening region is positioned at a depth below the gate greater than or equal to Lg/3 to set the depletion depth.

4. The SRAM array of claim 1, wherein the screening region has a dopant concentration between $5\times10^{18}$ to $5\times10^{19}$ atoms/cm$^3$.

5. The SRAM array of claim 1, wherein the SRAM cell is a 6T SRAM cell having two pull-up transistors, two pull-down transistors, and two pass gate transistors, and wherein the substantially undoped semiconductive layer is formed to extend across the two pull-up transistors, two pull-down transistors, and two pass gate transistors of the 6T SRAM cell.

6. The SRAM array of claim 1, wherein the substantially undoped semiconductive layer is formed to extend across the SRAM array.

7. The SRAM array of claim 1, wherein the substantially undoped semiconductive layer comprises a substantially undoped epitaxial layer.

8. The SRAM array of claim 1, wherein the screening region includes two or more implanted dopant materials of the first dopant type in the doped well.

9. The SRAM array of claim 1, further comprising a deposited gate metal having a work function intermediate between band edge and midgap.

10. An SRAM array, comprising;
a plurality of SRAM cells having a first well and a second well over a first deep well, the first well and the first deep well having a first type of dopant, the second well having a second type of dopant opposite to the first type, the first well being continuous in a first direction, at least one of the SRAM cells of the plurality of SRAM cells having field effect transistors (FETs) comprising:
a source doped with the second type of dopant;
a drain doped with the second type of dopant;
a gate stack having a gate length;
a screening region positioned below the gate and extending laterally between the source and the drain, the screening region having a dopant concentration between $5\times10^{18}$ and $1\times10^{20}$ atoms/cm$^3$; and a substantially undoped semiconductive layer formed above the screening region, at least a portion of the substantially undoped semi conductive layer being maintained as a substantially undoped channel region having a dopant concentration less than about $1/10$ of the screening region dopant concentration, wherein during operation of the FETs a deeply depleted channel is formed in the substantially undoped channel region, the deeply depleted channel having a depletion depth net by the position of the screening region.

11. The SRAM array of claim 10, the FETs further comprising:
a threshold voltage setting region positioned between the screening region and the substantially undoped channel region, the threshold voltage setting region dopant concentration modifying the threshold voltage of the FET.

12. The SRAM array of claim 11, wherein the threshold voltage setting region has a dopant concentration less than about $1/2$ of the screening region dopant concentration.

13. The SRAM array of claim 10, further comprising:
a plurality of boundary units having an isolation structure to break continuity of the first well in the first direction such that the first well is electrically isolated from an adjacent SRAM array, wherein the isolation structure has an isolation depth that is greater than a depth of the first well and less than a depth of the first deep well; and
a first body tap electrically coupled to the first well such that, during operation, the SRAM array can be independently supplied with a first body bias voltage.

14. The SRAM array of claim 13, further comprising:
a second body tap electrically coupled to the second well such that, during operation, the SRAM array can be supplied with a second body bias voltage.

15. The SRAM array of claim 10, wherein the SRAM cell is a 6T SRAM cell having two pull-up transistors, two pull-down transistors, and two pass gate transistors, the two pull-down transistors and the two pass-gate transistors being formed in the first well and the two pull-down transistors being formed in the second well.

16. The SRAM array of claim 15, wherein the substantially undoped semiconductive layer is formed to extend across the two pull-up transistors, two pull-down transistors, and two pass gate transistors of the 6T SRAM cell.

17. The SRAM array of claim 10, wherein the substantially undoped semiconductive layer is formed to extend across the SRAM array.

18. The SRAM array of claim 10, wherein the substantially undoped semiconductive layer comprises a substantially undoped epitaxial layer.

19. The SRAM array of claim 10, wherein the screening region is positioned at a depth below the gate greater than or equal to Lg/3 to set the depletion depth.

20. The SRAM array of claim 10, wherein, the screening region has a dopant concentration between $5\times10^{18}$ to $5\times10^{19}$ atoms/cm$^3$.

21. The SRAM array of claim 10, wherein the screening region is substantially coextensive with the substantially undoped channel region.

22. The SRAM array of claim 10, wherein the screening region contacts the source and drain.

23. The SRAM array of claim 10, wherein the screening region has a thickness greater than 5 nm.

24. The SRAM array of claim 10, wherein the screening region has a thickness greater than 30 nm and less than 80 nm.

25. The SRAM array of claim 10, wherein the screening region comprises a screening region formed by implanting two or more dopant materials.

26. The SRAM array of claim 10, wherein the substantially undoped channel region has a thickness greater than 5 nm.

27. The SRAM array of claim 10, wherein the substantially undoped channel region has a thickness greater than 5 nm and less than 30 nm.

28. The SRAM array of claim 10, wherein the screening region further comprises a first dopant migration resistant layer positioned above the screening region, the first dopant migration resistant layer preventing a dopant migration from the screening region into the substantially undoped channel region.

29. The SRAM array of claim 10, wherein the screening region further comprises a second dopant migration resistant layer below the screening region, the second dopant migration resistant layer preventing a dopant migration from the screening region into the doped wells.

* * * * *

UNITED STATES PATENT AND TRADEMARK OFFICE
CERTIFICATE OF CORRECTION

PATENT NO.        : 8,604,530 B2                          Page 1 of 1
APPLICATION NO.   : 13/616859
DATED             : December 10, 2013
INVENTOR(S)       : Scott E. Thompson et al.

It is certified that error appears in the above-identified patent and that said Letters Patent is hereby corrected as shown below:

In the Claims

Column 46, line 3, after "undoped" delete "semi conductive" and insert --semiconductive;--.

Column 46, line 10, after "depth" delete "net" and insert --set--.

Signed and Sealed this
Fourth Day of March, 2014

Michelle K. Lee
*Deputy Director of the United States Patent and Trademark Office*